US012575343B2

(12) United States Patent
Lee et al.

(10) Patent No.: US 12,575,343 B2
(45) Date of Patent: **\*Mar. 10, 2026**

(54) GATE STRUCTURES IN TRANSISTOR DEVICES AND METHODS OF FORMING SAME

(71) Applicant: Taiwan Semiconductor Manufacturing Co., Ltd., Hsinchu (TW)

(72) Inventors: Hsin-Yi Lee, Hsinchu (TW); Jia-Ming Lin, Hsinchu (TW); Kun-Yu Lee, Tainan (TW); Chi On Chui, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/599,871

(22) Filed: Mar. 8, 2024

(65) Prior Publication Data

US 2024/0249938 A1 Jul. 25, 2024

Related U.S. Application Data

(63) Continuation of application No. 17/532,204, filed on Nov. 22, 2021, now Pat. No. 11,967,504.

(Continued)

(51) Int. Cl.
*H01L 21/02* (2006.01)
(52) U.S. Cl.
CPC .. *H01L 21/02603* (2013.01); *H01L 21/02208* (2013.01); *H01L 21/02271* (2013.01); *H01L 21/0262* (2013.01)

(58) Field of Classification Search
CPC ......... H01L 21/02603; H01L 21/02208; H01L 21/02271; H01L 21/0262; H01L 21/02126;
(Continued)

(56) References Cited

U.S. PATENT DOCUMENTS 9,362,385 B2 6/2016 Cheng et al.
10,510,620 B1 12/2019 Chanemougame et al.
(Continued)

FOREIGN PATENT DOCUMENTS

CN 109411352 A 3/2019
CN 113113361 A 7/2021
(Continued)

OTHER PUBLICATIONS

United States Environment Protection Agency, "UV Radiation," www.epa.gov/ozone/strathome.html, Jun. 2010, 2 pages.

*Primary Examiner* — Dao H Nguyen
(74) *Attorney, Agent, or Firm* — Slater Matsil, LLP

(57) ABSTRACT

A method includes removing a first dummy gate structure to form a recess around a first nanostructure and a second nanostructure; depositing a sacrificial layer in the recess with a flowable chemical vapor deposition (CVD); and patterning the sacrificial layer to leave a portion of the sacrificial layer between the first nanostructure and the second nanostructure. The method further include depositing a first work function metal in first recess; removing the first work function metal and the portion of the sacrificial layer from the recess; depositing a second work function metal in the recess, wherein the second work function metal is of an opposite type than the first work function metal; and depositing a fill metal over the second work function metal in the recess.

20 Claims, 57 Drawing Sheets

Related U.S. Application Data

(60) Provisional application No. 63/211,737, filed on Jun. 17, 2021.

(58) Field of Classification Search
CPC ........ H01L 21/02337; H01L 21/02348; H10D 62/364; H10D 62/121; H10D 84/85; H10D 84/0177; H10D 84/038; H10D 84/0172; H10D 84/0167; H10D 84/0193; H10D 84/853; H10D 30/014; H10D 30/43; H10D 30/6735; H10D 30/6757
See application file for complete search history.

(56) References Cited

U.S. PATENT DOCUMENTS

| | | | |
|---|---|---|---|
| 10,559,566 B1 | 2/2020 | Lee et al. | |
| 10,651,291 B2 | 5/2020 | Frougier et al. | |
| 10,700,064 B1 * | 6/2020 | Zhang .................... | B82Y 10/00 |
| 11,967,504 B2 * | 4/2024 | Lee ...................... | H10D 84/038 |
| 12,484,257 B2 | 11/2025 | Wang et al. | |
| 2005/0202685 A1 | 9/2005 | Huang et al. | |
| 2014/0158580 A1 | 6/2014 | Xiao et al. | |
| 2015/0357435 A1 | 12/2015 | Lim et al. | |
| 2018/0097085 A1 | 4/2018 | Wang et al. | |
| 2018/0308766 A1 | 10/2018 | Mochizuki et al. | |
| 2019/0258153 A1 | 8/2019 | Nemani et al. | |
| 2019/0371888 A1 * | 12/2019 | Zhang .................. | H10D 30/792 |
| 2020/0035563 A1 * | 1/2020 | Zhang ................ | H10D 84/0128 |
| 2020/0066800 A1 | 2/2020 | Kim et al. | |
| 2020/0373300 A1 * | 11/2020 | Zhang .................... | H10D 30/43 |
| 2021/0280683 A1 | 9/2021 | Trivedi et al. | |
| 2021/0305408 A1 | 9/2021 | Yu et al. | |
| 2021/0336033 A1 | 10/2021 | Huang et al. | |
| 2022/0310804 A1 | 9/2022 | Su et al. | |
| 2022/0320089 A1 * | 10/2022 | Chu .................... | H10D 84/0181 |
| 2022/0320090 A1 * | 10/2022 | Hsu .................... | H10D 30/6739 |
| 2022/0384266 A1 | 12/2022 | Lin et al. | |

FOREIGN PATENT DOCUMENTS

| | | |
|---|---|---|
| CN | 114957275 A | 8/2022 |
| TW | 201123448 A | 7/2011 |
| TW | 201526087 A | 7/2015 |
| TW | 201814793 A | 4/2018 |

* cited by examiner

GATE STRUCTURES IN TRANSISTOR DEVICES AND METHODS OF FORMING SAME

PRIORITY CLAIM AND CROSS-REFERENCE

This application is a continuation of U.S. application Ser. No. 17/532,204, filed on Nov. 22, 2021, which claims the benefit of U.S. Provisional Application No. 63/211,737, filed on Jun. 17, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
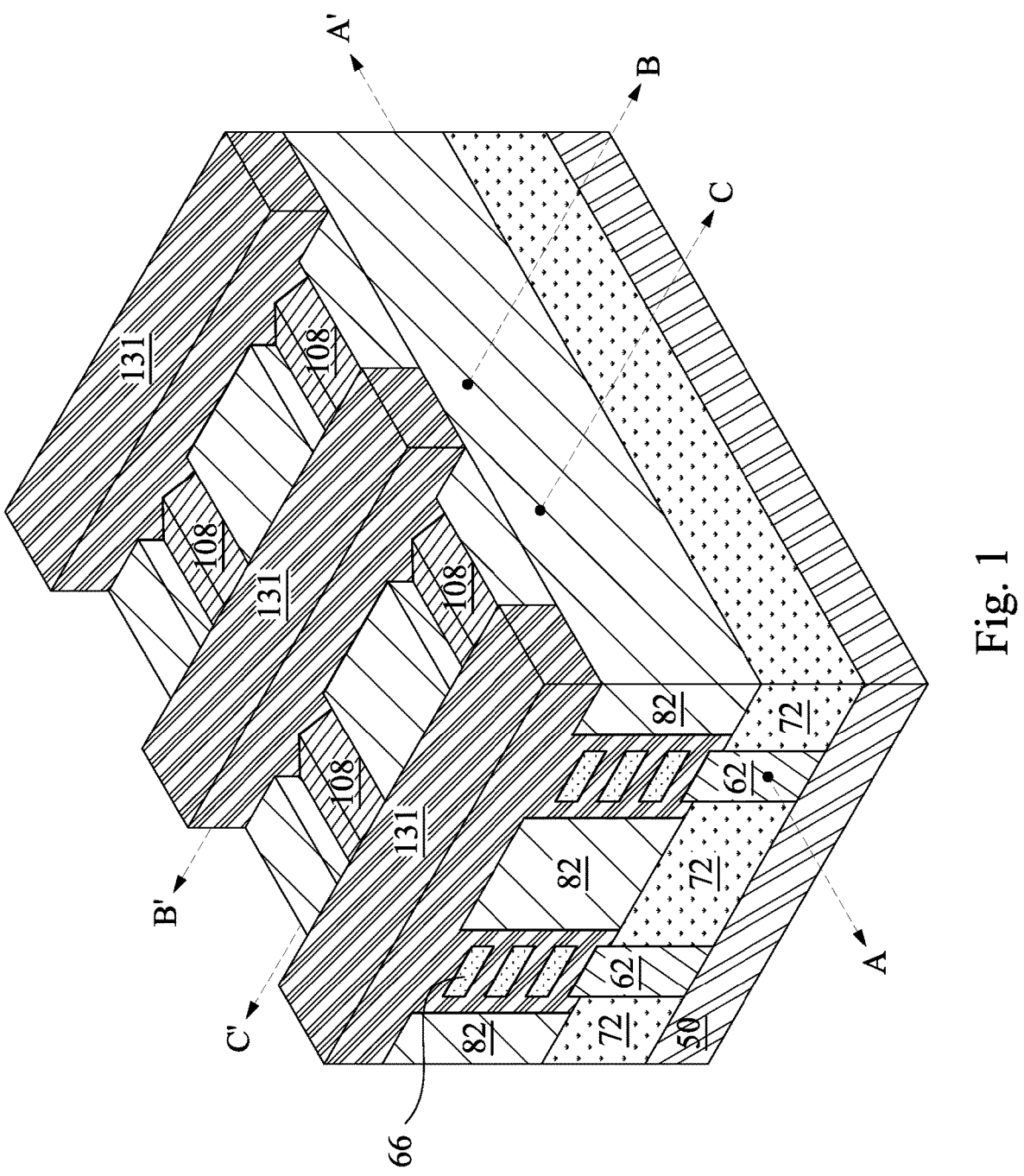
FIG. 1 illustrates an example of nanostructure field-effect transistors (nano-FETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, replacement gate electrodes for p-type devices and n-type devices are formed. In some embodiments, the work function tuning layers for the n-type devices are formed before the work function tuning layers for the p-type devices to allow more control of the threshold voltages of the resulting devices. The method of forming the work function tuning layers for the n-type devices before the work function tuning layers for the p-type devices includes forming and patterning a sacrificial layer to prevent the work function tuning layers for the n-type devices from being formed between the nanostructures of the p-type devices. This helps to prevent the work function tuning layers from remaining on the p-type devices which could degrade the performance of the p-type devices. The sacrificial layer may be deposited using a flowable chemical vapor deposition (CVD) method, which provides improved deposition profile in terms of bottom-up growth. Further, the flowable CVD method may also provide improved gap fill between the nanostructures without seams or gaps.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAF-ETs), or the like.

The nano-FETs include nanostructures 66 (e.g., nanosheets, nanowires, or the like) over semiconductor fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 72, such as shallow trench isolation (STI) regions, are disposed between adjacent semiconductor fins 62, which may protrude above and from between adjacent isolation regions 72. Although the isolation regions 72 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 62 are illustrated as being separate from the substrate 50, the bottom portions of the semiconductor fins 62 may be single, continuous materials with the substrate 50. In this context, the semiconductor fins 62 refer to the portion extending above and from between the adjacent isolation regions 72.

Gate structures 131 are over top surfaces of the semiconductor fins 62 and along top surfaces, sidewalls, and bottom surfaces of the nanostructures 66. Epitaxial source/drain regions 108 are disposed on the semiconductor fins 62 at opposing sides of the gate structures 131. The epitaxial source/drain regions 108 may be shared between various semiconductor fins 62. For example, adjacent epitaxial source/drain regions 108 may be electrically connected, such as through coupling the epitaxial source/drain regions 108 with a same source/drain contact.

Insulating fins 82, also referred to as hybrid fins or dielectric fins, are disposed over the isolation regions 72, and between adjacent epitaxial source/drain regions 108. The insulating fins 82 block epitaxial growth to prevent coalescing of some of the epitaxial source/drain regions 108 during epitaxial growth. For example, the insulating fins 82 may be formed at cell boundaries to separate the epitaxial source/drain regions 108 of adjacent cells.

FIG. 1 further illustrates reference cross-sections that are used in later figures. Cross-section A-A' is along a longitudinal axis of a semiconductor fin 62 and in a direction of, for example, a current flow between the epitaxial source/drain regions 108 of the nano-FET. Cross-section B-B' is along a longitudinal axis of a gate structure 131 and in a direction, for example, perpendicular to a direction of current flow between the epitaxial source/drain regions 108 of a nano-FET. Cross-section C-C' is parallel to cross-section B-B' and extends through epitaxial source/drain regions 108 of the nano-FETs. Subsequent figures refer to these reference cross-sections for clarity.

Figure 2:
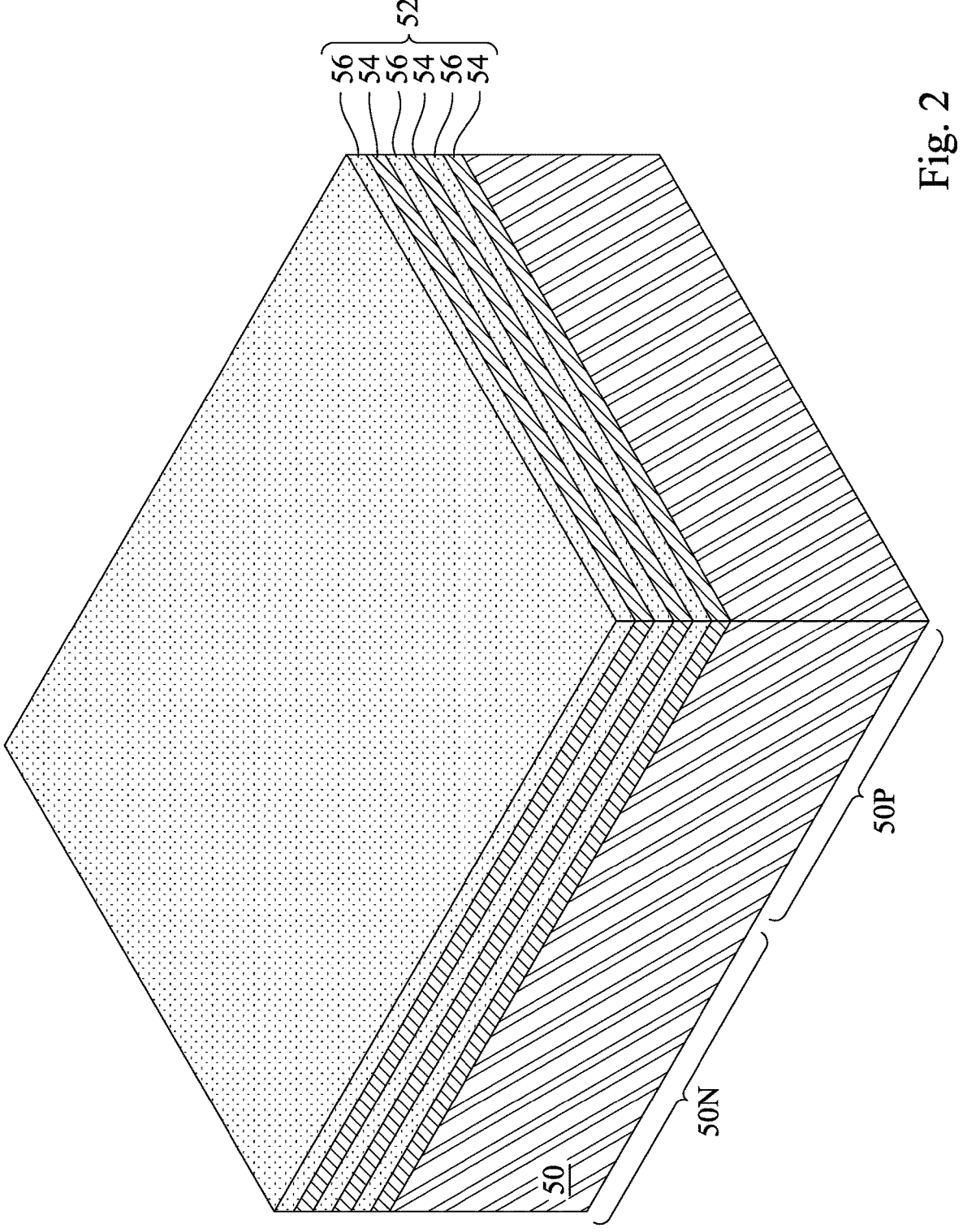
FIGS. 2, 3, 4, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 18D, 18E, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, and 30C are cross-sectional views of intermediate stages in the manufacturing of nano-FETs, in accordance with some embodiments.
Figure 3:
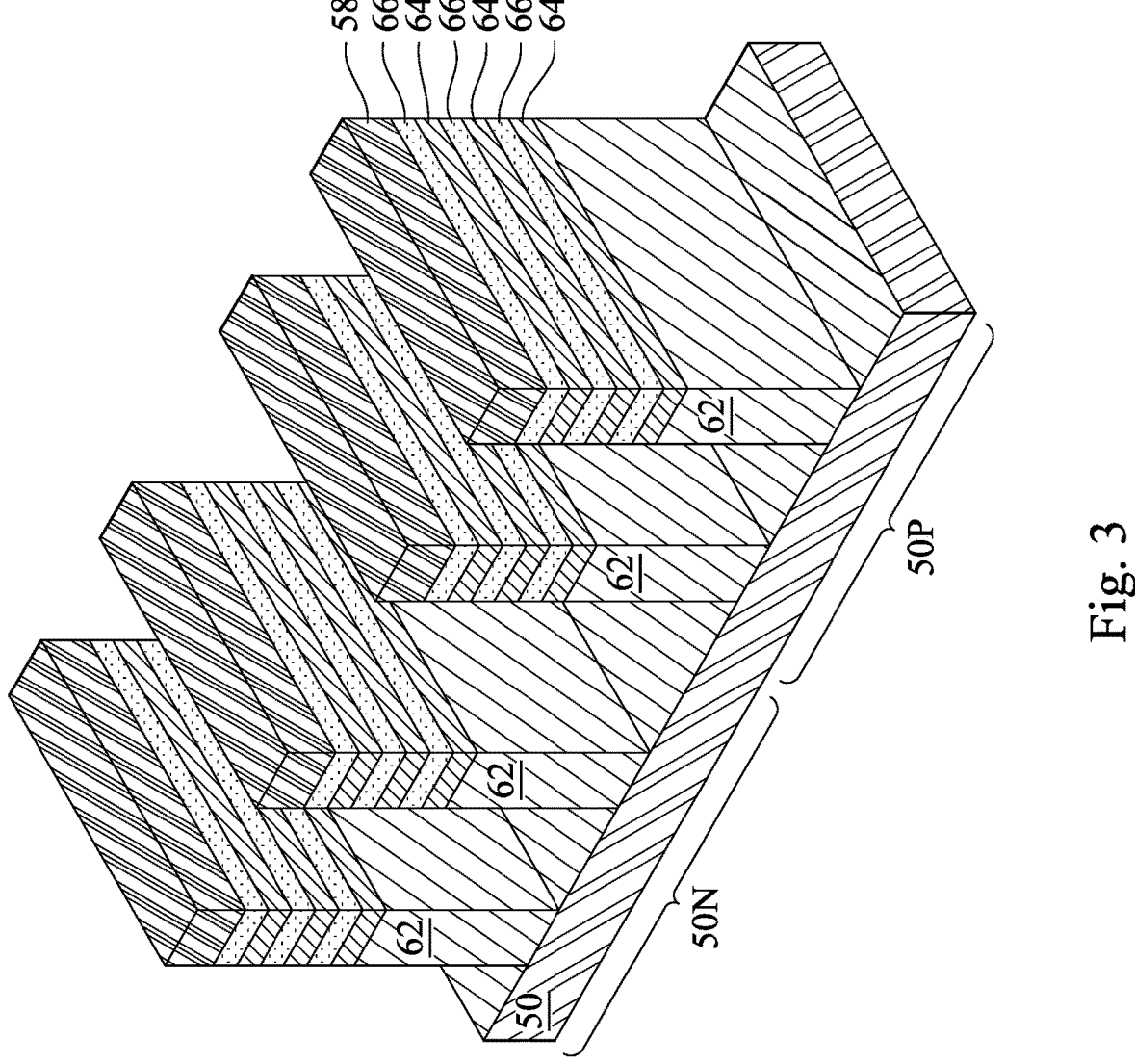
Figure 4:
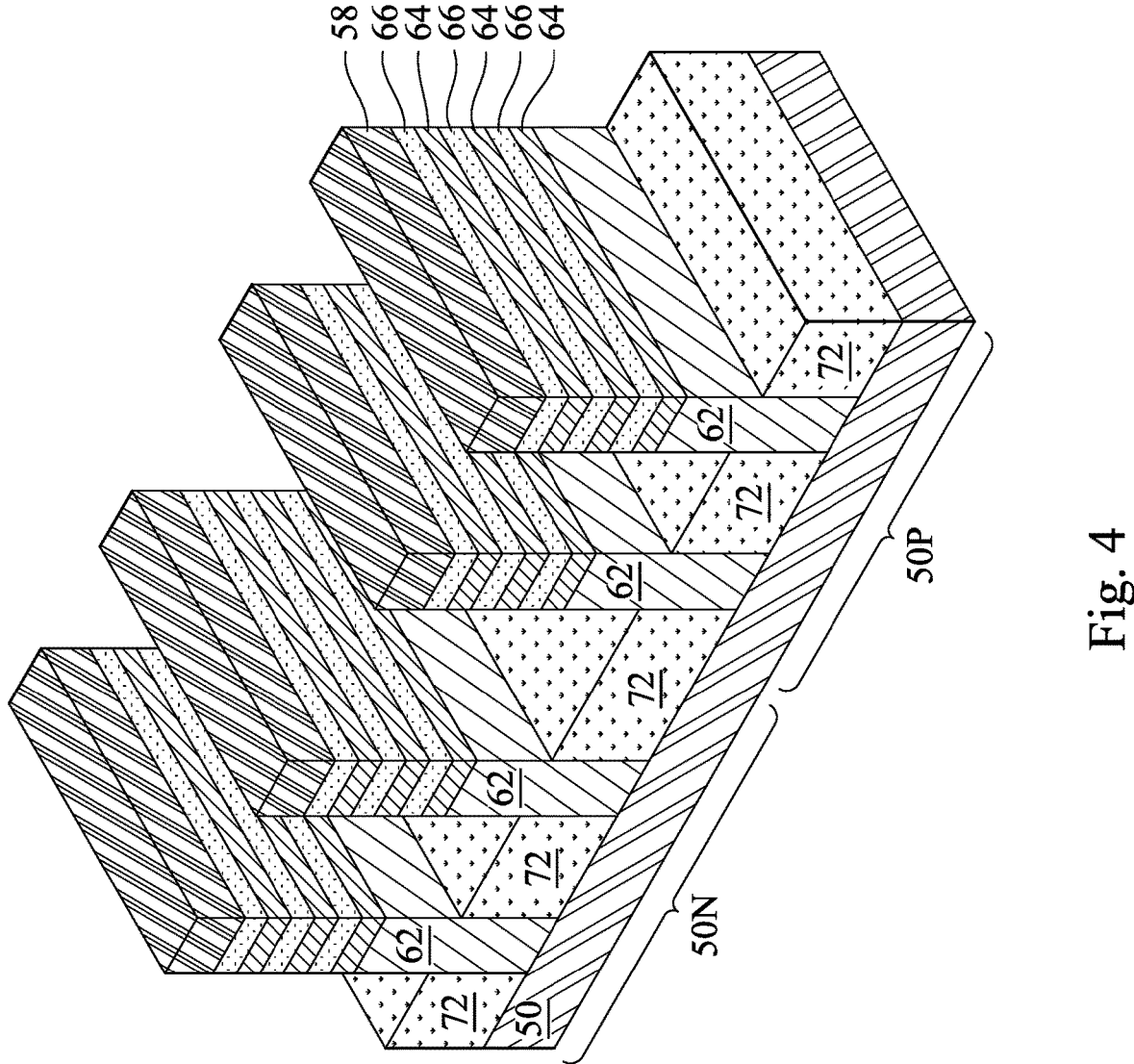

FIGS. 2-30C are views of intermediate stages in the manufacturing of nano-FETs, in accordance with some embodiments. FIGS. 2, 3, and 4 are three-dimensional views. FIGS. 5A, 6A, 7A, 8A, 13A, 14A, 15A, 16A, 17A, 18A, 28A, 29B, and 30A are cross-sectional views illustrated along a similar cross-section as reference cross-section A-A' in FIG. 1. FIGS. 5B, 6B, 7B, 8B, 9B, 10B, 11B, 12B, 13B, 14B, 15B, 16B, 17B, 18B, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28B, 29B, and 30B are cross-sectional views illustrated along a similar cross-section as reference cross-section B-B' in FIG. 1. FIGS. 5C, 6C, 7C, 8C, 9C, 10C, 11C, 12C, 13C, 14C, 15C, 16C, 17C, 18C, 19C, 28C, 29C, and 30C are cross-sectional views illustrated along a similar cross-section as reference cross-section C-C' in FIG. 1.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be adjacent to or may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region is in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56. For example, the multi-layer stack 52 may include from one to ten layers of each of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe^{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P. Each of the layers may have a small thickness, such as a thickness in a range of 5 nm to 30 nm.

In FIG. 3, trenches are patterned in the substrate 50 and the multi-layer stack 52 to form semiconductor fins 62, nanostructures 64, and nanostructures 66. The semiconductor fins 62 are semiconductor strips patterned in the substrate 50. The nanostructures 64 and the nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask 58 to pattern the semiconductor fins 62 and the nanostructures 64, 66.

In some embodiments, the semiconductor fins 62 and the nanostructures 64, 66 each have widths in a range of 8 nm to 40 nm. In the illustrated embodiment, the semiconductor fins 62 and the nanostructures 64, 66 have substantially equal widths in the n-type region 50N and the p-type region 50P. In another embodiment, the semiconductor fins 62 and the nanostructures 64, 66 in one region (e.g., the n-type region 50N) are wider or narrower than the semiconductor fins 62 and the nanostructures 64, 66 in another region (e.g., the p-type region 50P). Further, while each of the semiconductor fins 62 and the nanostructures 64, 66 are illustrated as having a consistent width throughout, in other embodiments, the semiconductor fins 62 and/or the nanostructures 64, 66 may have tapered sidewalls such that a width of each of the semiconductor fins 62 and/or the nanostructures 64, 66 continuously increases in a direction towards the substrate 50. In such embodiments, each of the nanostructures 64, 66 may have a different width and be trapezoidal in shape.

In FIG. 4, STI regions 72 are formed over the substrate 50 and between adjacent semiconductor fins 62. The STI regions 72 are disposed around at least a portion of the semiconductor fins 62 such that at least a portion of the nanostructures 64, 66 protrude from between adjacent STI regions 72. In the illustrated embodiment, the top surfaces of the STI regions 72 are below the top surfaces of the semiconductor fins 62. In some embodiments, the top surfaces of the STI regions 72 are above or coplanar (within process variations) with the top surfaces of the semiconductor fins 62.

The STI regions 72 may be formed by any suitable method. For example, an insulation material can be formed over the substrate 50 and the nanostructures 64, 66, and between adjacent semiconductor fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 72 are each illustrated as a single layer, some embodiments may utilize multiple layers. For example, in some embodiments a liner (not separately illustrated) may first be formed along surfaces of the substrate 50, the semiconductor fins 62, and the nanostructures 64, 66. Thereafter, an insulation material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In some embodiments, the planarization process may expose the mask 58 or remove the mask 58. After the planarization process, the top surfaces of the insulation material and the mask 58 or the nanostructures 64, 66 are coplanar (within process variations). Accordingly, the top surfaces of the mask 58 (if present) or the nanostructures 64, 66 are exposed through the insulation material. In the illustrated embodiment, the mask 58 remains on the nanostructures 64, 66. The insulation material is then recessed to form the STI regions 72. The insulation material is recessed such that at least a portion of the nanostructures 64, 66 protrude from between adjacent portions of the insulation material. Further, the top surfaces of the STI regions 72 may have a flat surface as illustrated, a convex surface, a concave surface (such as dishing), or a combination thereof by applying an appropriate etch. The insulation material may be recessed using any acceptable etching process, such as one that is selective to the material of the insulation material (e.g., selectively etches the insulation material of the STI regions 72 at a faster rate than the materials of the semiconductor fins 62 and the nanostructures 64, 66). For example, an oxide removal may be performed using dilute hydrofluoric (dHF) acid as an etchant.

The process previously described is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the semiconductor fins 62, and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the semiconductor fins 62, the nanostructures 64, 66, and the STI regions 72 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the semiconductor fins 62, the nanostructures 64, 66, and the STI regions 72 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 62 and/or the nanostructures 64, 66, the grown materials may be in situ doped during growth, which may obviate the implantations, although in situ and implantation doping may be used together.

FIGS. 5A-17C illustrate various additional steps in the manufacturing of embodiment devices. FIGS. 5A-17C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure. As will be subsequently described in greater detail, insulating fins 82 will be formed between the semiconductor fins 62. FIGS. 5A, 6A, 7A, 8A, 9A, 10A, 11A, 12A 13A, 14A, 15A, 16A, and 17A illustrate a semiconductor fin 62 and structures formed on it. FIGS. 5B, 5C, 6B, 6C, 7B, 7C, 8B, 8C, 9B, 9C, 10B, 10C, 11B, 11C, 12B, 12C, 13B, 13C, 14B, 14C, 15B, 15C, 16B, 16C, 17B, and 17C each illustrate two semiconductor fins 62 and portions of the insulating fins 82 and the STI regions 72 that are disposed between the two semiconductor fins 62 in the respective cross-sections.

Figure 5A:
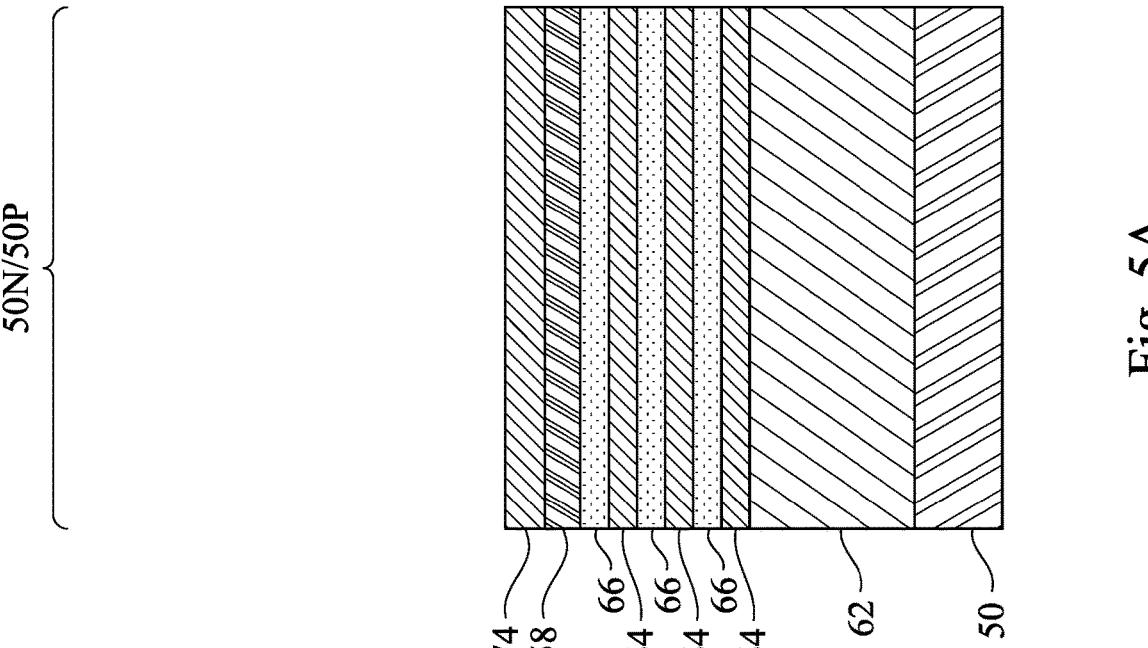
Figures 5B, 5C:
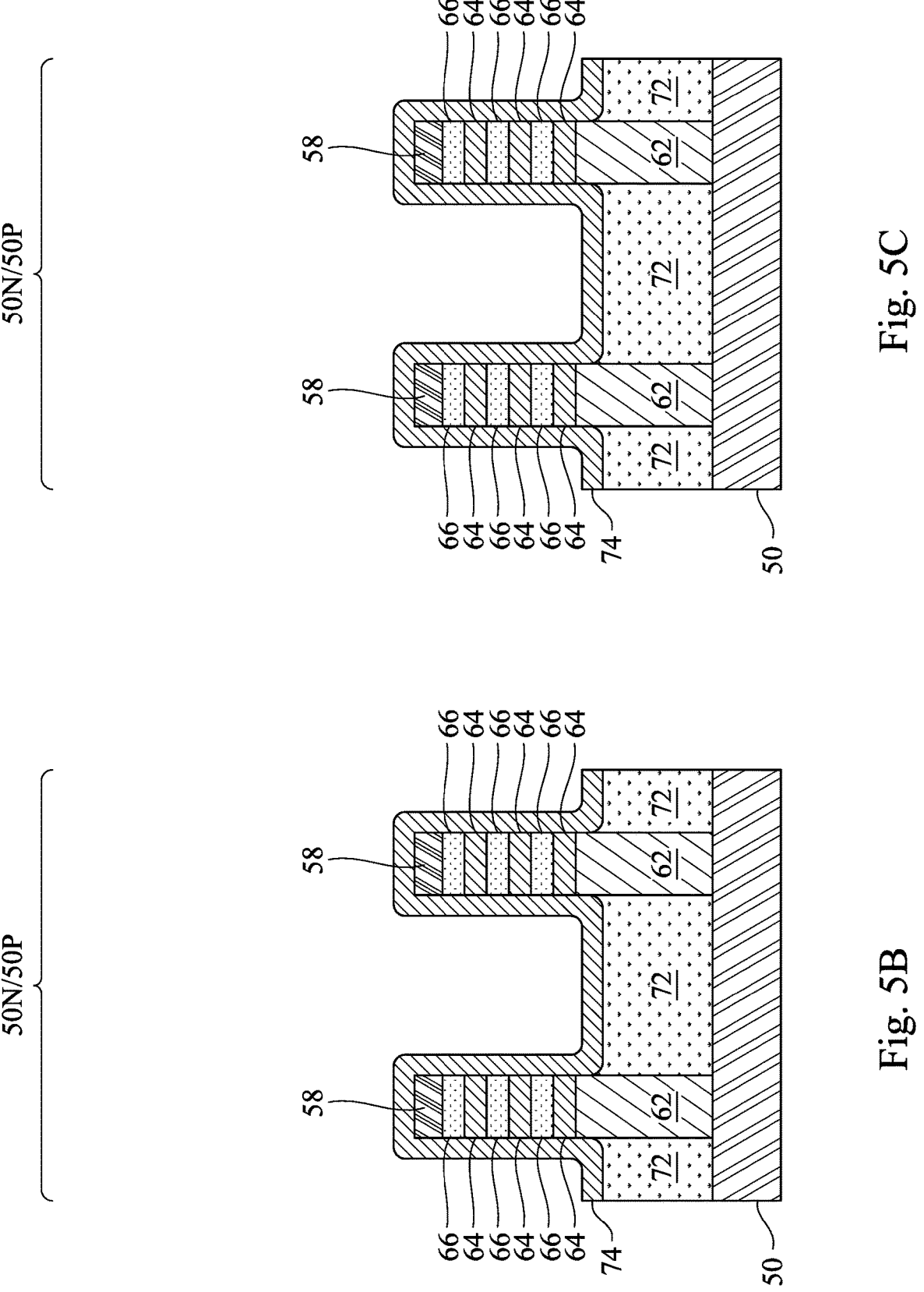

In FIGS. 5A-C, a sacrificial layer 74 is conformally formed over the mask 58, the semiconductor fins 62, the nanostructures 64, 66, and the STI regions 72. The sacrificial layer 74 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. For example, the sacrificial layer 74 may be formed of silicon or silicon germanium.

Figure 6A:
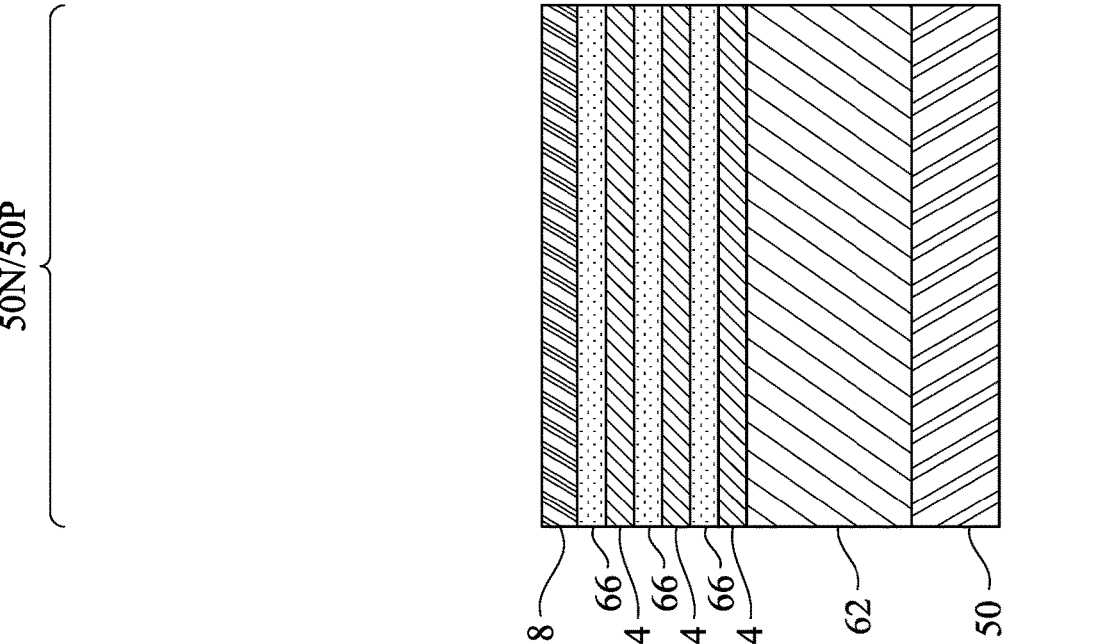
Figures 6B, 6C:
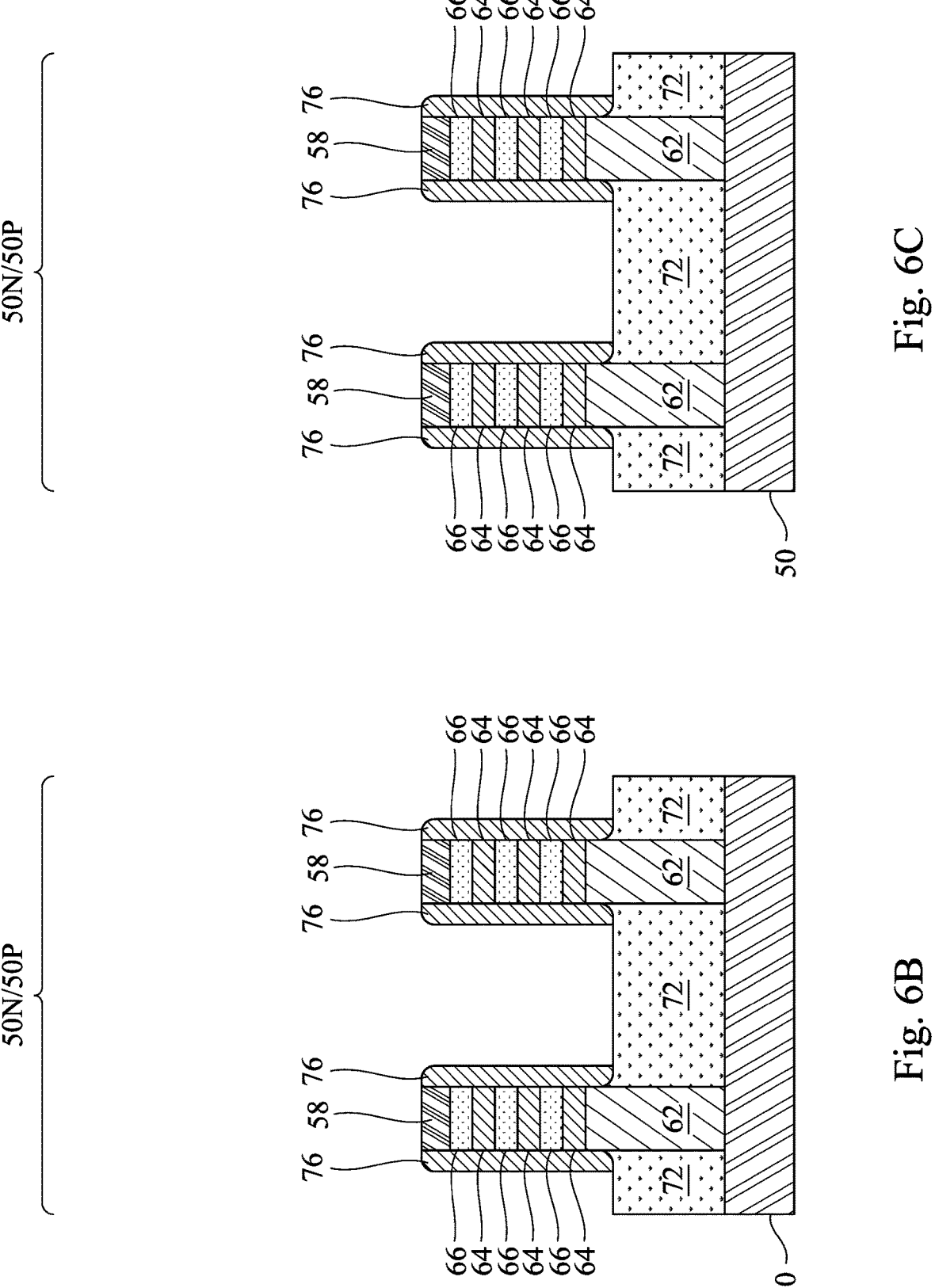

In FIGS. 6A-C, the sacrificial layer 74 is patterned to form sacrificial spacers 76 using an etching process, such as a dry etch, a wet etch, or a combination thereof. The etching process may be anisotropic. As a result of the etching process, the portions of the sacrificial layer 74 over the mask 58 and the nanostructures 64, 66 are removed, and the STI regions 72 between the nanostructures 64, 66 are partially exposed. The sacrificial spacers 76 are disposed over the STI regions 72 and are further disposed on the sidewalls of the mask 58, the semiconductor fins 62, and the nanostructures 64, 66.

In subsequent process steps, a dummy gate layer 84 may be deposited over portions of the sacrificial spacers 76 (see below, FIGS. 11A-C), and the dummy gate layer 84 may be patterned to provide dummy gates 94 that include underlying portions of the sacrificial spacers 76 (see below, FIGS. 12A-C). These dummy gates 94 (e.g., patterned portions of the dummy gate layer 84 and portions of the sacrificial spacers 76) may then be replaced with a functional gate stack. Specifically, the sacrificial spacers 76 are used as temporary spacers during processing to delineate boundaries of insulating fins, and the sacrificial spacers 76 and the nanostructures 64 will be subsequently removed and replaced with gate structures that are wrapped around the nanostructures 66. The sacrificial spacers 76 are formed of a material that has a high etching selectivity from the etching of the material of the nanostructures 66. For example, the sacrificial spacers 76 may be formed of the same semiconductor material as the nanostructures 64 so that the sacrificial spacers 76 and the nanostructures 64 may be removed in a single process step. Alternatively, the sacrificial spacers 76 may be formed of a different material as the nanostructures 64.

FIGS. 7A through 9C illustrate a formation of insulating fins 82 (also referred to as hybrid fins or dielectric fins) between the sacrificial spacers 76 adjacent to the semiconductor fins 62 and nanostructures 64, 66. The insulating fins 82 may insulate and physically separate subsequently formed source/drain regions (see below, FIGS. 14A-C) from each other.

Figure 7A:
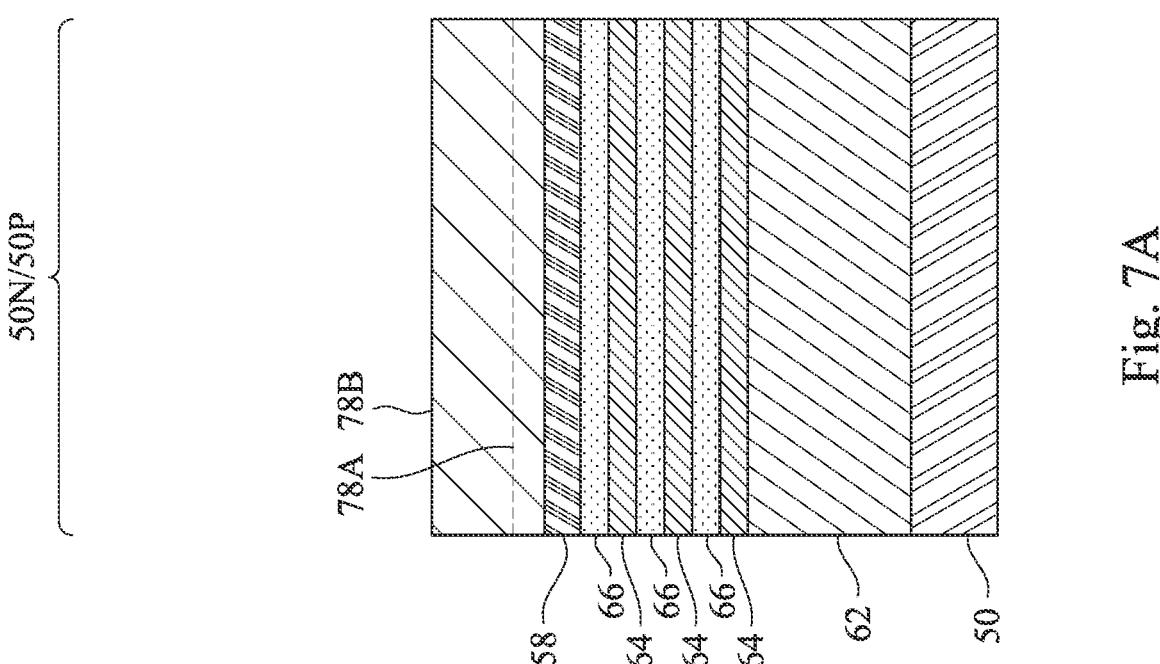
Figure 7C:
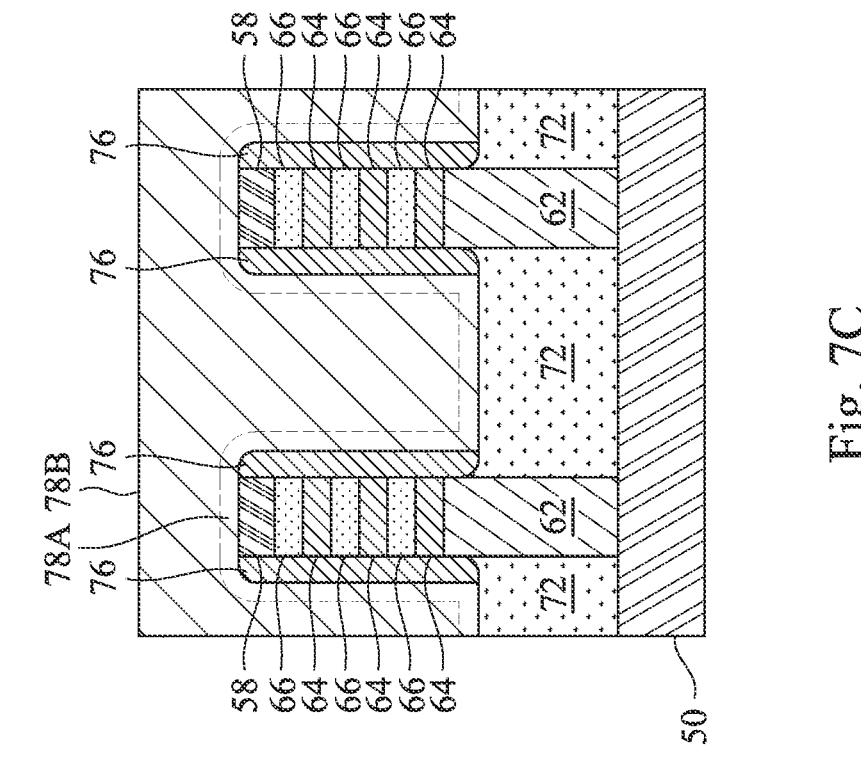
Figure 7B:
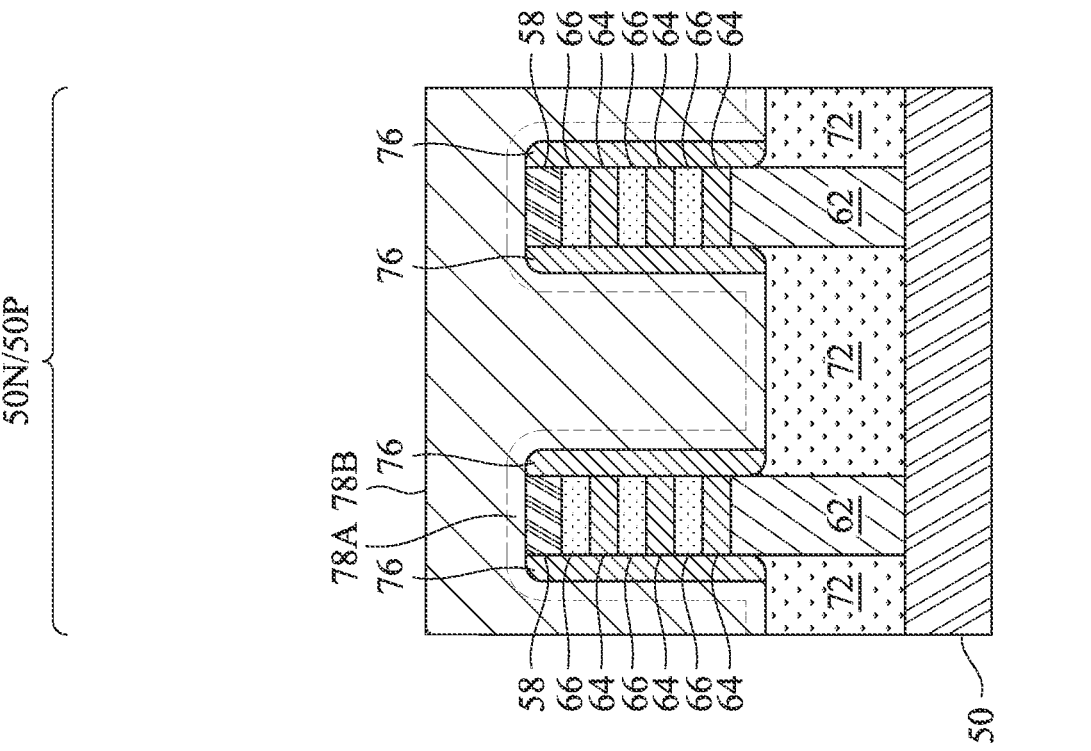

In FIGS. 7A-C, a liner 78A and a fill material 78B are formed over the structure. The liner 78A is conformally deposited over exposed surfaces of the STI regions 72, the masks 58, the semiconductor fins 62, the nanostructures 64, 66, and the sacrificial spacers 76 by an acceptable deposition process such as atomic layer deposition (ALD), chemical vapor deposition (CVD), physical vapor deposition (PVD), or the like. The liner 78A may be formed of one or more dielectric material(s) having a high etching selectivity from the etching of the semiconductor fins 62, the nanostructures 64, 66, and the sacrificial spacers 76, e.g. a nitride such as silicon nitride, silicon carbonitride, silicon oxycarbonitride, or the like. The liner 78A may reduce oxidation of the sacrificial spacers 76 during the subsequent formation of the fill material 78B, which may be useful during the subsequent removal of the sacrificial spacers 76.

Next, a fill material 78B is formed over the liner 78A, filling the remaining area between the semiconductor fins 62 and the nanostructures 64, 66 that is not filled by the sacrificial spacers 76 or the liner 78A. The fill material 78B may form the bulk of the lower portions of the insulating fins 82 (see FIGS. 9A-C) to insulate subsequently formed source/drain regions (see FIG. 14C) from each other. The fill material 78B may be formed by an acceptable deposition process such as ALD, CVD, PVD, or the like. The fill material 78B may be formed of one or more dielectric material(s) having a high etching selectivity from the etching of the semiconductor fins 62, the nanostructures 64, 66, the sacrificial spacers 76, and the liner 78A such as an oxide such as silicon oxide, silicon oxynitride, silicon oxycarbonitride, silicon oxycarbide, the like, or combinations thereof.

Figure 8A:
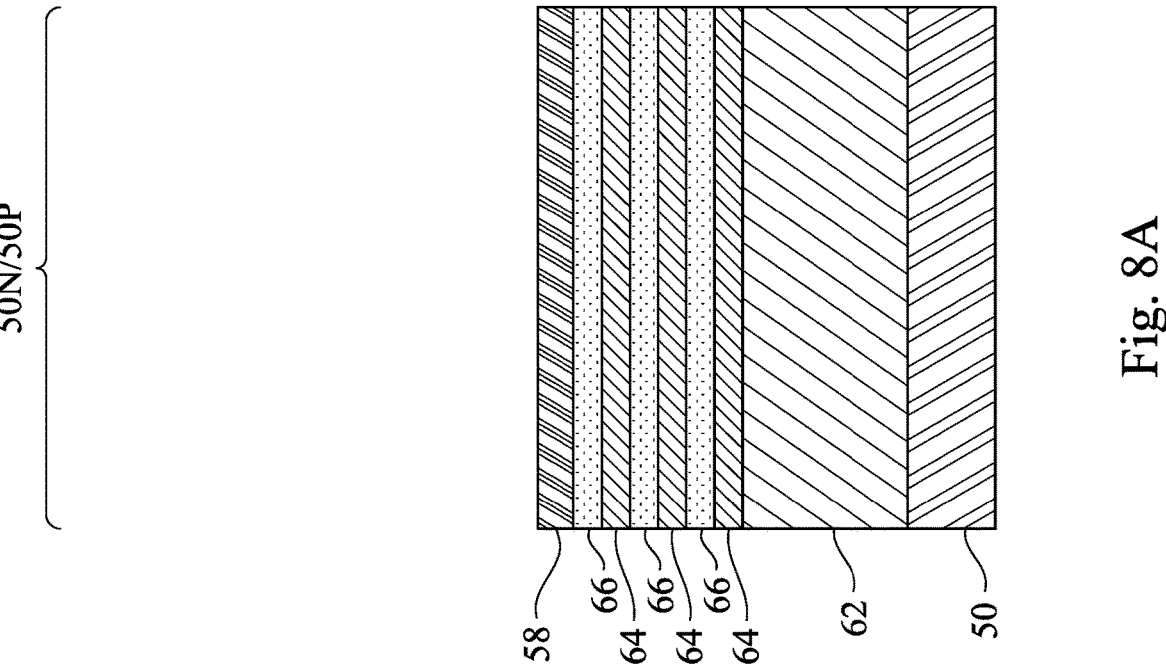
Figures 8B, 8C:
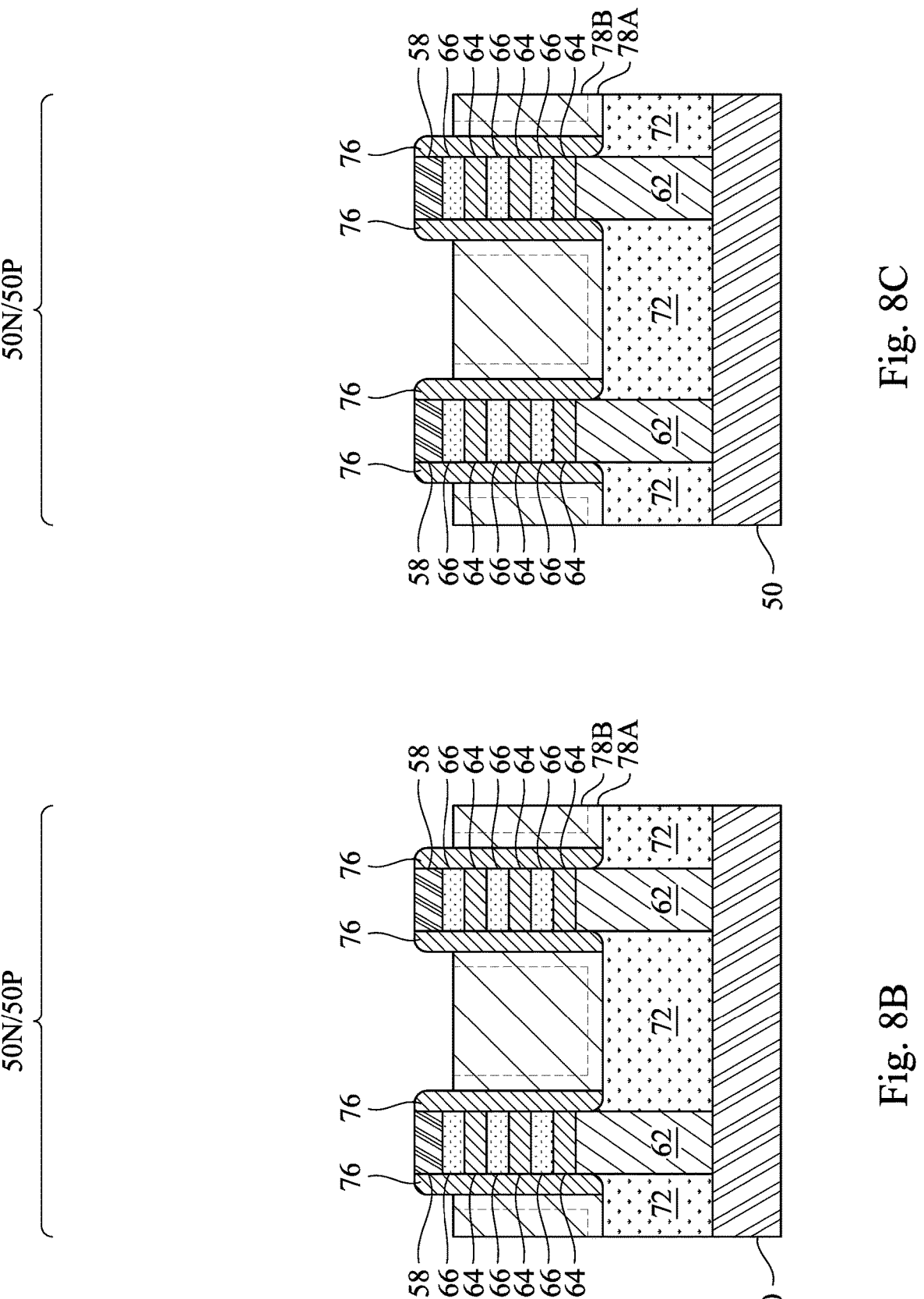

In FIGS. 8A-8C, upper portions of the liner 78A and the fill material 78B above top surfaces of the masks 58 may be removed using one or more acceptable planarization and/or one or more etching processes. The etching process(es) may be selective to the liner 78A and to the fill material 78B (e.g., selectively etches the liner 78A and the fill material 78B at a faster rate than the sacrificial spacers 76 and/or the mask 58). After etching, top surfaces of the liner 78A and the fill material 78B may be below top surfaces of the mask 58. FIGS. 8A-8C illustrate the liner 78A and fill material 78B as having a planar top surface for ease of illustration only. In other embodiments, top surfaces of the liner 78A and/or the fill material 78B may be concave or convex. In other embodiments, the fill material 78 may be recessed below top surfaces of the mask 58 while the liner 78A is maintained at a same level as the mask 58.

Figure 9A:
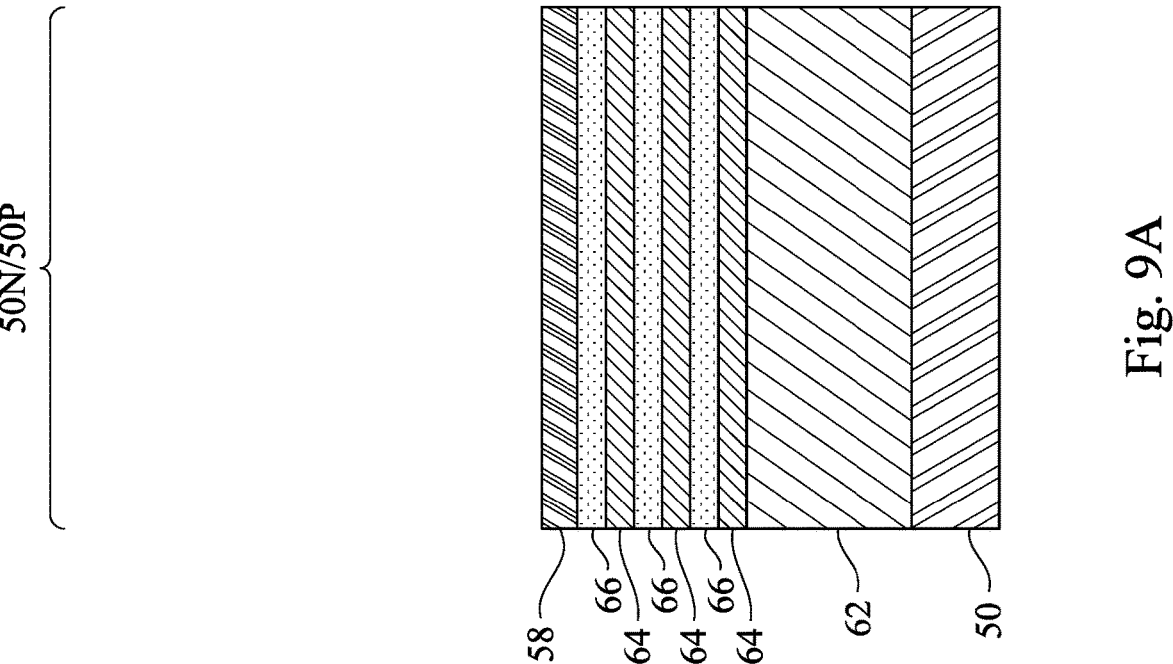
Figures 9B, 9C:
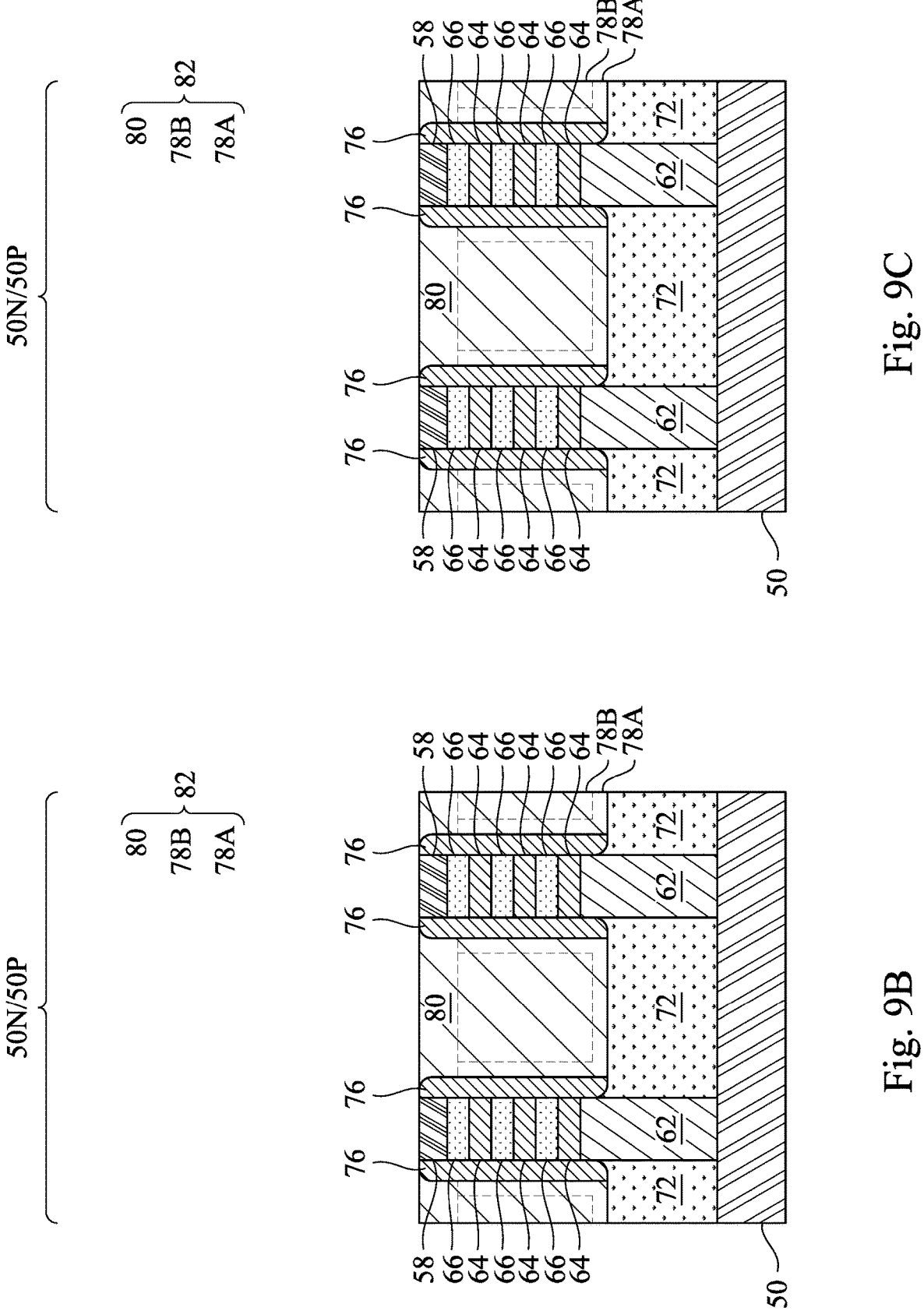

FIGS. 9A-C illustrate the forming of a dielectric capping layer 80 on the liner 78A and the fill material 78B, thereby forming the insulating fins 82. The dielectric capping layer 80 may fill a remaining area over the liner 78A, over the fill material 78B, and between sidewalls of the mask 58. The dielectric capping layer 80 may be formed by an acceptable deposition process such as ALD, CVD, PVD, or the like. The dielectric capping layer 80 may be formed of one or more dielectric material(s) having a high etching selectivity from the etching of the semiconductor fins 62, the nanostructures 64, 66, the sacrificial spacers 76, the liner 78A, and the fill material 78B. For example, the dielectric capping layer 80 may comprise a high-k material such as hafnium oxide, zirconium oxide, zirconium aluminum oxide, hafnium aluminum oxide, hafnium silicon oxide, aluminum oxide, the like, or combinations thereof.

The dielectric capping layer 80 may be formed to initially cover the mask 58 and the nanostructures 64, 66. Subsequently, a removal process is applied to remove excess material(s) of the dielectric capping layer 80. In some embodiments, a planarization process such as a CMP, an etch-back process, combinations thereof, or the like may be utilized. The planarization process exposes the masks 58 such that top surfaces of the masks 58, the sacrificial spacers 76, and the dielectric capping layer 80 are coplanar (within process variations). In the illustrated embodiment, the masks 58 remain after the planarization process. In another embodiment, portions of or the entirety of the masks 58 may also be removed by the planarization process.

As a result, insulating fins 82 are formed between and contacting the sacrificial spacers 76. The insulating fins 82 comprise the liner 78A, the fill material 78B, and the dielectric capping layer 80. The sacrificial spacers 76 space the insulating fins 82 apart from the nanostructures 64, 66, and a size of the insulating fins 82 may be adjusted by adjusting a thickness of the sacrificial spacers 76.

Figure 10A:
Figure 10A:
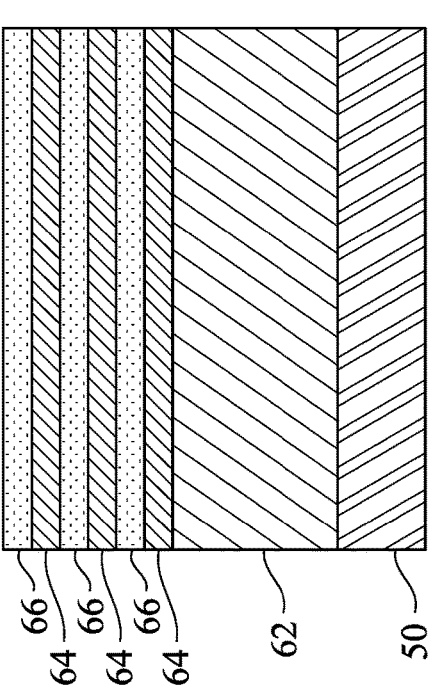
Figures 10B, 10C:
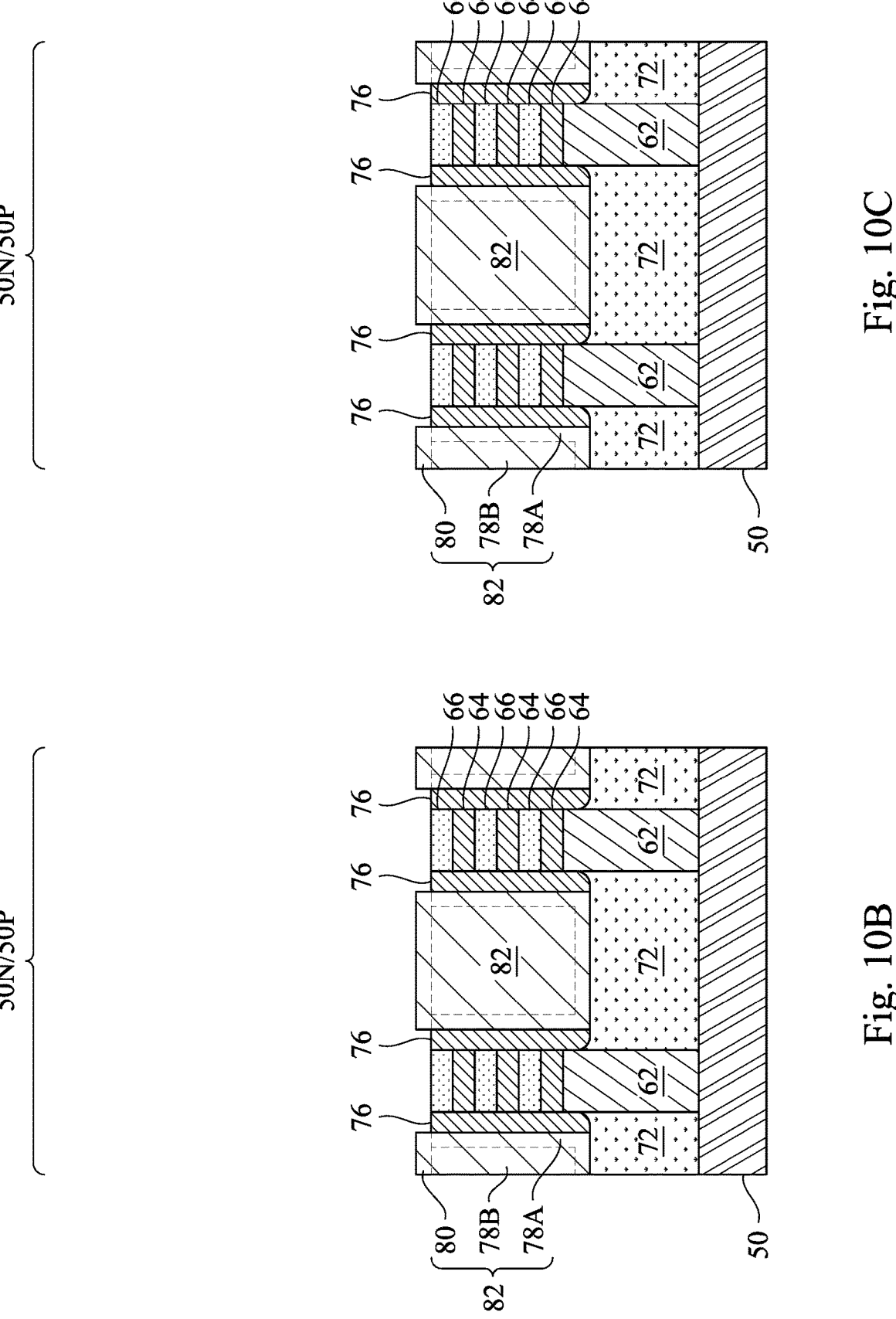

In FIGS. 10A-C, the mask 58 is removed using an etching process, for example. The etching process may be a wet etch that selective removes the mask 58 without significantly etching the insulating fins 82. The etching process may be anisotropic. Further, the etching process (or a separate, selective etching process) may also be applied to reduce a height of the sacrificial spacers 76 to a similar level (e.g., same within processing variations) as the stacked nanostructures 64, 66. After the etching process(es), a topmost surface of the stacked nanostructures 64, 66 and the sacrificial spacers 76 may be exposed and may be lower than a topmost surface of the insulating fins 82.

Figure 11A:
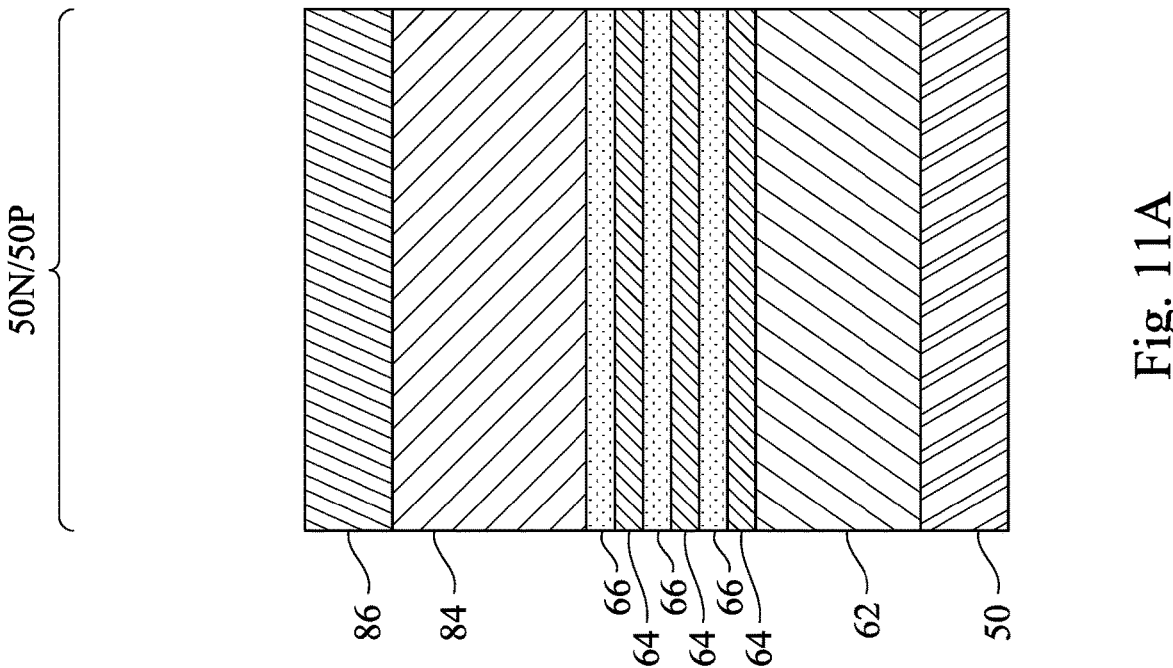
Figure 11C:
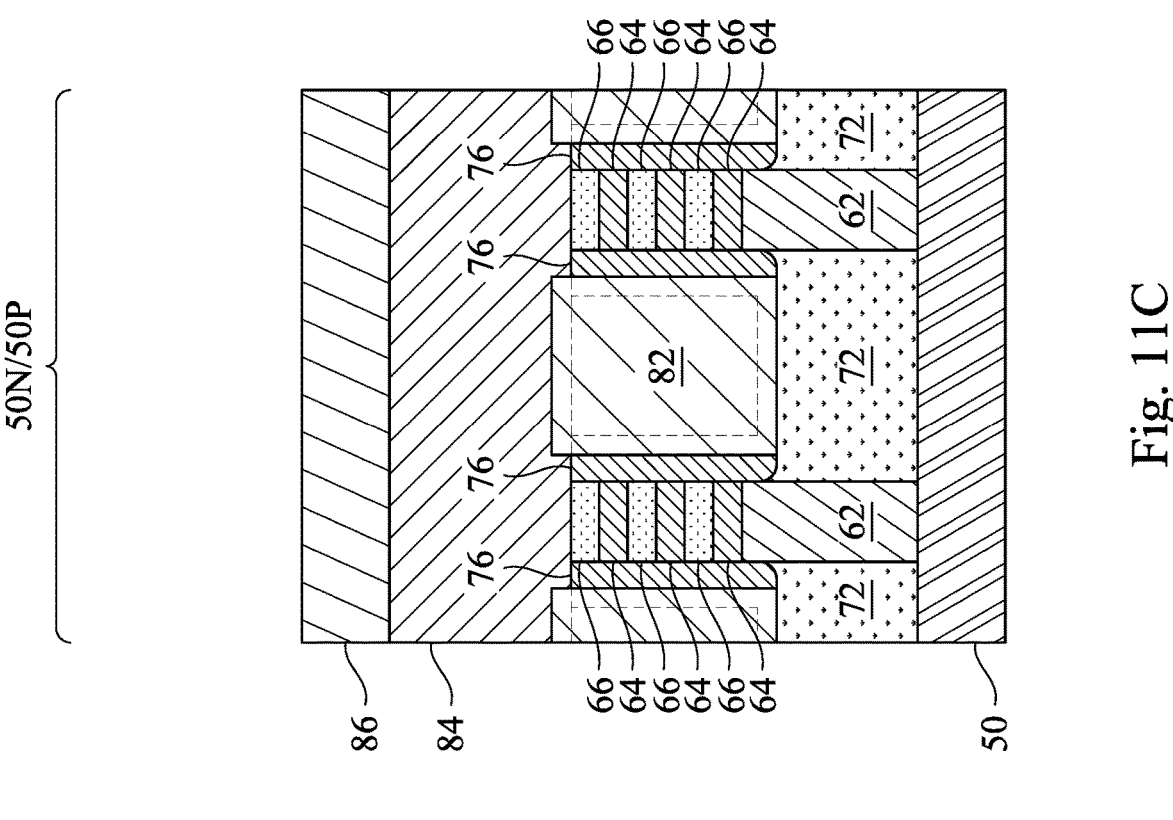
Figure 11B:
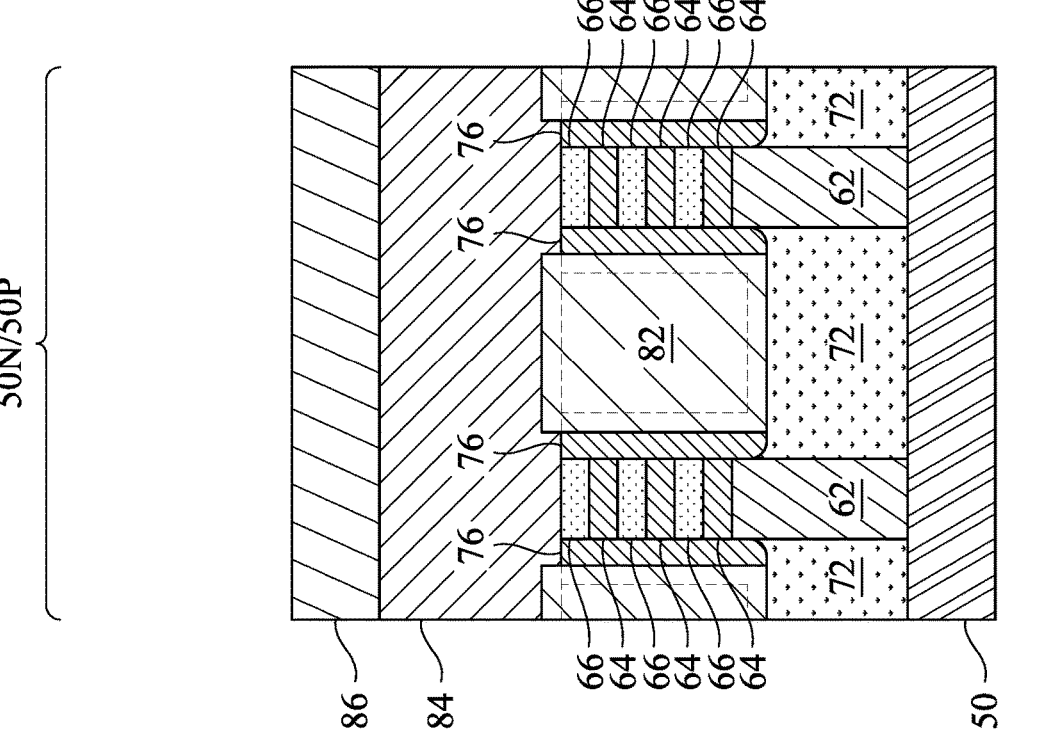

In FIG. 11A-C, a dummy gate layer 84 is formed on the insulating fins 82, the sacrificial spacers 76, and the nanostructures 64, 66. Because the nanostructures 64, 66 and the sacrificial spacers 76 extend lower than the insulating fins 82, the dummy gate layer 84 may be disposed along exposed sidewalls of the insulating fins 82. The dummy gate layer 84 may be deposited and then planarized, such as by a CMP. The dummy gate layer 84 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 84 may also be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. The dummy gate layer 84 may be formed of material(s) that have a high etching selectivity from the etching of insulation materials, e.g., the insulating fins 82. A mask layer 86 may be deposited over the dummy gate layer 84. The mask layer 86 may be formed of a dielectric material such as silicon nitride, silicon oxynitride, or the like. In this example, a single dummy gate layer 84 and a single mask layer 86 are formed across the n-type region 50N and the p-type region 50P.

Figure 12A:
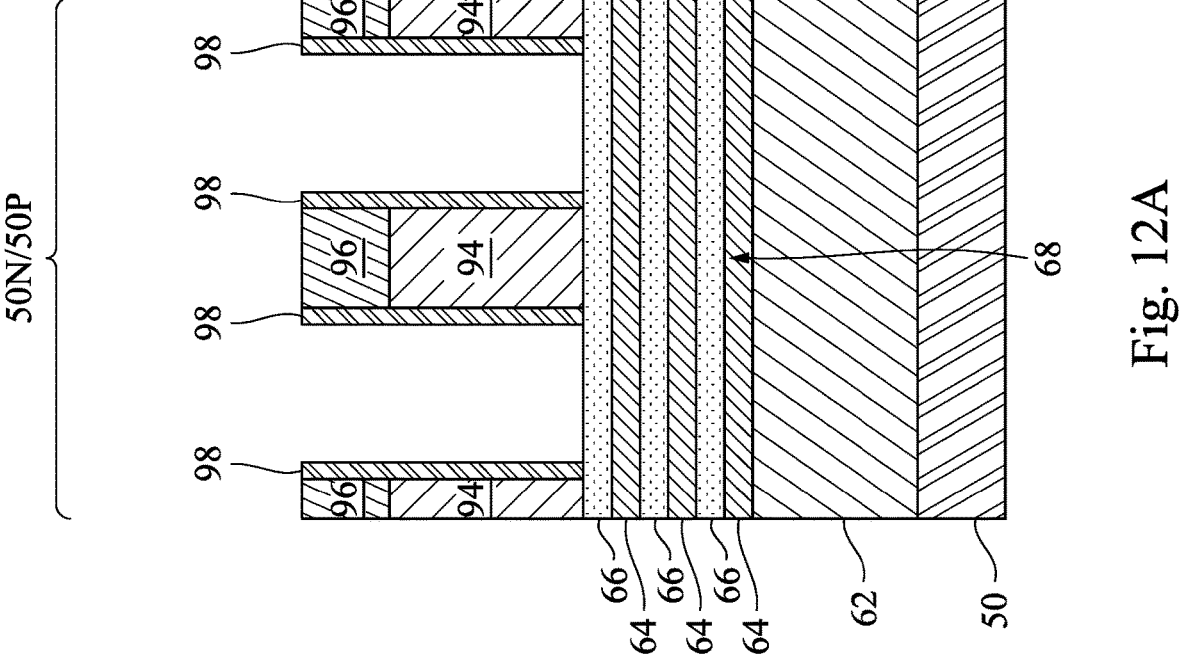
Figures 12B, 12C:
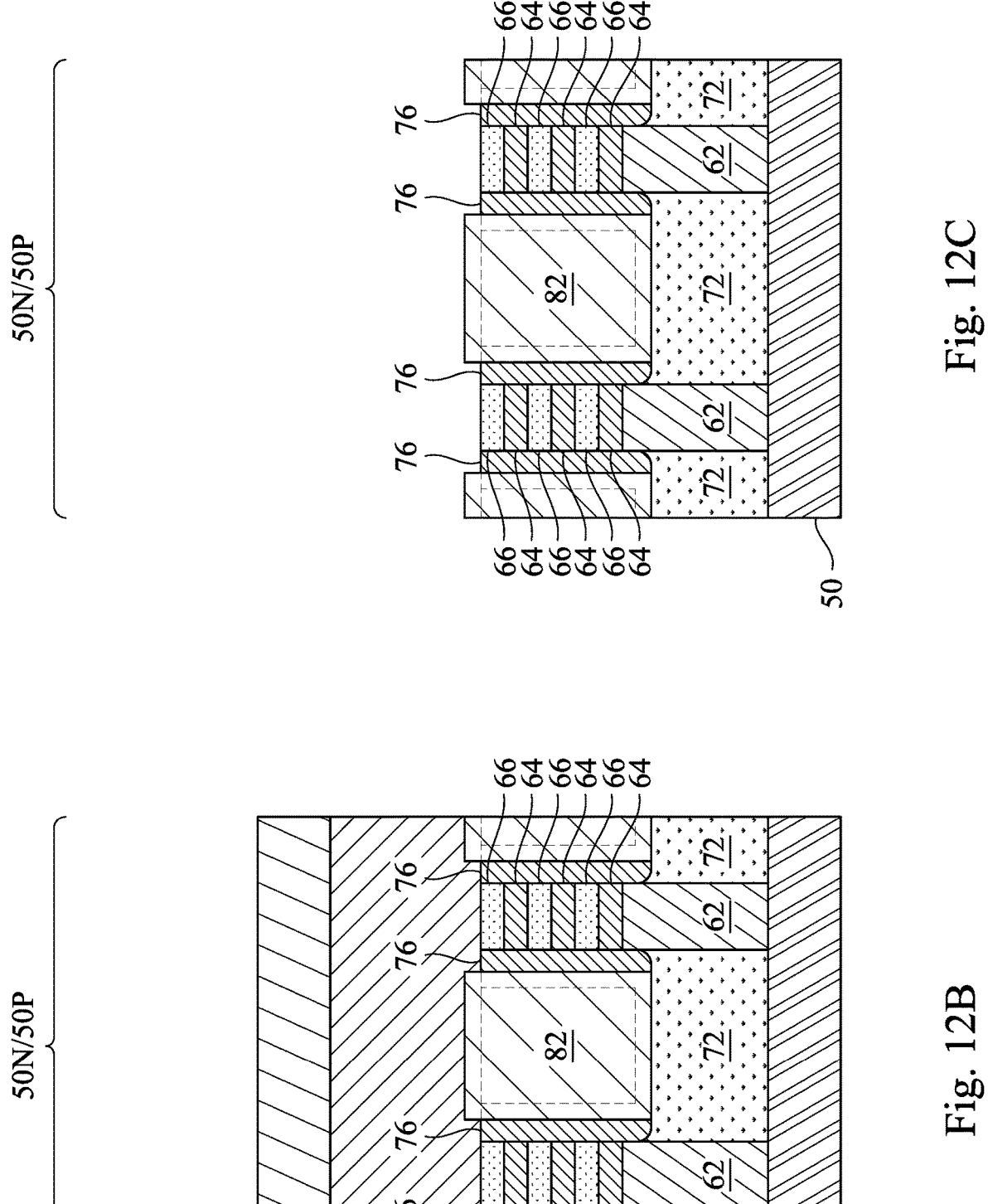

In FIGS. 12A-12C, the mask layer 86 is patterned using acceptable photolithography and etching techniques to form masks 96. The pattern of the masks 96 is then transferred to the dummy gate layer 84 by any acceptable etching technique to form dummy gates 94. The dummy gates 94 cover the top surface of the nanostructures 64, 66 that will be exposed in subsequent processing to form channel regions. The pattern of the masks 96 may be used to physically separate adjacent dummy gates 94. The dummy gates 94 may also have lengthwise directions substantially perpendicular (within process variations) to the lengthwise directions of the semiconductor fins 62. The masks 96 can optionally be removed after patterning, such as by any acceptable etching technique.

The sacrificial spacers 76 and the dummy gates 94 collectively extend along the portions of the nanostructures 66 that will be patterned to form channel regions 68. Subsequently formed gate structures will replace the sacrificial spacers 76 and the dummy gates 94. Forming the dummy gates 94 over the sacrificial spacers 76 allows the subsequently formed gate structures to have a greater height.

As noted above, the dummy gates 94 may be formed of a semiconductor material. In such embodiments, the nanostructures 64, the sacrificial spacers 76, and the dummy gates 94 are each formed of semiconductor materials. In some embodiments, the nanostructures 64 and the sacrificial spacers 76 are formed of a first semiconductor material (e.g., silicon germanium) and the dummy gates 94 are formed of a second semiconductor material (e.g., silicon), so that during a replacement gate process, the dummy gates 94 may be removed in a first etching step, and the nanostructures 64 and the sacrificial spacers 76 may be removed together in a second etching step. When the nanostructures 64 and the sacrificial spacers 76 are formed of silicon germanium: the nanostructures 64 and the sacrificial spacers 76 may have similar germanium concentrations, the nanostructures 64 may have a greater germanium concentration than the sacrificial spacers 76, or the sacrificial spacers 76 may have a greater germanium concentration than the nanostructures 64. In some embodiments, the nanostructures 64 are formed of a first semiconductor material (e.g., silicon germanium) and the sacrificial spacers 76 and the dummy gates 94 are formed of a second semiconductor material (e.g., silicon), so that during a replacement gate process, the sacrificial spacers 76 and the dummy gates 94 may be removed together in a first etching step, and the nanostructures 64 may be removed in a second etching step.

Gate spacers 98 are formed over the nanostructures 64, 66, and on exposed sidewalls of the masks 96 (if present) and the dummy gates 94. The gate spacers 98 may be formed by conformally depositing one or more dielectric material(s) on the dummy gates 94 and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 94 (thus forming the gate spacers 98). After etching, the gate spacers 98 can have curved sidewalls or can have straight sidewalls.

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 94, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 13A:
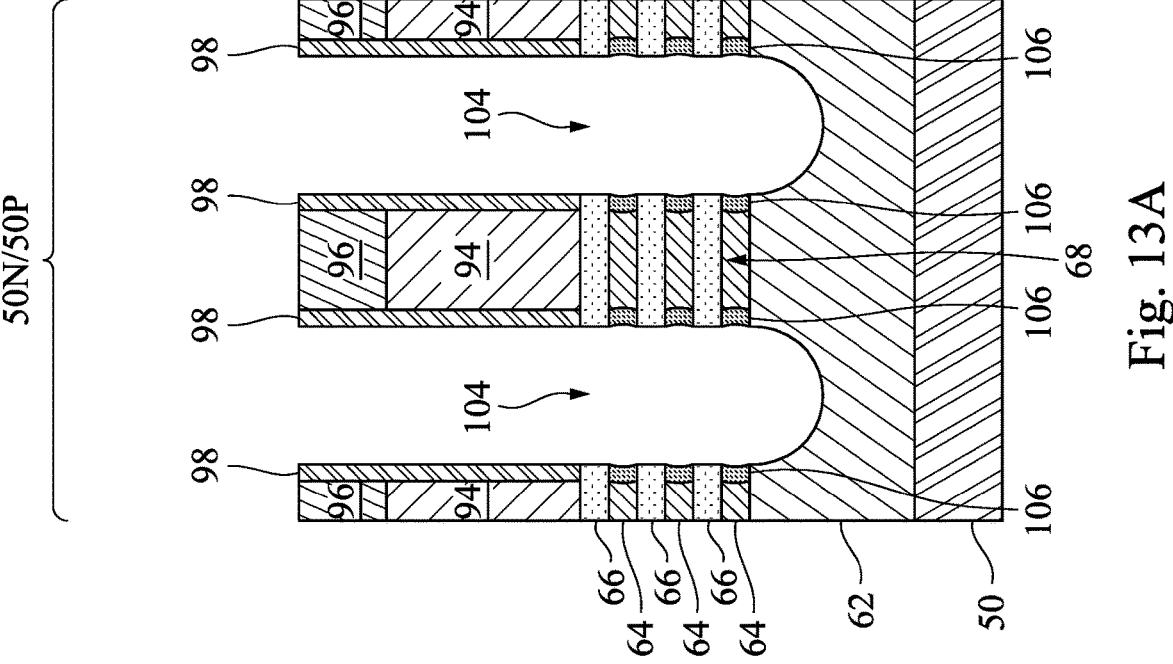
Figures 13B, 13C:
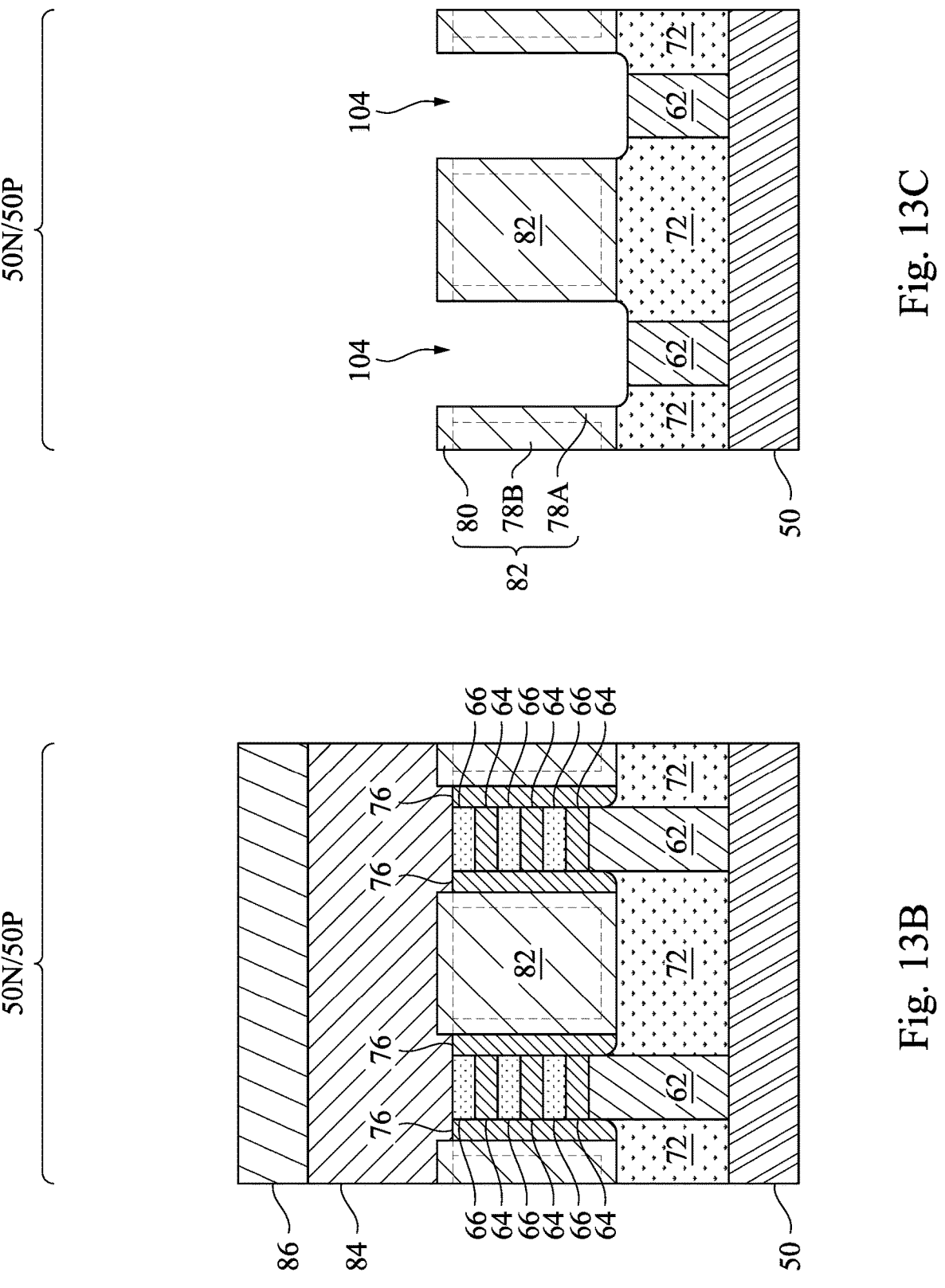

In FIGS. 13A-C, source/drain recesses 104 are formed in the nanostructures 64, 66 and the sacrificial spacers 76. In the illustrated embodiment, the source/drain recesses 104 extend through the nanostructures 64, 66 and the sacrificial spacers 76 into the semiconductor fins 62. The source/drain recesses 104 may also extend into the substrate 50. In various embodiments, the source/drain recesses 104 may extend to a top surface of the substrate 50 without etching the substrate 50; the semiconductor fins 62 may be etched such that bottom surfaces of the source/drain recesses 104 are disposed below the top surfaces of the STI regions 72; or the like. The source/drain recesses 104 may be formed by etching the nanostructures 64, 66 and the sacrificial spacers 76 using an anisotropic etching processes, such as a RIE, a NBE, or the like. The gate spacers 98 and the dummy gates 94 collectively mask portions of the semiconductor fins 62 and/or the nanostructures 64, 66 during the etching processes used to form the source/drain recesses 104. A single etch process may be used to etch each of the nanostructures 64, 66 and the sacrificial spacers 76, or multiple etch processes may be used to etch the nanostructures 64, 66 and the sacrificial spacers 76. Timed etch processes may be used to stop the etching of the source/drain recesses 104 after the source/drain recesses 104 reach a desired depth.

Optionally, inner spacers 106 are formed on the sidewalls of the nanostructures 64, e.g., those sidewalls exposed by the source/drain recesses 104. As will be subsequently described in greater detail, source/drain regions will be subsequently formed in the source/drain recesses 104, and the nanostructures 64 will be subsequently replaced with corresponding gate structures. The inner spacers 106 act as isolation features between the subsequently formed source/drain regions and the subsequently formed gate structures. Further, the inner spacers 106 may be used to substantially prevent damage to the subsequently formed source/drain regions by subsequent etching processes, such as etching processes used to subsequently remove the nanostructures 64.

As an example to form the inner spacers 106, the source/drain recesses 104 can be laterally expanded. Specifically, portions of the sidewalls of the nanostructures 64 exposed by the source/drain recesses 104 may be recessed. Although sidewalls of the nanostructures 64 are illustrated as being concave, the sidewalls may be straight or convex. The sidewalls may be recessed by any acceptable etching process, such as one that is selective to the nanostructures 64 (e.g., selectively etches the materials of the nanostructures 64 at a faster rate than the material of the nanostructures 66).

The etching may be isotropic. For example, when the nanostructures 66 are formed of silicon and the nanostructures 64 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 104 and recess the sidewalls of the nanostructures 64. The inner spacers 106 are then formed on the recessed sidewalls of the nanostructures 64. The inner spacers 106 can be formed by conformally forming an insulating material and subsequently etching the insulating material. The insulating material may be silicon nitride or silicon oxynitride, although any suitable material, such as a low-k dielectric material, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 106 are illustrated as being recessed with respect to the sidewalls of the gate spacers 98, the outer sidewalls of the inner spacers 106 may extend beyond or be flush with the side-walls of the gate spacers 98. In other words, the inner spacers 106 may partially fill, completely fill, or overfill the sidewall recesses. Moreover, although the sidewalls of the inner spacers 106 are illustrated as being concave, the sidewalls of the inner spacers 106 may be straight or convex.

Figure 14A:
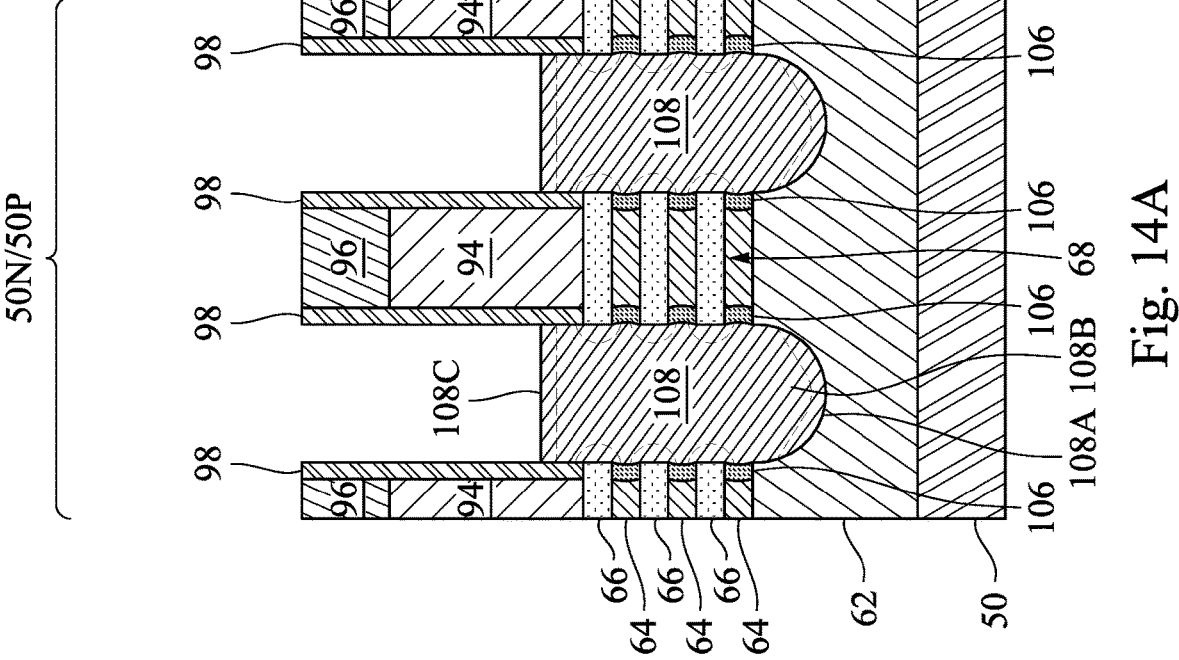
Figure 14C:
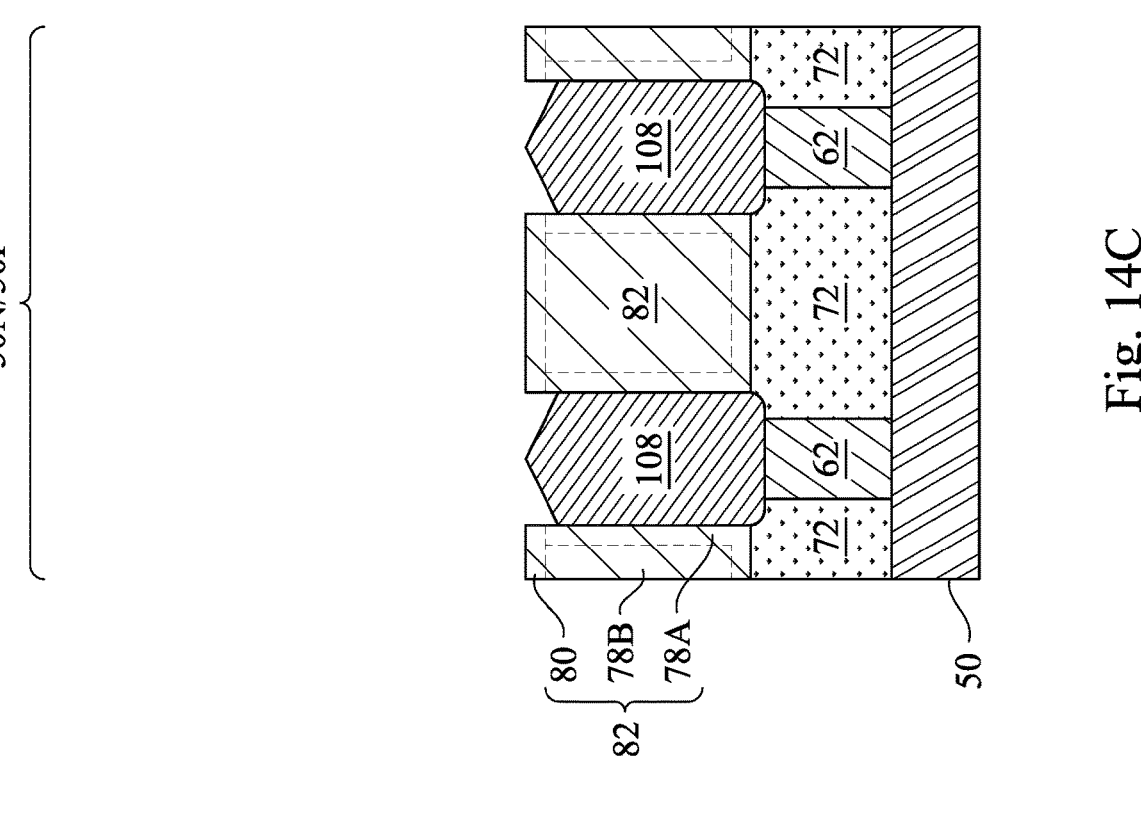
Figure 14B:
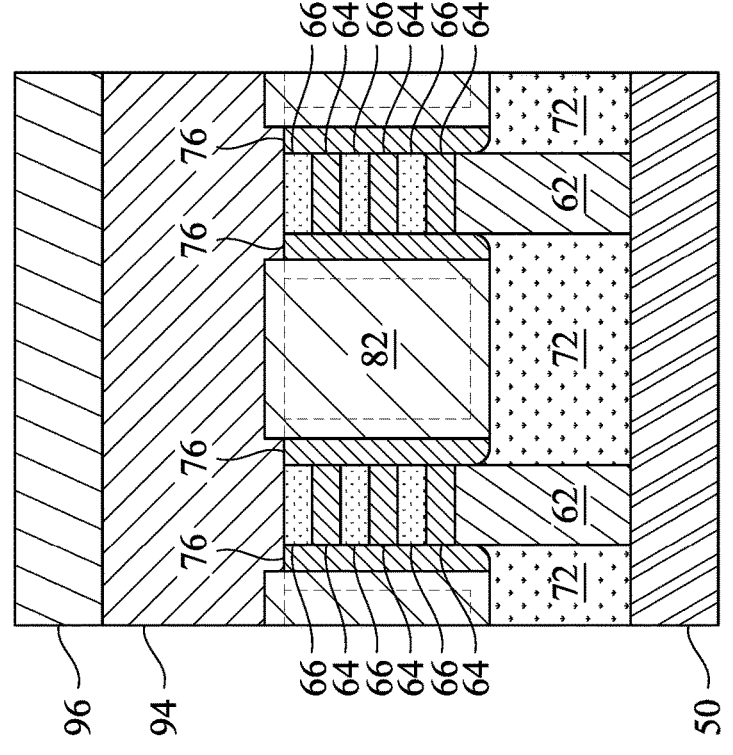

In FIGS. 14A-C epitaxial source/drain regions 108 are formed in the source/drain recesses 104. The epitaxial source/drain regions 108 are formed in recesses 104 such that each dummy gate 94 (and corresponding channel region 68) is disposed between respective adjacent pairs of the epitaxial source/drain regions 108. In some embodiments, the gate spacers 98 and the inner spacers 106 are used to separate the epitaxial source/drain regions 108 from, respectively, the dummy gates 94 and the nanostructures 64 by an appropriate lateral distance so that the epitaxial source/drain regions 108 do not short out with subsequently formed gates of the resulting nano-FETs. A material of the epitaxial source/drain regions 108 may be selected to exert stress in the respective channel regions 68, thereby improving performance.

The epitaxial source/drain regions 108 in the n-type region 50N may be formed by masking the p-type region 50P. Then, the epitaxial source/drain regions 108 in the n-type region 50N are epitaxially grown in the source/drain recesses 104 in the n-type region 50N. The epitaxial source/drain regions 108 may include any acceptable material appropriate for n-type devices. For example, if the nano-structures 66 are silicon, the epitaxial source/drain regions 108 in the n-type region 50N may include materials exerting a tensile strain on the channel regions 68, such as silicon, silicon carbide, phosphorous doped silicon carbide, silicon arsenide, silicon phosphide, or the like. The epitaxial source/drain regions 108 in the n-type region 50N may be referred to as "n-type source/drain regions." The epitaxial source/drain regions 108 in the n-type region 50N may have surfaces raised from respective surfaces of the semiconductor fins 62 and the nanostructures 64, 66, and may have facets.

The epitaxial source/drain regions 108 in the p-type region 50P may be formed by masking the n-type region 50N. Then, the epitaxial source/drain regions 108 in the p-type region 50P are epitaxially grown in the source/drain recesses 104 in the p-type region 50P. The epitaxial source/drain regions 108 may include any acceptable material appropriate for p-type devices. For example, if the nano-structures 66 are silicon, the epitaxial source/drain regions 108 in the p-type region 50P may include materials exerting a compressive strain on the channel regions 68, such as silicon germanium, boron doped silicon germanium, silicon germanium phosphide, germanium, germanium tin, or the like. The epitaxial source/drain regions 108 in the p-type region 50P may be referred to as "p-type source/drain regions." The epitaxial source/drain regions 108 in the p-type region 50P may have surfaces raised from respective surfaces of the semiconductor fins 62 and the nanostructures 64, 66, and may have facets.

The epitaxial source/drain regions 108, the nanostructures 64, 66, and/or the semiconductor fins 62 may be implanted with impurities to form source/drain regions, similar to the process previously described for forming LDD regions, followed by an anneal. The epitaxial source/drain regions 108 may have an impurity concentration in the range of $10^{19}$ $cm^{-3}$ to $10^{21}$ $cm^{-3}$. The n-type and/or p-type impurities for source/drain regions may be any of the impurities previously described. In some embodiments, the epitaxial source/drain regions 108 may be in situ doped during growth.

The epitaxial source/drain regions 108 may include one or more semiconductor material layers. For example, the epi-taxial source/drain regions 108 may each include a liner layer 108A, a main layer 108B, and a finishing layer 108C (or more generally, a first semiconductor material layer, a second semiconductor material layer, and a third semicon-ductor material layer). Any number of semiconductor mate-rial layers may be used for the epitaxial source/drain regions 108. Each of the liner layer 108A, the main layer 108B, and the finishing layer 108C may be formed of different semi-conductor materials and may be doped to different impurity concentrations. In some embodiments, the liner layer 108A may have a lesser concentration of impurities than the main layer 108B, and the finishing layer 108C may have a greater concentration of impurities than the liner layer 108A and a lesser concentration of impurities than the main layer 108B. In embodiments in which the epitaxial source/drain regions include three semiconductor material layers, the liner layers 108A may be grown in the source/drain recesses 104, the main layers 108B may be grown on the liner layers 108A, and the finishing layers 108C may be grown on the main layers 108B.

As a result of the epitaxy processes used to form the epitaxial source/drain regions 108, upper surfaces of the epitaxial source/drain regions have facets which expand laterally outward beyond sidewalls of the semiconductor fins 62 and the nanostructures 64, 66. However, the insulating fins 82 block the lateral epitaxial growth. Therefore, adja-cent epitaxial source/drain regions 108 remain separated after the epitaxy process is completed as illustrated by FIG. 14C. The epitaxial source/drain regions 108 contact the sidewalls of the insulating fins 82. In the illustrated embodi-ment, the epitaxial source/drain regions 108 are grown so that the upper surfaces of the epitaxial source/drain regions 108 are disposed below the top surfaces of the insulating fins 82. In various embodiments, the upper surfaces of the epitaxial source/drain regions 108 are disposed above the top surfaces of the insulating fins 82; the upper surfaces of the epitaxial source/drain regions 108 have portions dis-posed above and below the top surfaces of the insulating fins 82; or the like.

Figure 15A:
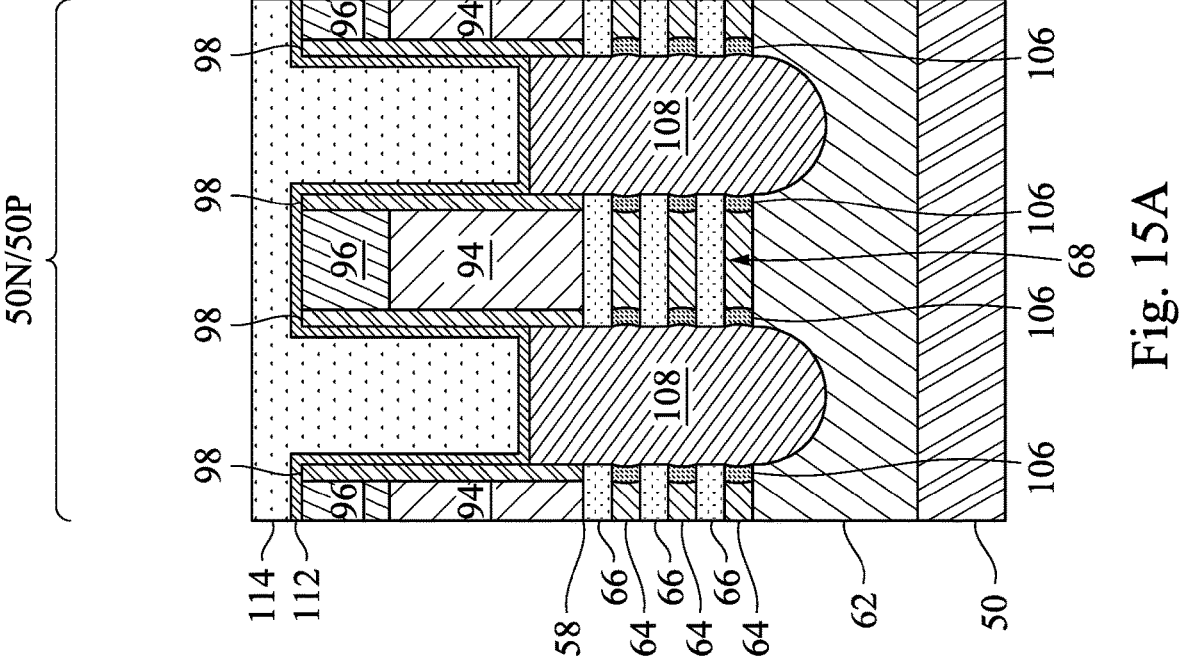
Figure 15C:
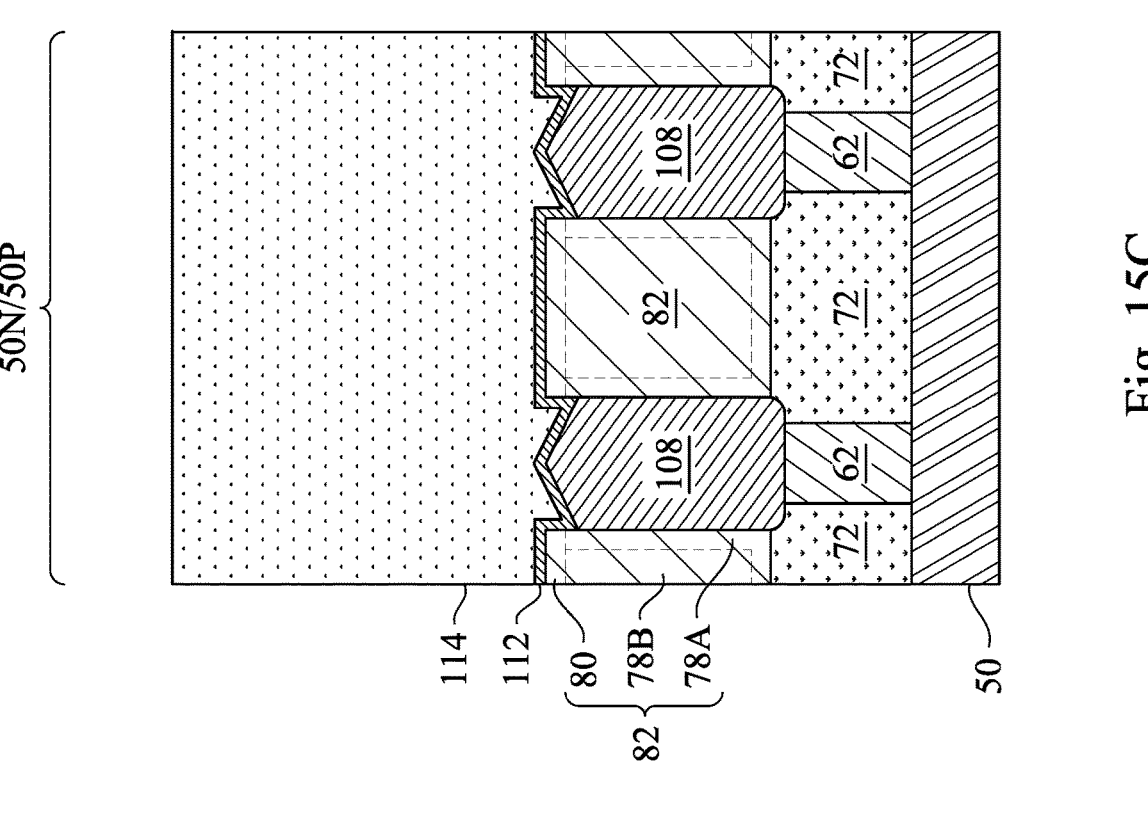
Figure 15B:
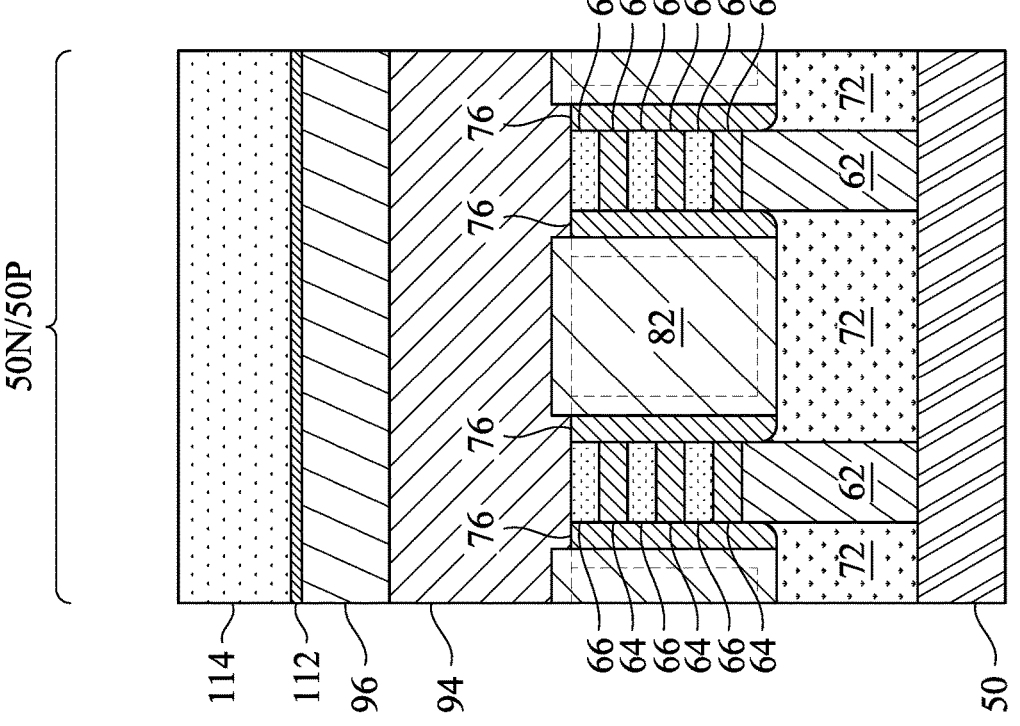

In FIGS. 15A-C, a first inter-layer dielectric (ILD) 114 is deposited over the epitaxial source/drain regions 108, the gate spacers 98, the masks 96 (if present) or the dummy gates 94. The first ILD 114 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 112 is formed between the first ILD 114 and the epitaxial source/drain regions 108, the gate spacers 98, and the masks 96 (if present) or the dummy gates 94. The CESL 112 may be formed of a dielectric material, such as silicon nitride, silicon oxide, silicon oxynitride, or the like, having a high etching selectivity from the etching of the first ILD 114. The CESL 112 may be formed by any suitable method, such as CVD, ALD, or the like.

Figure 16A:
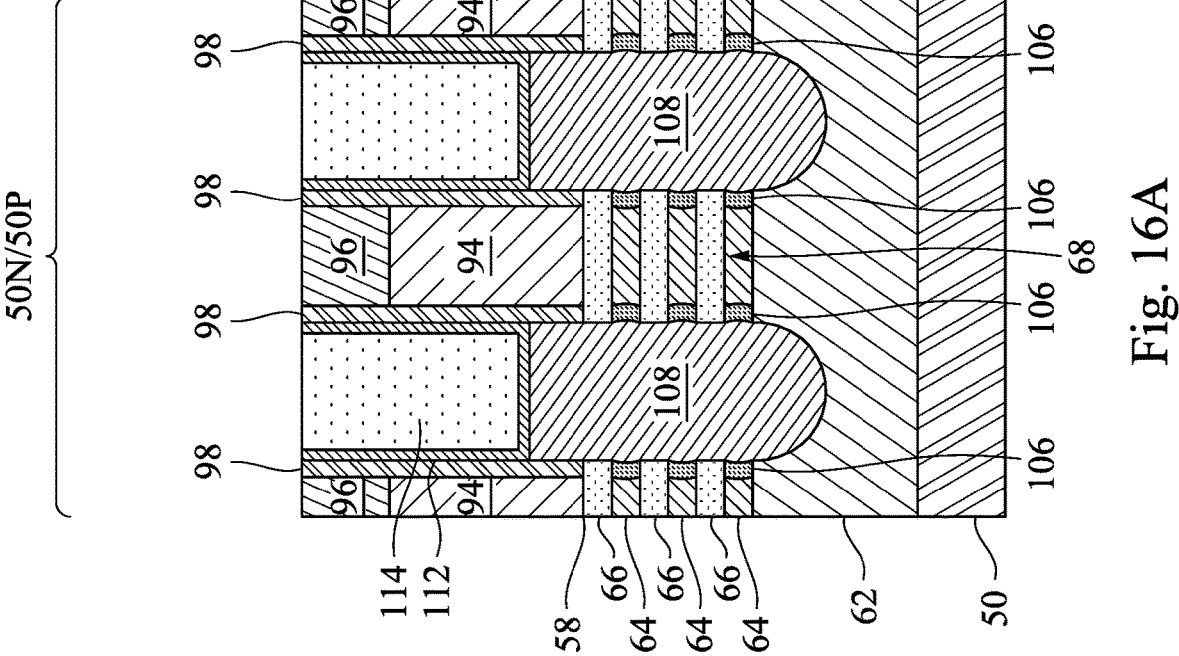
Figures 16B, 16C:
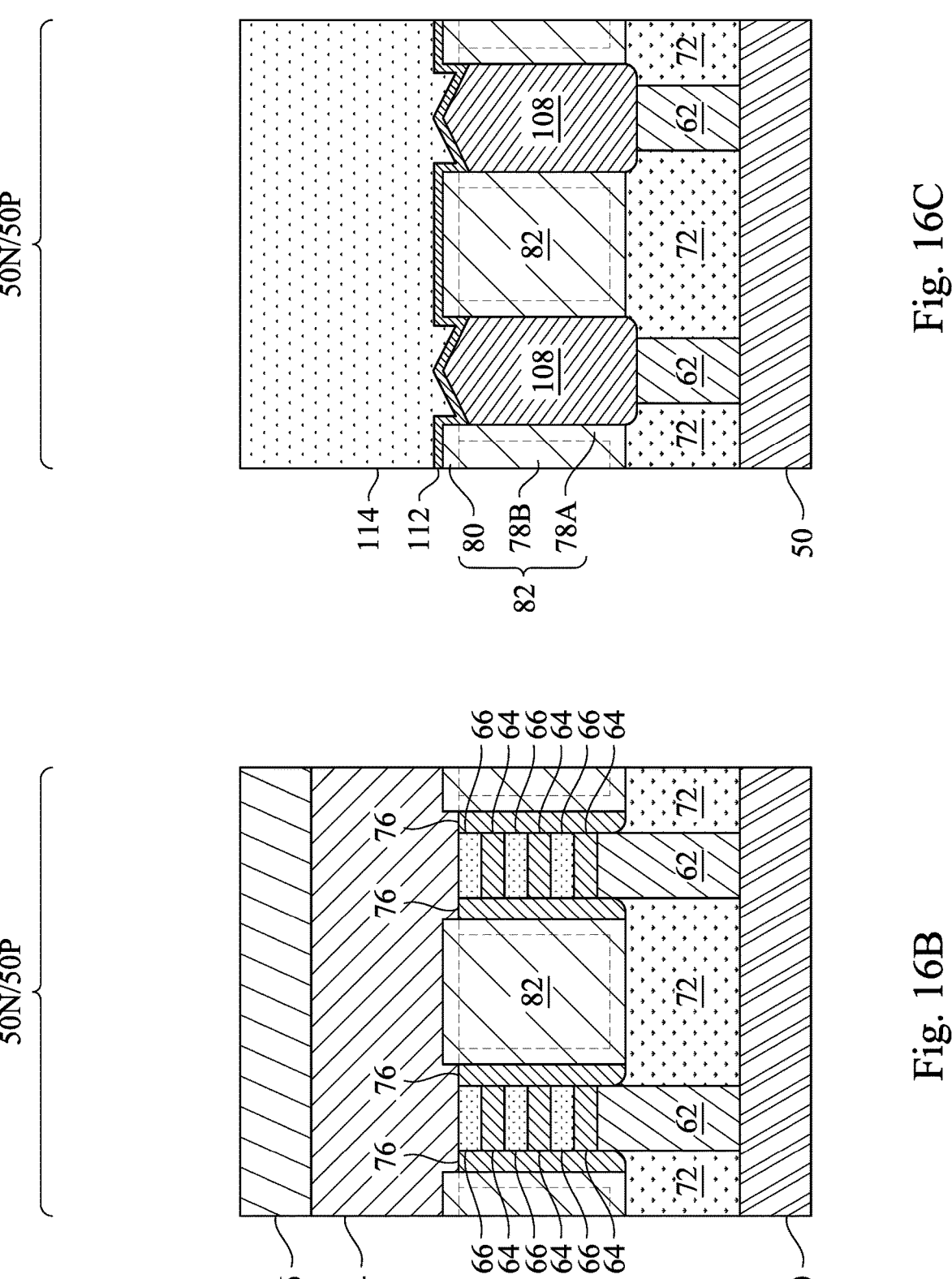

In FIGS. 16A-C, a removal process is performed to level the top surfaces of the first ILD 114 with the top surfaces of the masks 96 (if present) or the dummy gates 94. In some embodiments, a planarization process such as a chemical mechanical polish (CMP), an etch-back process, combinations thereof, or the like may be utilized. The planarization process may also remove the masks 96 on the dummy gates 94, and portions of the gate spacers 98 along sidewalls of the masks 96. After the planarization process, the top surfaces of the gate spacers 98, the first ILD 114, the CESL 112, and the masks 96 (if present) or the dummy gates 94 are coplanar (within process variations). Accordingly, the top surfaces of the masks 96 (if present) or the dummy gates 94 are exposed through the first ILD 114. In the illustrated embodiment, the masks 96 remain, and the planarization process levels the top surfaces of the first ILD 114 with the top surfaces of the masks 96.

Figure 17A:
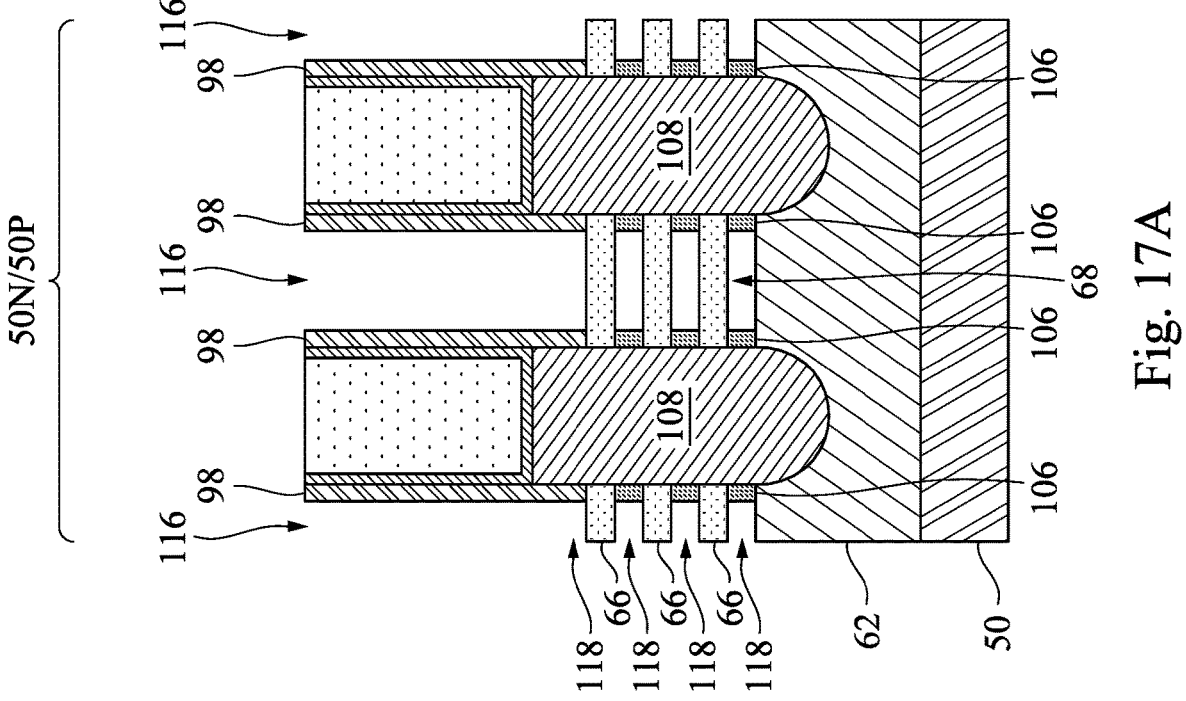
Figure 17C:
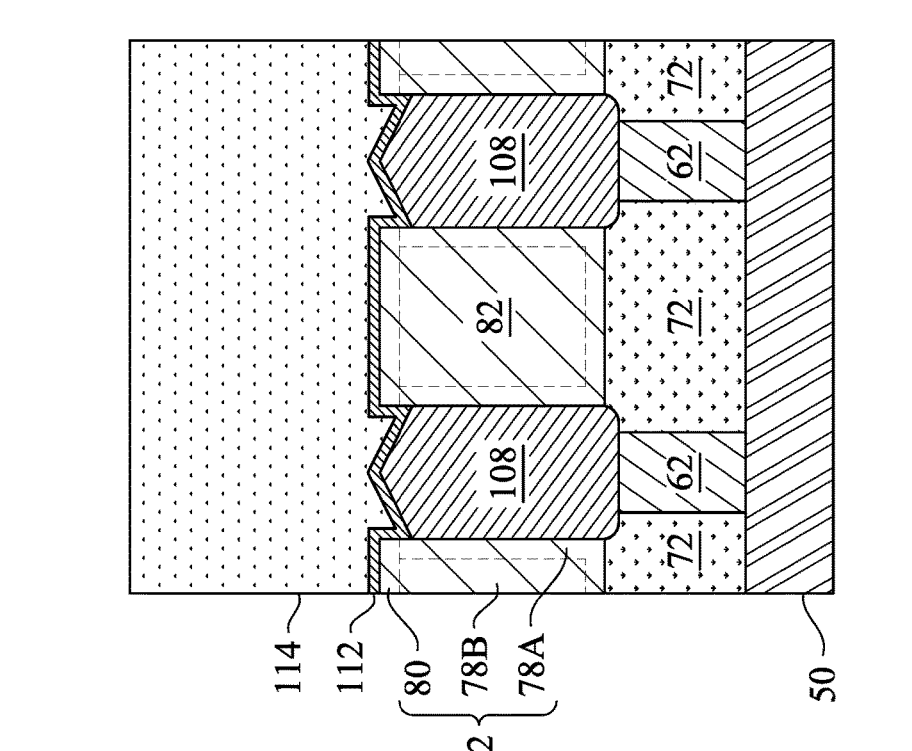
Figure 17B:
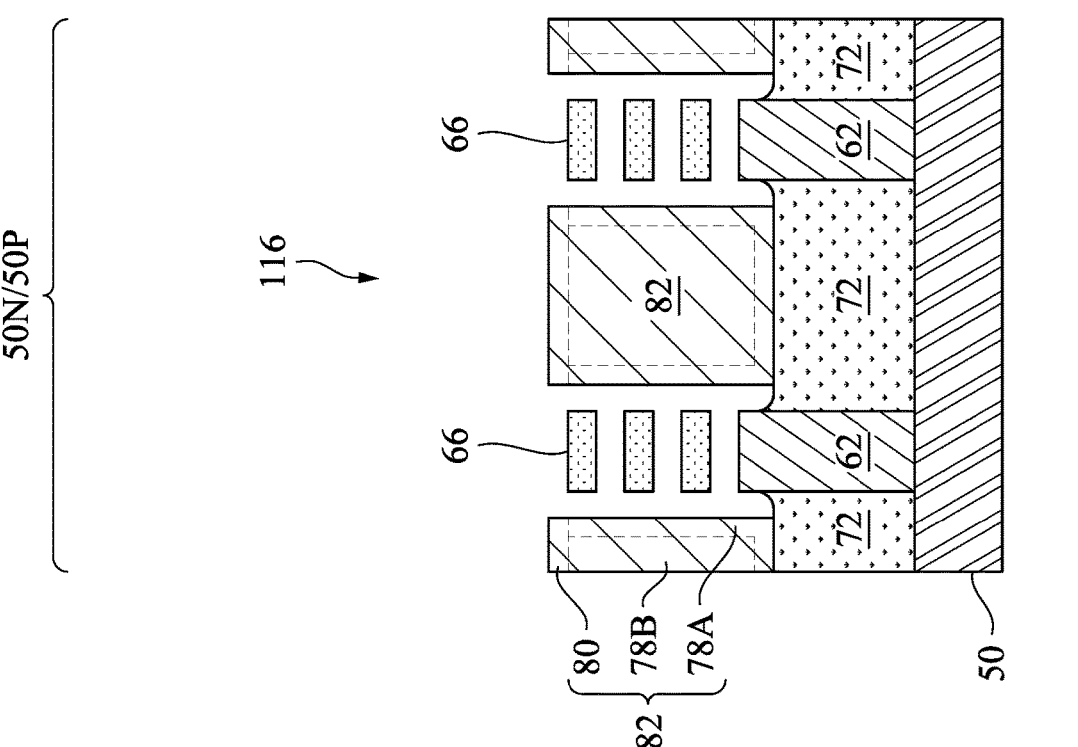

In FIGS. 17A-C, the masks 96 (if present) and the dummy gates 94 are removed in an etching process, so that recesses 116 are formed. In some embodiments, the dummy gates 94 are removed by an anisotropic dry etch process. For example, the etching process may include a dry etch process using reaction gas(es) that selectively etch the dummy gates 94 at a faster rate than the first ILD 114 or the gate spacers 98. Each recess 116 exposes and/or overlies portions of the channel regions 68. Portions of the nanostructures 66 which act as the channel regions 68 are disposed between adjacent pairs of the epitaxial source/drain regions 108.

The remaining portions of the nanostructures 64 are then removed to expand the recesses 116, such that openings are formed in regions between the nanostructures 66. The remaining portions of the sacrificial spacers 76 are also removed to expand the recesses 116, such that openings are formed in regions between semiconductor fins 62 and the insulating fins 82. The remaining portions of the nanostructures 64 and the sacrificial spacers 76 can be removed by any acceptable etching process that selectively etches the material(s) of the nanostructures 64 and the sacrificial spacers 76 at a faster rate than the material of the nanostructures 66. The etching may be isotropic. For example, when the nanostructures 64 and the sacrificial spacers 76 are formed of silicon germanium and the nanostructures 66 are formed of silicon, the etching process may be a wet etch using tetramethylammonium hydroxide (TMAH), ammonium hydroxide (NH₄OH), or the like. In some embodiments, a trim process (not separately illustrated) is performed to decrease the thicknesses of the exposed portions of the nanostructures 66.

Figure 18C:
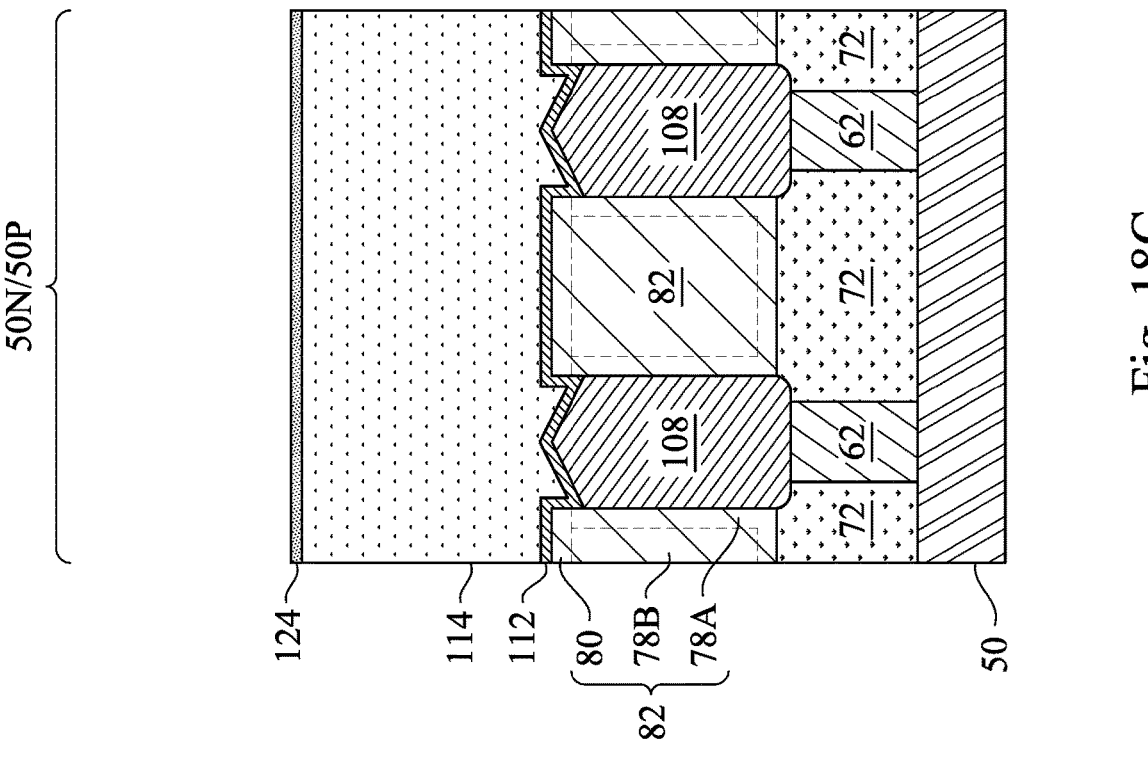
Figure 18A:
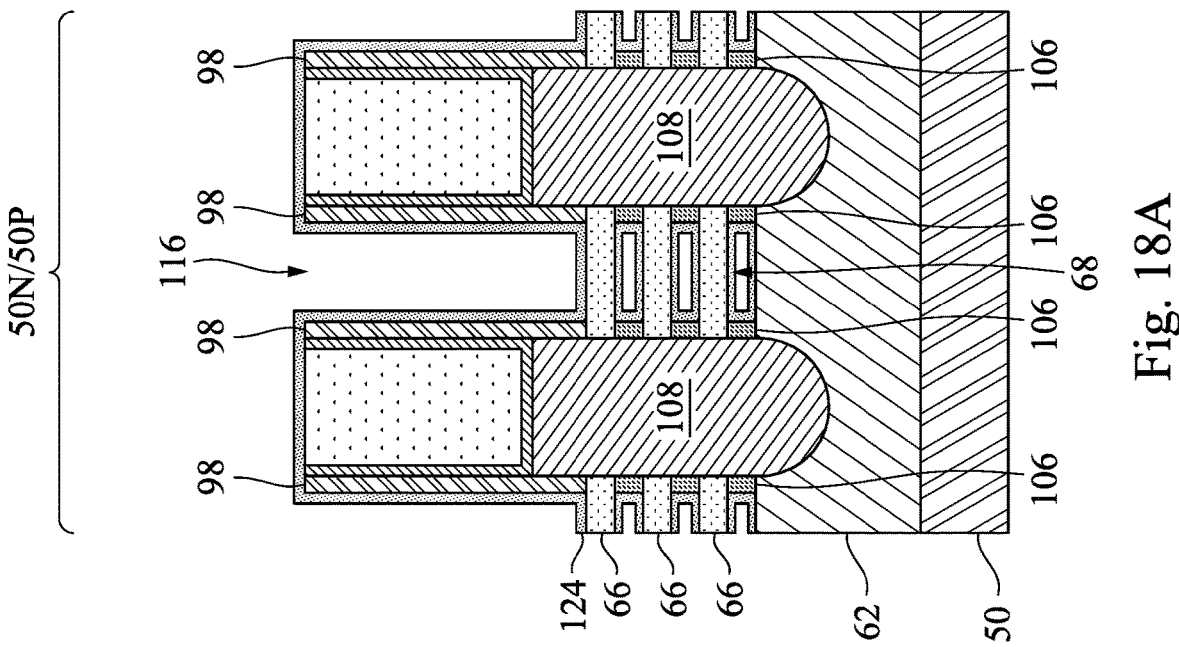
Figure 18B:
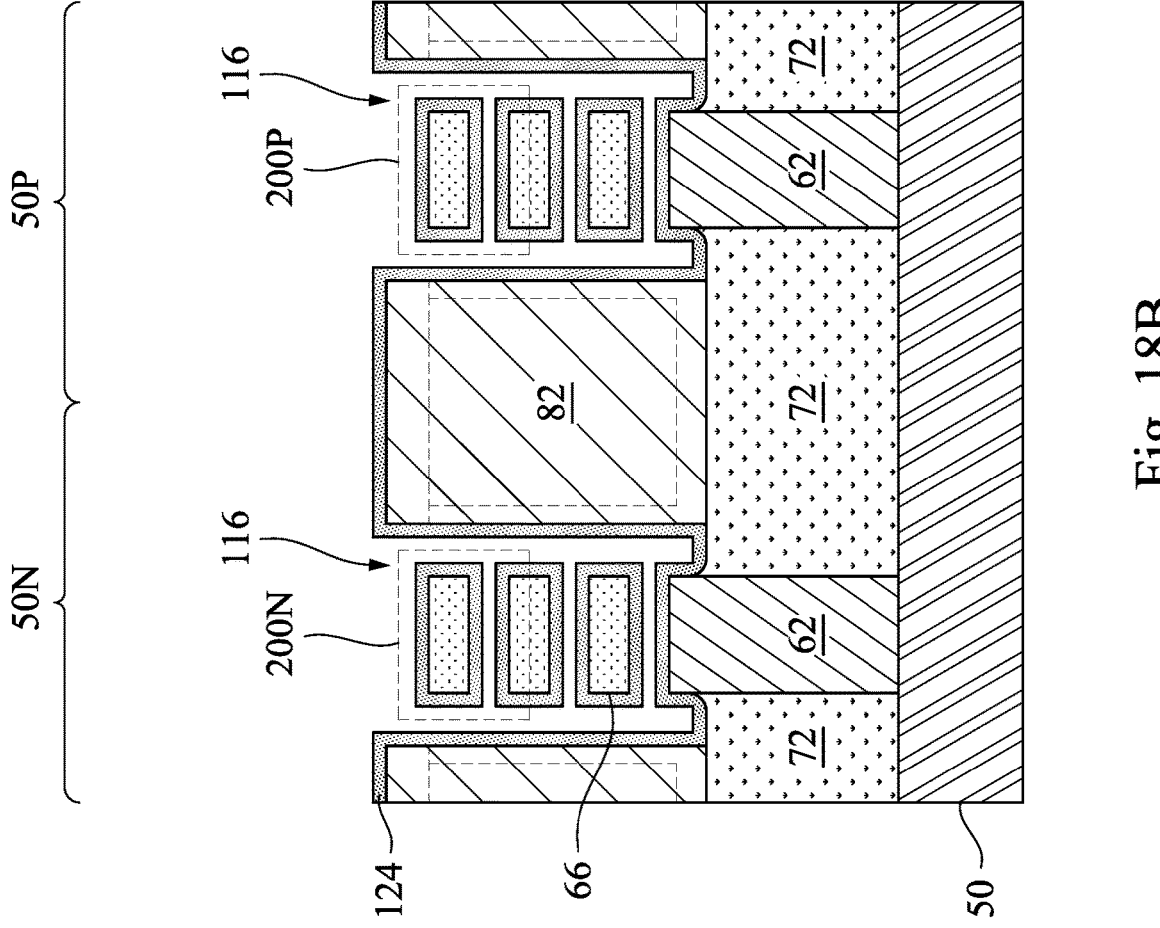
Figure 18E:
Figure 18E:
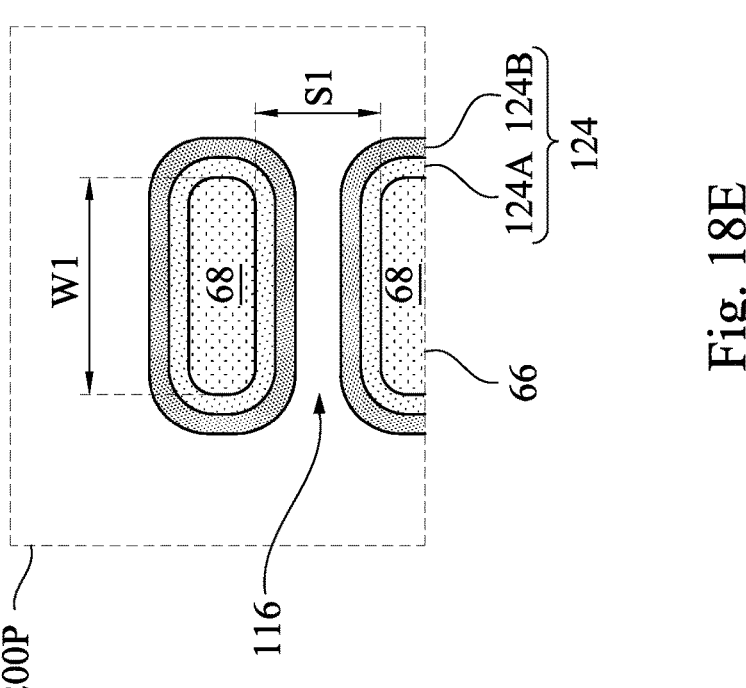
Figure 18D:
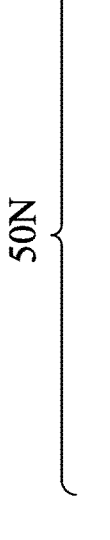
Figure 18D:
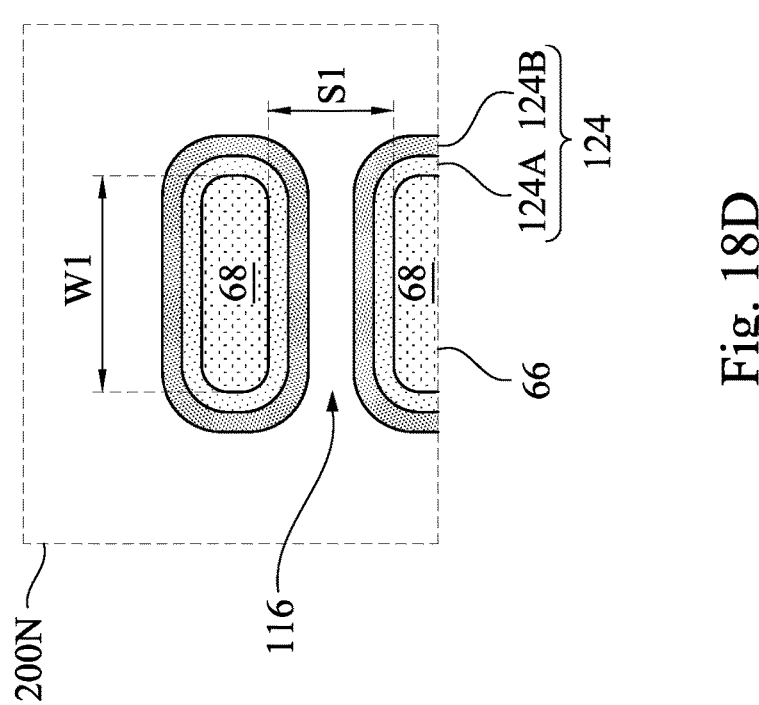
Figure 19A:
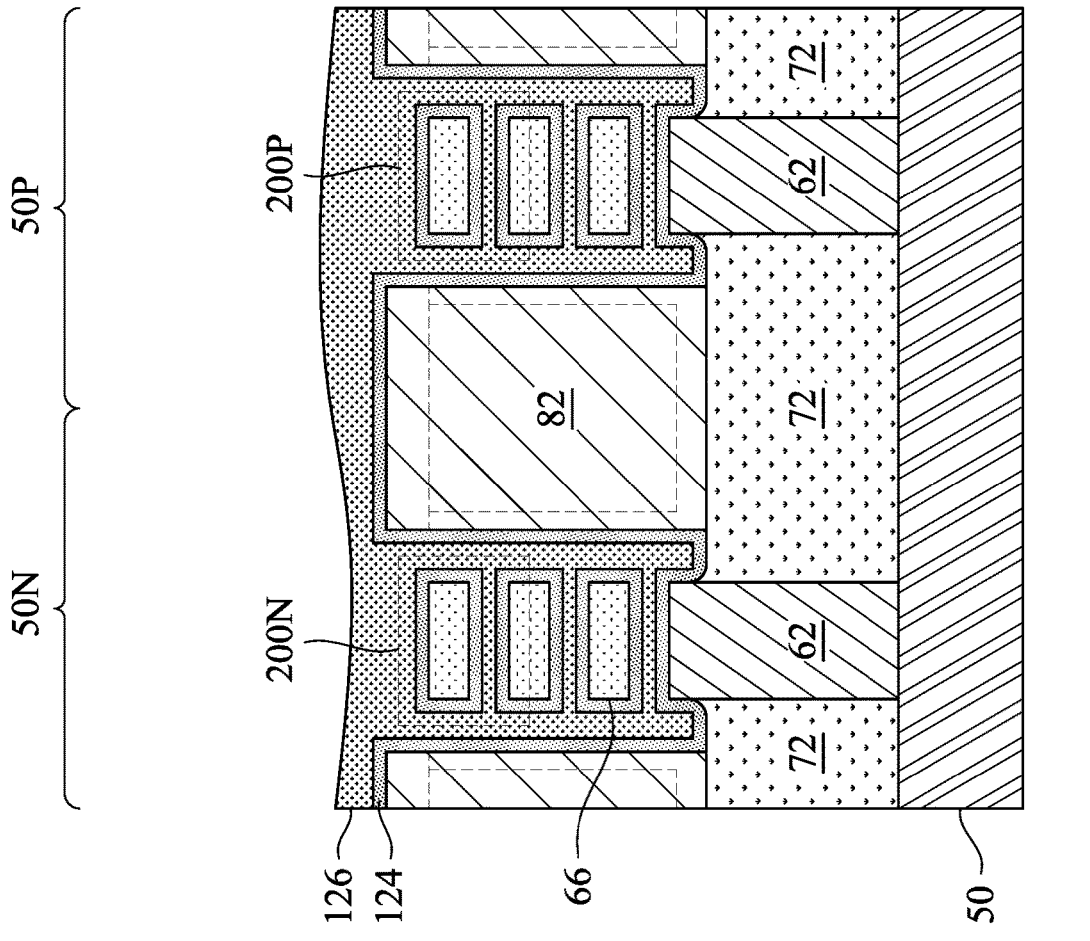
Figure 19C:
Figure 19C:
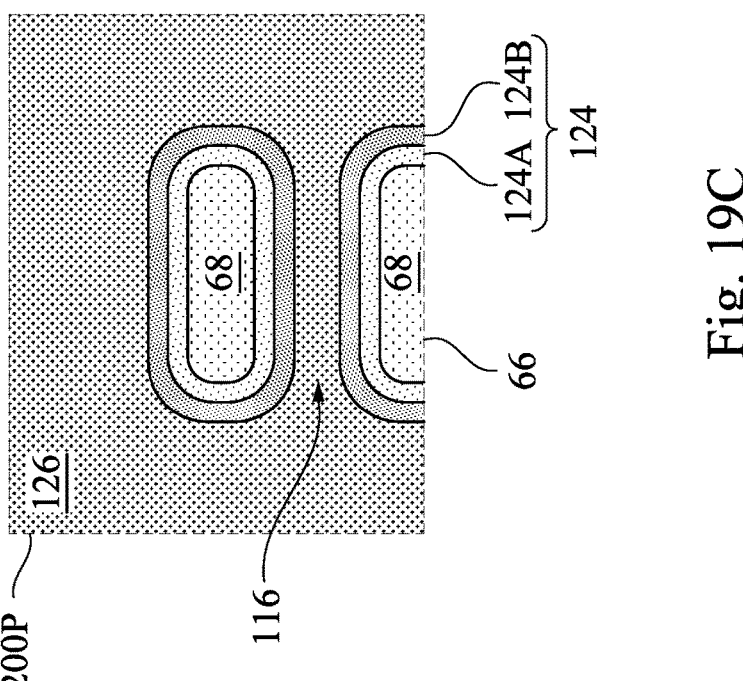
Figure 19B:
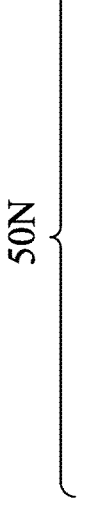
Figure 19B:
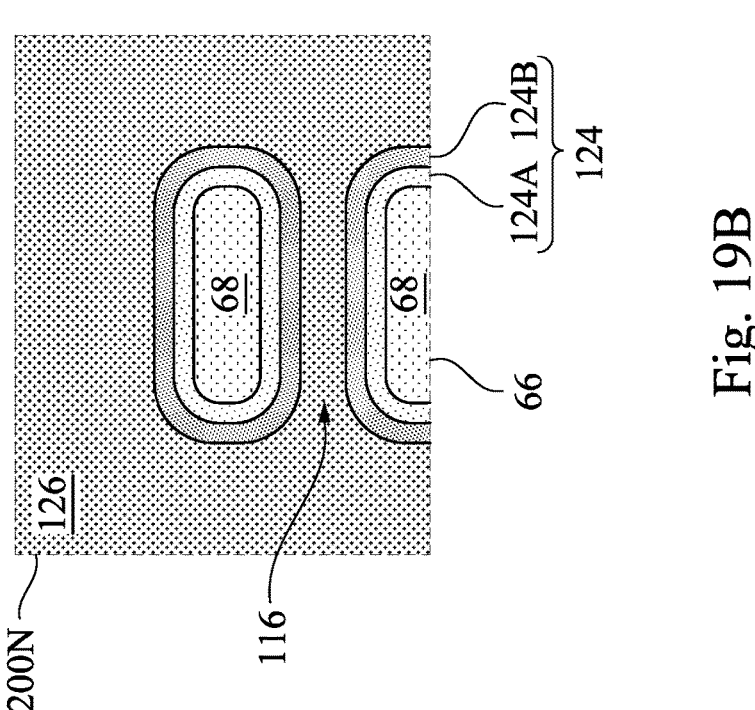

FIGS. 18A through 27C illustrate cross-sectional views of forming replacement gates in the recesses 116 in accordance with various embodiments. FIGS. 18A and 18C illustrate the formation of gate dielectrics in either the n-type region 50N or the p-type region 50P in the relevant cross-sections. FIGS. 19A, 20A, 21A, 22A, 23A, 24A, 25A, 26A, and 27A illustrate cross-sectional views of forming adjacent replacement gates in both the n-type region 50N and the p-type region 50P. Further, for improved clarity, FIGS. 18D, 19B, 20B, 21B, 22B, 23B, 24B, 25B, 26B, and 27B illustrate detailed cross-sectional views of a region 200N, which illustrates the filling of the recesses 116 between the nanostructures 64 in the n-type region 50N; and FIGS. 18E, 19C, 20C, 21C, 22C, 23C, 24C, 25C, 26C, and 27C illustrate detailed cross-sectional views of a region 200P, which illustrates the fillings of the recesses 116 between the nanostructures 65 in the p-type region 50P. In some embodiments, the n-type region 50N may be adjacent to the p-type region 50P with an insulating fin 82 separating the two regions.

In FIGS. 18A-E, a gate dielectric layer 124 is formed in the recesses 116. The gate dielectric layer 124 is deposited in the recesses 116 around the nanostructures 66 in both the first region (e.g., the n-type region 50N) and the second region (e.g., the p-type region 50P). The gate dielectric layer 124 may also be deposited on the top surfaces of the first ILD 114, the gate spacers 98 (see FIG. 18A), and the insulating fins 82. In the illustrated embodiment, the gate dielectric layer 124 is multilayered as illustrated in the detailed views of FIGS. 18D and 18E, including an interfacial layer 124A (or more generally, a first gate dielectric layer) and an overlying high-k dielectric layer 124B (or more generally, a second gate dielectric layer). The interfacial layer 124A may be formed of silicon oxide or the like and the high-k dielectric layer 124B may be formed of hafnium oxide, lanthanum oxide, or the like. The formation methods of the gate dielectric layer 124 may include molecular-beam deposition (MBD), ALD, PECVD, and the like. The gate dielectric layer 124 wraps around all (e.g., four) sides of the second nanostructures 66.

In some embodiments, the second nanostructures 66 have a width W1 in a range from 1 nm to 50 nm, such as a range from 15 nm to 25 nm. In some embodiments, adjacent second nanostructures 66 are spaced apart by a spacing S1 in a range from 0.1 nm to 40 nm, such as a range from 3 nm to 8 nm. If the spacing S1 is higher than 40 nm, a seam or void may be formed between adjacent second nanostructures 66 after the subsequent formation of the gate structures. If the spacing S1 is lower than 0.1 nm, the adjacent second nanostructures 66 could easily short to each other.

In FIGS. 19A-C and 20A-C, a sacrificial layer 126 is deposited on the gate dielectric layer 124 in a first region (e.g., the n-type region 50N) and a second region (e.g., the p-type region 50P). The sacrificial layer 126 may further be deposited over the insulating fin 82. As will be subsequently described in greater detail, the sacrificial layer 126 will be patterned to remove portions of the sacrificial layer 126 in the first region (e.g., the n-type region 50N) while leaving portions of the sacrificial layer 126 in the second region (e.g., the p-type region 50P). Specifically, the sacrificial layer 126 may remain between the nanostructures 66 in the p-type region 50P, and the sacrificial layer 126 is used to ease the removal of work function tuning layers from the second region (e.g., the p-type region 50P) by blocking the formation of the work function tuning layers to between the second nanostructures 66 in the second region (e.g., the p-type region 50P). It has been observed that the material of the sacrificial layer 126 is easier to remove from between the nanostructures 66 than the work function tuning layers.

The sacrificial layer 126 includes any acceptable material that can be formed on and removed from between second nanostructures 66. For example, the sacrificial layer 126 is formed of $SiNO_x$, or the like. The sacrificial layer 126 may be deposited using a non-conformal deposition process (e.g., a flowable CVD process), which provides improved bottom-up growth profile and allows the sacrificial layer 126 to be formed free of any seams or voids, thereby reducing manufacturing defects. As example of the flowable CVD process, first in FIGS. 18A-C, precursors are flowed in the recesses 116 in the respective flow windows of each precursor. For example, in embodiments where the sacrificial layer 126 comprises $SiNO_x$, the precursors flowed may include a first precursor that is a silane-based precursor (e.g., silane, trisilylamine, or the like), a second precursor that is a nitrogen-based precursor (e.g., $N_2$, $NH_3$, combinations thereof, or the like), and an oxidant (e.g., $H_2O$, $O_2$, $O_3$, combinations thereof, or the like). Initially, the precursors may be mixed within their own respective flow windows. For example, when the precursors are the silane-based precusor, the nitrogen-based precursor, and the oxidant, the flow windows of each precursor during the initial stage may be 500 sccm to 750 sccm, 300 sccm to 600 sccm, and 50 sccm to 400 sccm, respectively. The precursors may be mixed at a pressure in a range of 0.5 Torr to 1 Torr and at a temperature in a range of 30° C. to 200° C., for example. By initially mixing the precursors in the above parameters, the sacrificial layer 126 may be deposited in a flowable state to achieve improved gap filling of the recesses 116 with a bottom-up profile and free of seams and voids.

Figure 20A:
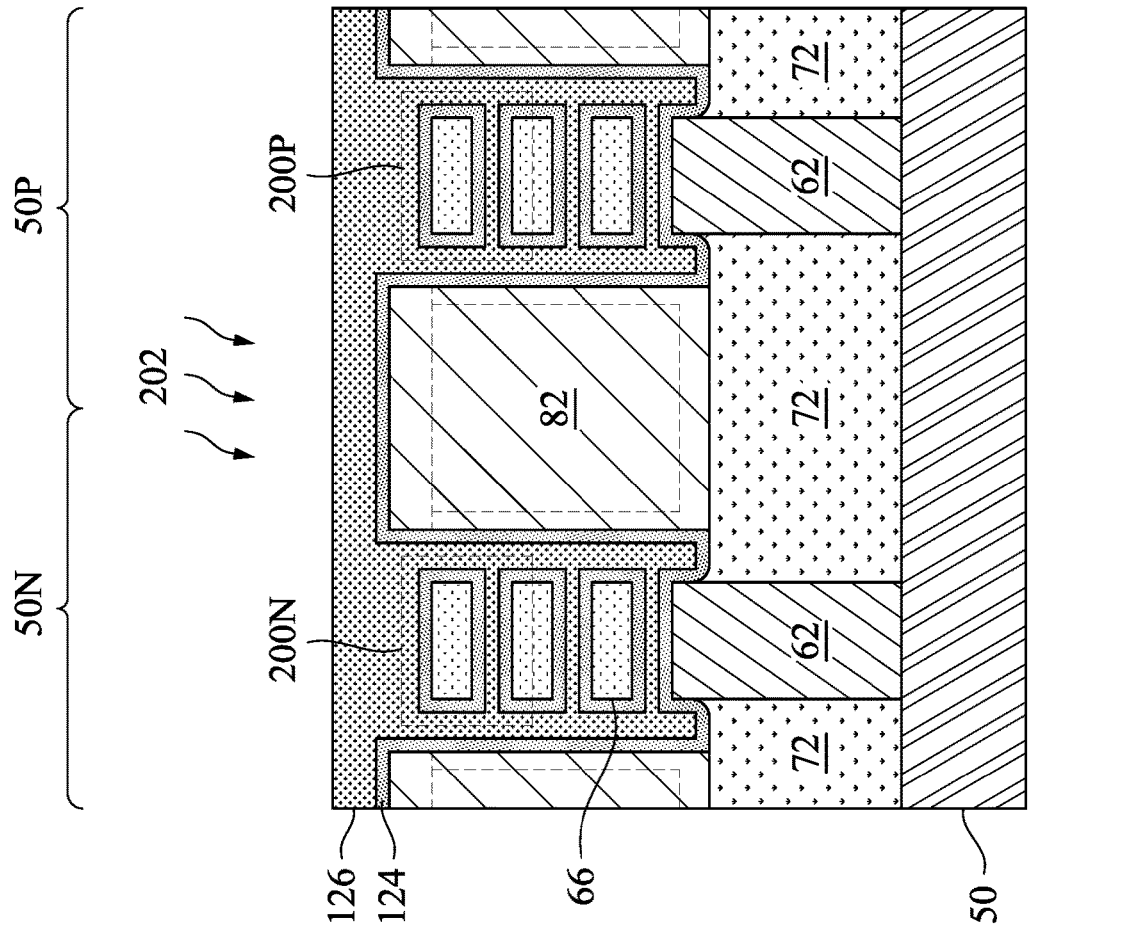
Figure 20C:
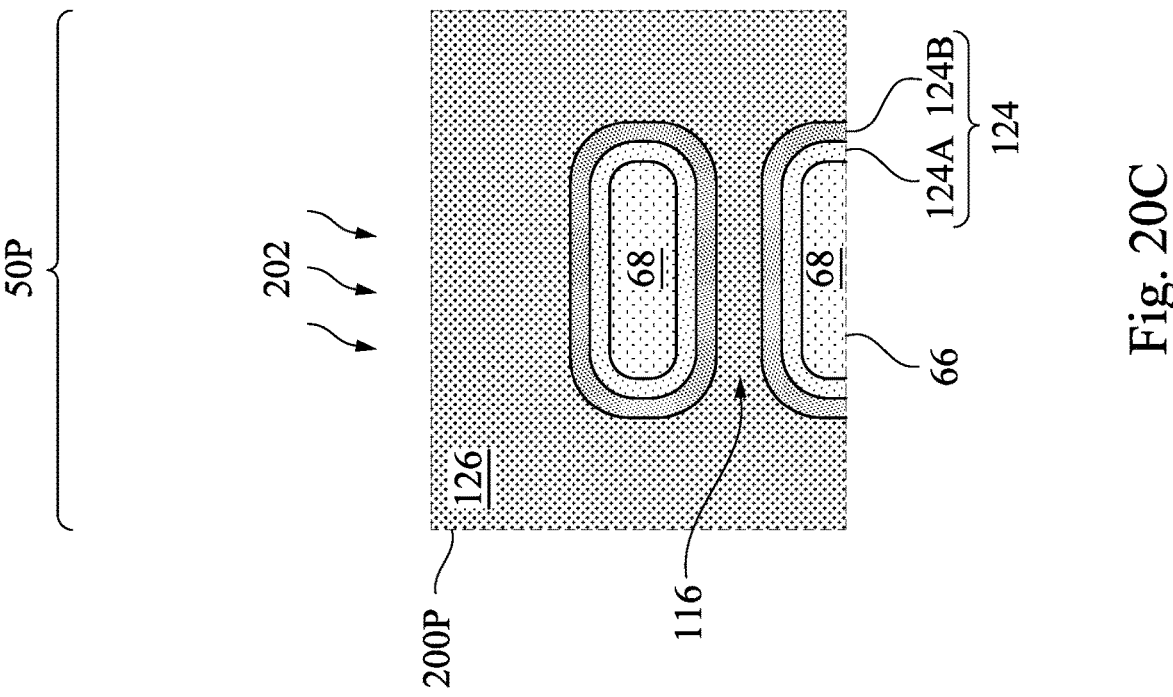
Figure 20B:
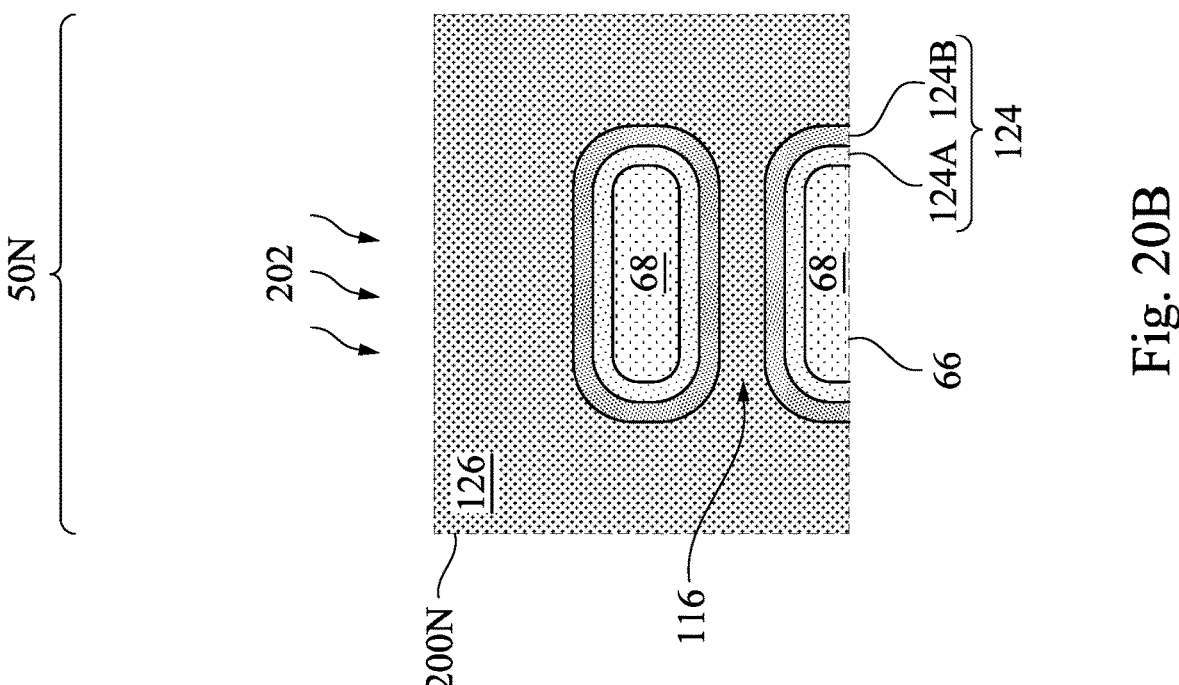
Figure 21A:
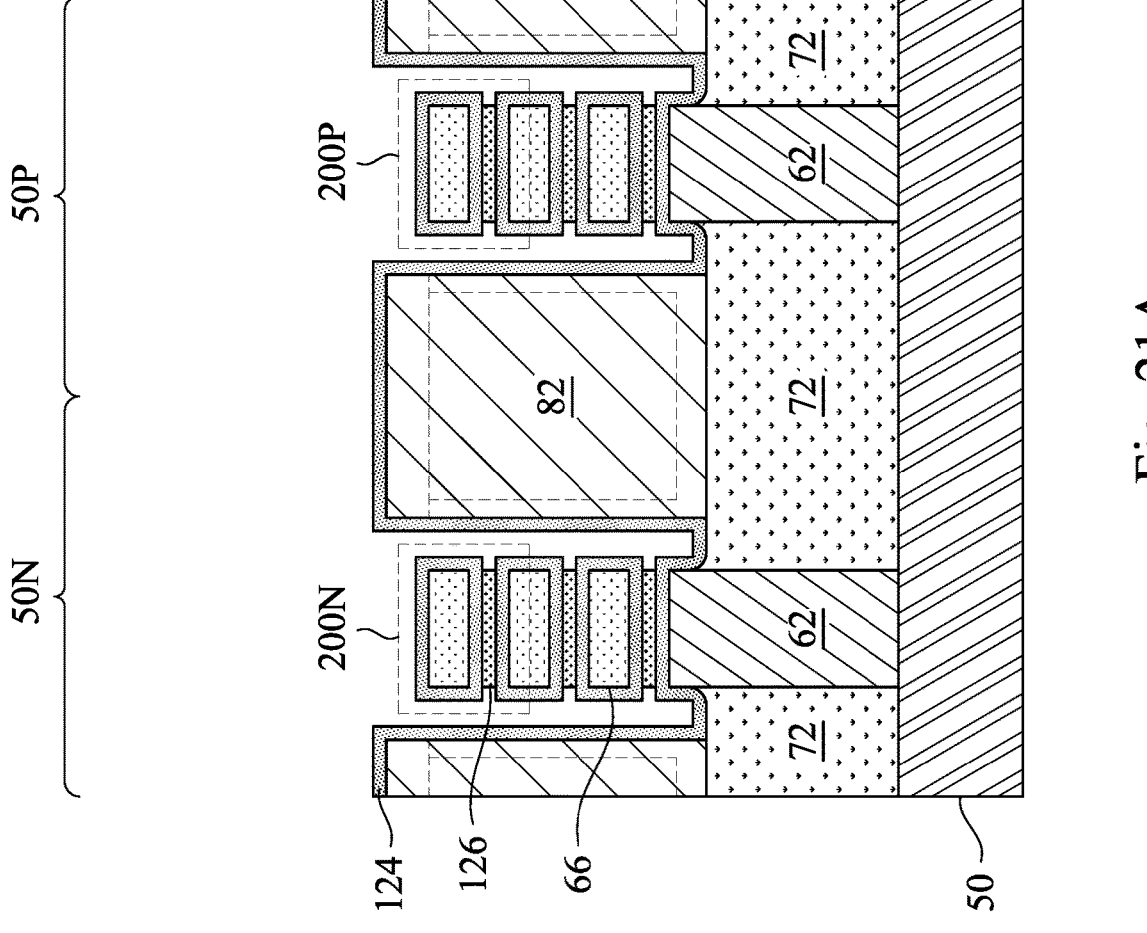
Figure 21C:
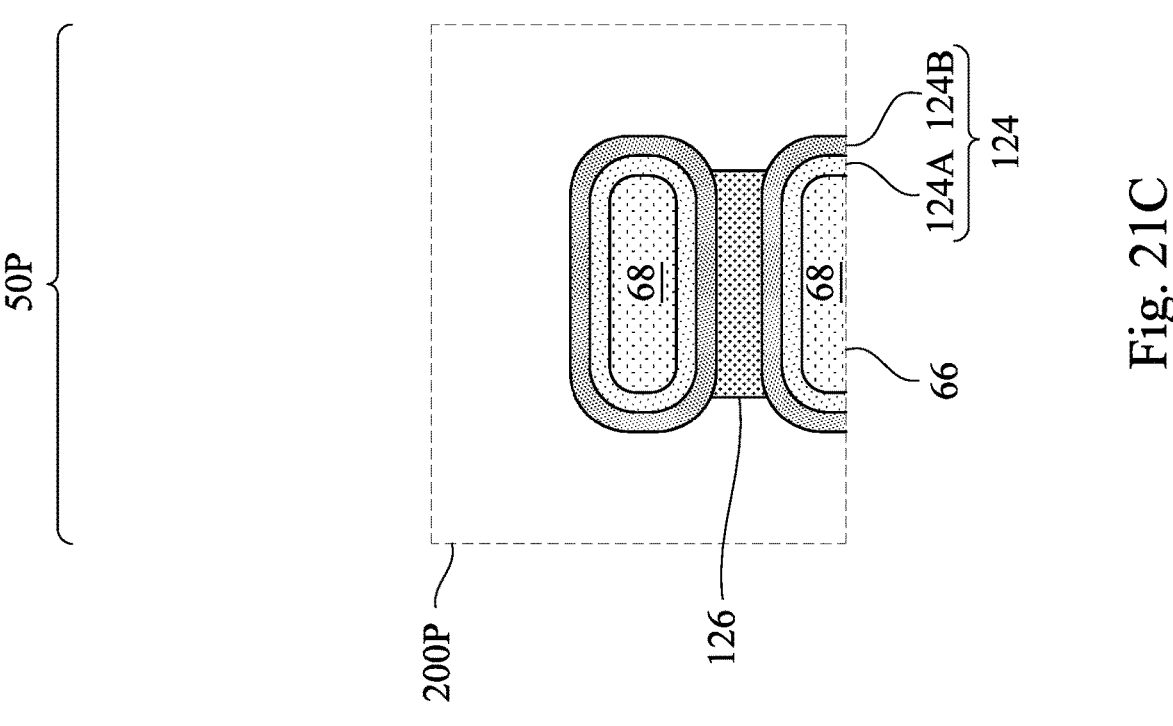
Figure 21B:
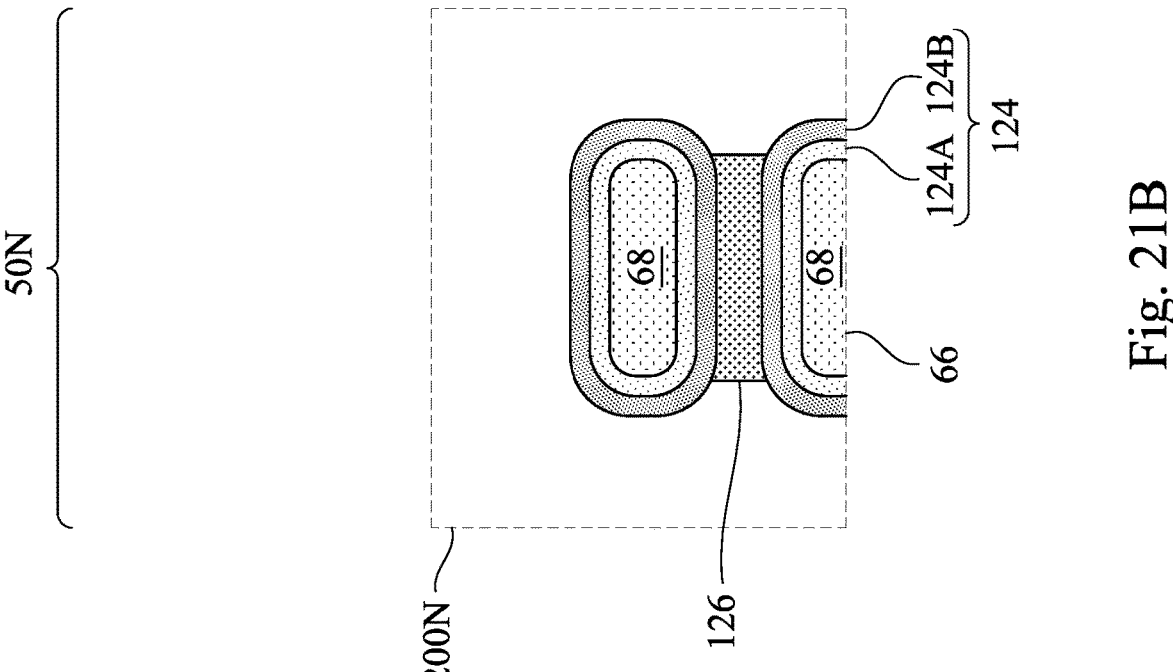

After the sacrificial layer 126 is deposited in the flowable state, a hardening process 202 may be performed as illustrated by FIGS. 20A-C. The hardening process 202 may include an oxidizing treatment using a mixture of ozone and oxygen. In some embodiments, a ratio of the ozone to oxygen may be in a range of 1:10 to 10:1. It has been observed that by adjusting the ozone to oxygen ratio to be within the above range, a desired flowability and insulation can be obtained in the sacrificial layer 126. Further, the ozone/oxygen mixture treatment may be performed at a pressure in a range of 100 Torr to 600 Torr and at a temperature of 50° C. to 250° C. Subsequently, a cure with ultraviolet (UV) light may be performed to fully cure the sacrificial layer 126. The UV cure may be performed at a wavelength in a range of 100 nm to 400 nm and at a temperature in a range of 25° C. to 150° C. It has been observed that by performing the UV cure in the above wavelengths and at the above temperature range, a desired material quality (hardness, stress, and insulation) can be achieved in the sacrificial layer 126.

In FIGS. 20A-C, portions of the sacrificial layer 126 are removed from the first region (e.g., the n-type region 50N) and the second region (e.g., the p-type region 50P). The removal may be by acceptable etching techniques. The etching may include any acceptable etch process, such as a reactive ion etch (RIE), neutral beam etch (NBE), the like, or a combination thereof. The etching may be anisotropic, and the etching may be selective to the material of the gate dielectric layer 124 (e.g., etches the sacrificial layer 126 at a higher rate than an outermost gate dielectric layer 124, such as the high-k dielectric layer 124B). As illustrated in FIGS. 20A-C, the removal of portions of sacrificial layer 126 removes outer portions of the sacrificial layer 126 to expose the gate dielectric layer 124 but leaves the sacrificial layer 126 between vertically adjacent ones of the nanostructures 66 and extending between the nanostructures 66 and the fins 62 in both the first and second regions 50N and 50P.

This removal of outer portions of the sacrificial layer 126 while leaving inner portions may be referred to as a trimming process.

After the removal of portions of the sacrificial layer 126, the gate dielectric layer 124 remains over and covers isolations regions 70 (see, e.g., FIG. 13A). These portions of gate dielectric layer 124 can help to protect the isolation regions 70 from damage from subsequent deposition and removal processes.

Figure 22A:
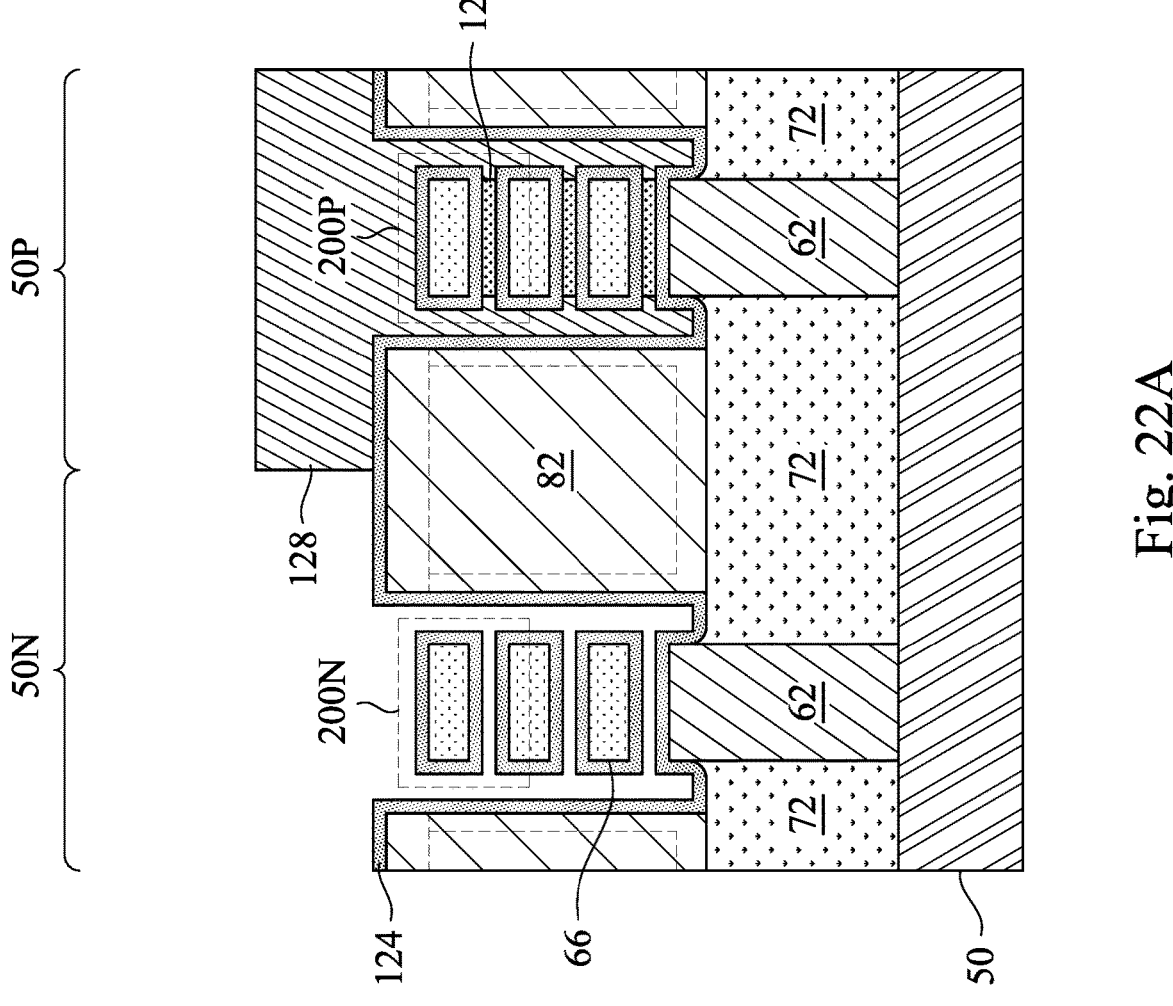
Figure 22C:
Figure 22C:
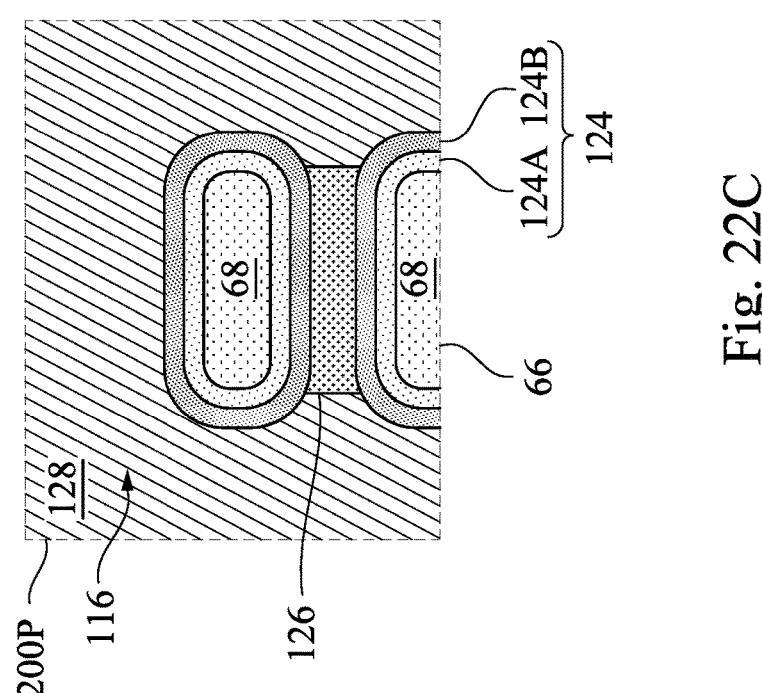
Figure 22B:
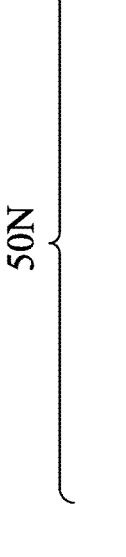
Figure 22B:
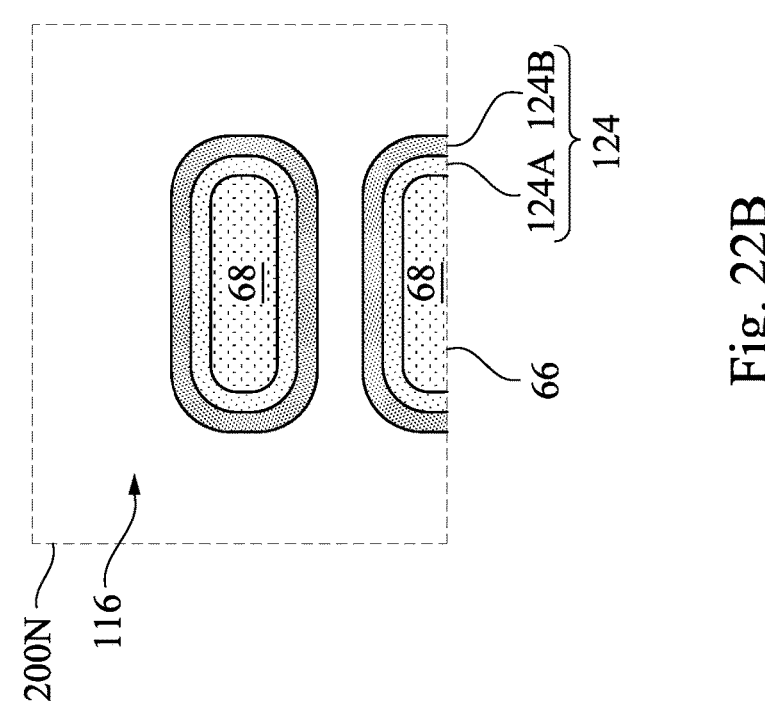

In FIGS. 22A-C, a first mask layer 128 is formed in the recesses 116 over the sacrificial layer 126 and the insulating fin 82 in the second region (e.g., the p-type regions 50P). The first mask layer 128 may be initially deposited in both the first and second regions 50N and 50P by spin-on-coating or the like. The first mask layer 128 may include a polymer material, such as poly(methyl)acrylate, poly(maleimide), novolacs, poly(ether)s, combinations thereof, or the like. In some embodiments, the first mask layer 128 may be a bottom anti-reflective coating (BARC) material.

After deposition, the first mask layer 128 is patterned to remove the first mask layer 128 from the first region (e.g., the n-type region 50N). The first mask layer 128 may be patterned by a lithography process, an etching process such as an isotropic or an anisotropic etching process, or the like. Patterning the first mask layer 128 may expose the sacrificial layer 126 in the first region (e.g., the n-type region 50N). After patterning the first mask layer 128, the sacrificial layer 126 is removed from the first region (e.g., the n-type region 50N) using the first mask layer 128 as a mask. The removal may be by acceptable etching techniques. The etching may include any acceptable etch process, such as a RIE, NBE, a wet etch, the like, or a combination thereof. The etching may be anisotropic or isotropic.

Figure 23A:
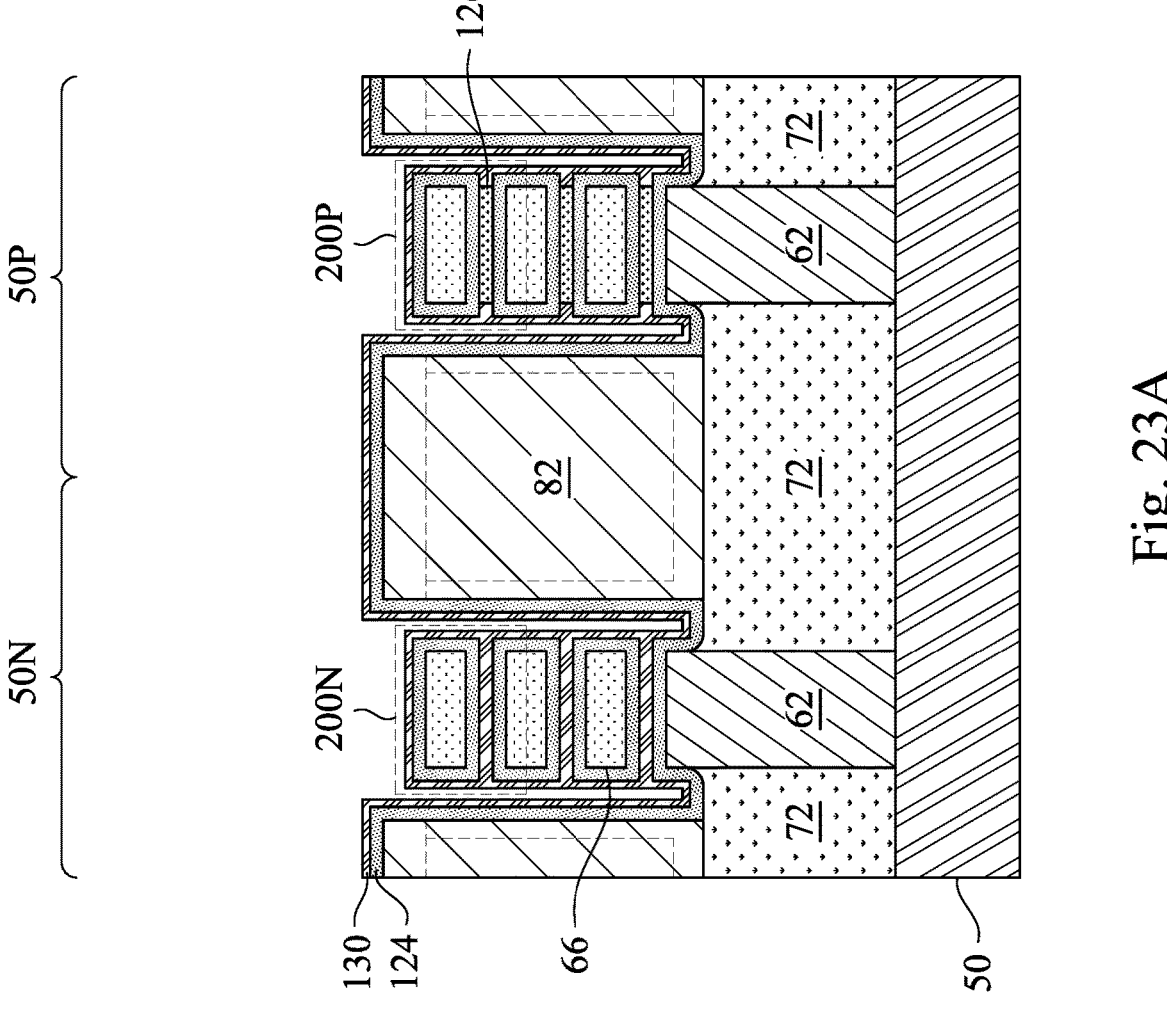
Figure 23C:
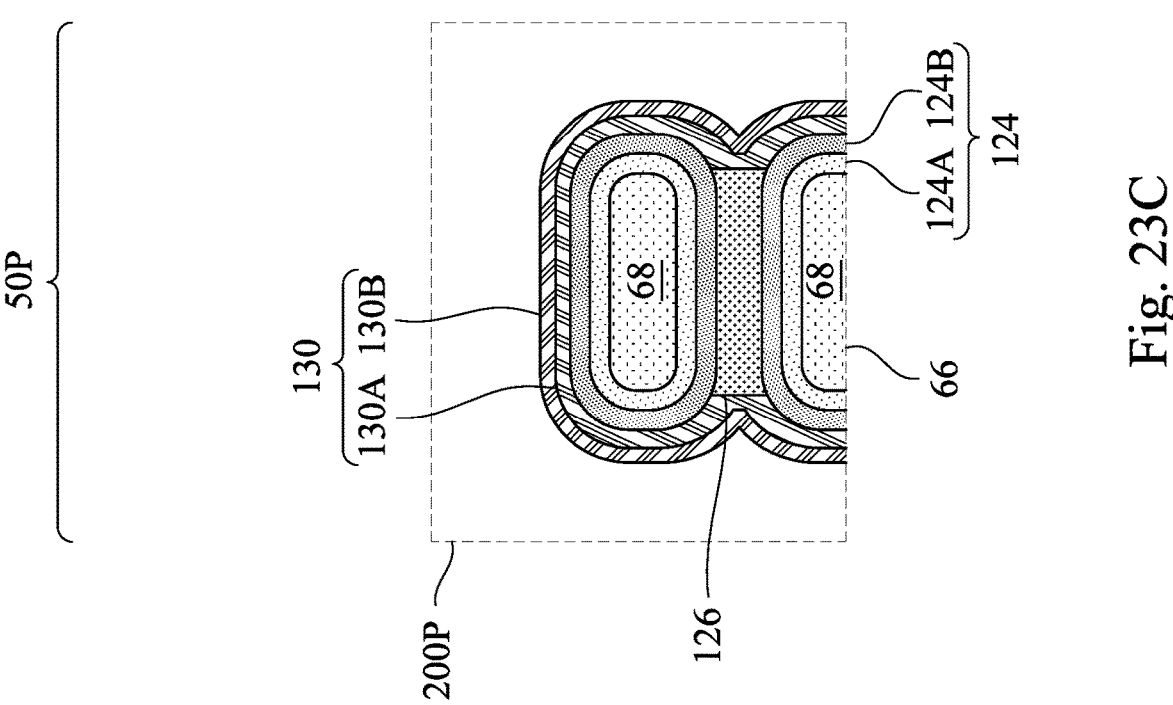
Figure 23B:
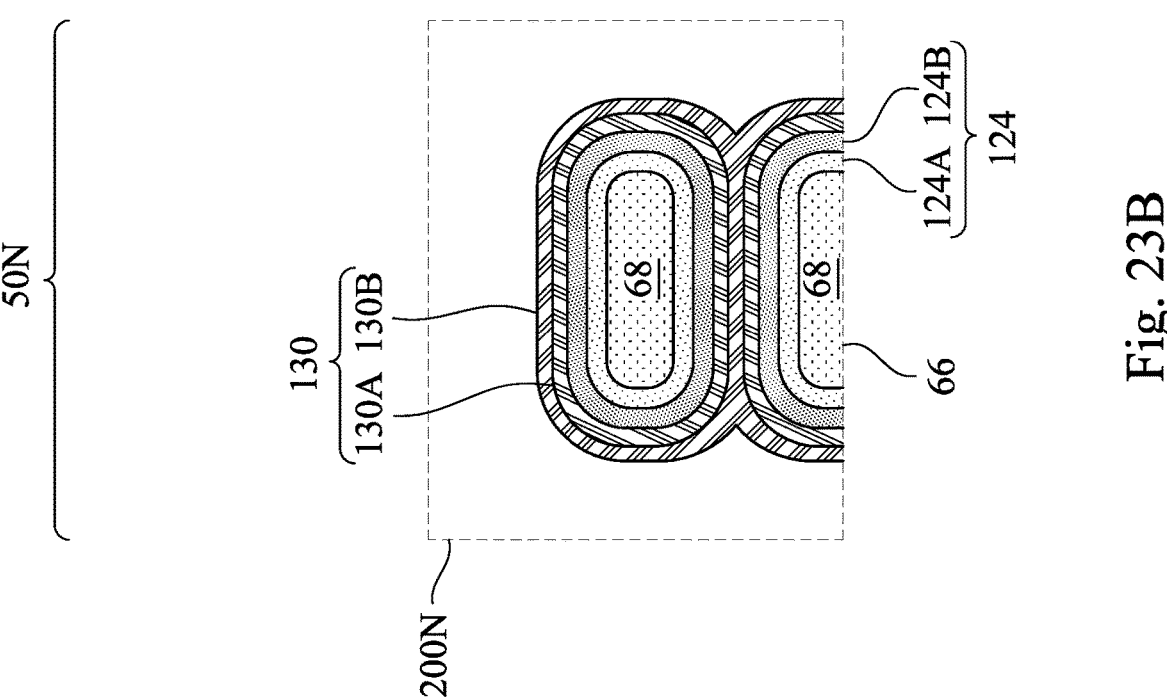

In FIGS. 23A-C, the first mask layer 128 is patterned to remove remaining portions of the first mask layer 128, such as portion of the first mask layer 128 in the second region (e.g., the p-type region 50P). The first mask layer 128 may be removed by plasma ashing, an etching process such as an isotropic or an anisotropic etching process, or the like.

As also illustrated in FIGS. 23A-C, gate electrode layers 130 is deposited on the gate dielectric layer 124 around the nanostructures 66 in the first region (e.g., the n-type region 50N) and on the gate dielectric layer 124 and the sacrificial layer 126 in the second region (e.g., the p-type region 50P). The gate electrode layers 130 may further be deposited over and along sidewalls of the insulating fin 82. As will be subsequently described in greater detail, the gate electrode layers 130 will be patterned to remove portions of the gate electrode layers 130 in the second region (e.g., the p-type region 50P) while leaving portions of gate electrode layers 130 in the first region (e.g., the n-type region 50N). The presence of the sacrificial layer 126 in the second region (e.g., the p-type region 50P) may block the deposition of the gate electrode layers 130 from between vertically adjacent nanostructures 66 in the second region. As a result, the gate electrode layers 130 may be more readily removed from the second region (e.g., the p-type region 50P) in subsequent processing steps, and manufacturing defects can be reduced.

The gate electrode layers 130 may include a work function tuning layer 130A and a glue layer 130B as illustrated in the detailed view of FIGS. 23B-C. The work function tuning layer 130A be referred to as "n-type work function tuning layer(s)" when it is removed from the second region (e.g., the p-type region 50P). The work function tuning layer 130A includes any acceptable material to tune a work function of a device to a desired amount given the application of the device to be formed, and may be deposited using any acceptable deposition process. For example, the work function tuning layer 130A provide a n-type work function tuning layer, and be formed of any combination of n-type work function metals (NWFM) such as titanium aluminum (TiAl), titanium aluminum carbide (TiAlC), TiAlC:N, titanium aluminum nitride (TiAlN), tantalum silicon aluminum (TaSiAl), $WCl_5$, $SnCl_4$, $NbCl_5$, $MoCl_4$, combinations thereof, or the like, which may be deposited by ALD, CVD, PVD, or the like. Although the work function tuning layer 130A is shown as being a single layer structure, the work function tuning layer 130A may have a multilayered structure in other embodiments.

The gate electrode layers 130 further include a glue layer 130B formed on the work function tuning layer 130 in the first region (e.g., the n-type region 50N) and the second region (e.g., the p-type region 50P). The glue layer 130B may merge between adjacent second nanostructures 66 in the first region 50N in the illustrated cross-section. The glue layer 130B includes any acceptable material to promote adhesion and prevent diffusion. For example, the glue layer 130B may be formed of a metal or metal nitride such as titanium nitride, titanium aluminum carbide, tantalum aluminum carbide, silicon-doped tantalum aluminide, or the like, which may be deposited by ALD, CVD, PVD, or the like. In a specific embodiment, the work function tuning layer 130A comprises TiAl, and the glue layer 130B comprises TiN.

Figure 24A:
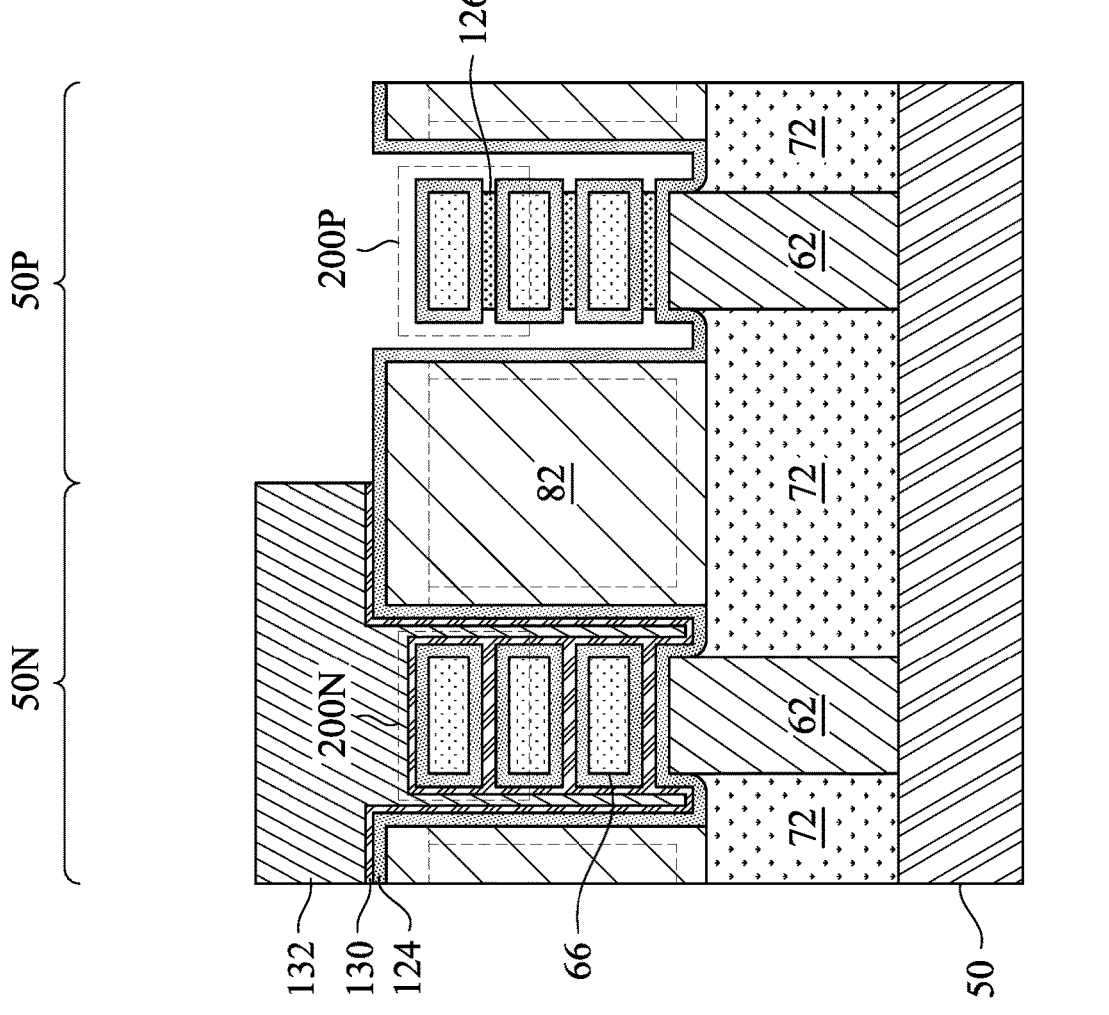
Figure 24C:
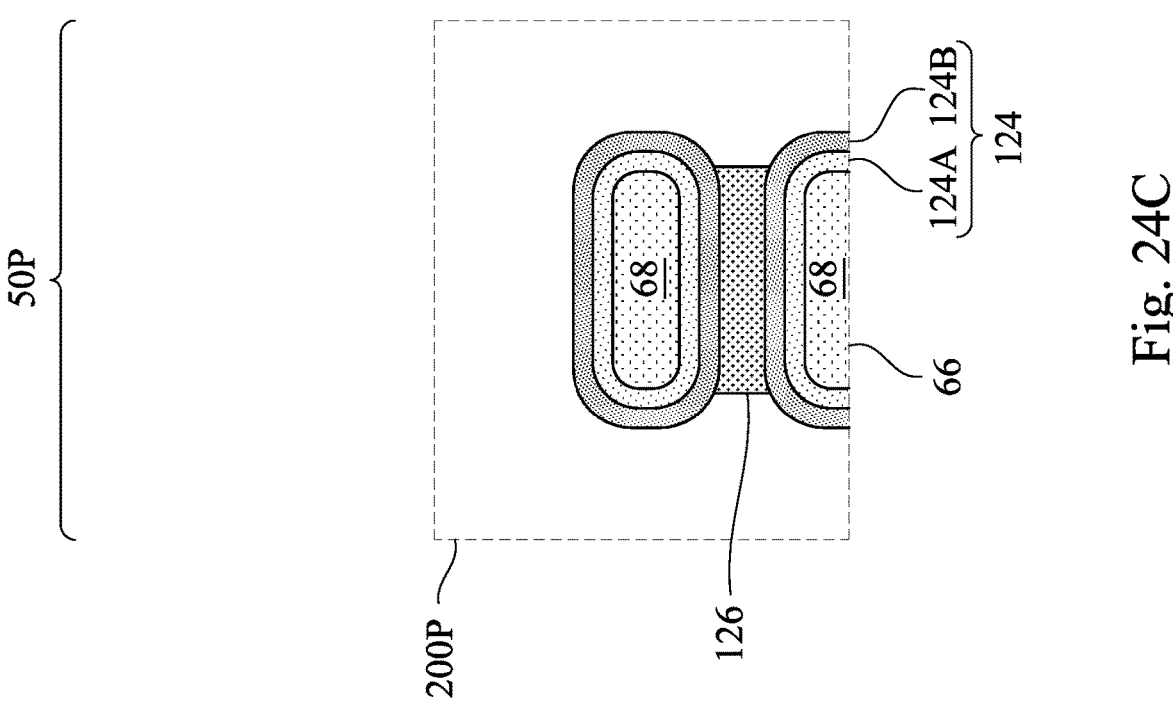
Figure 24B:
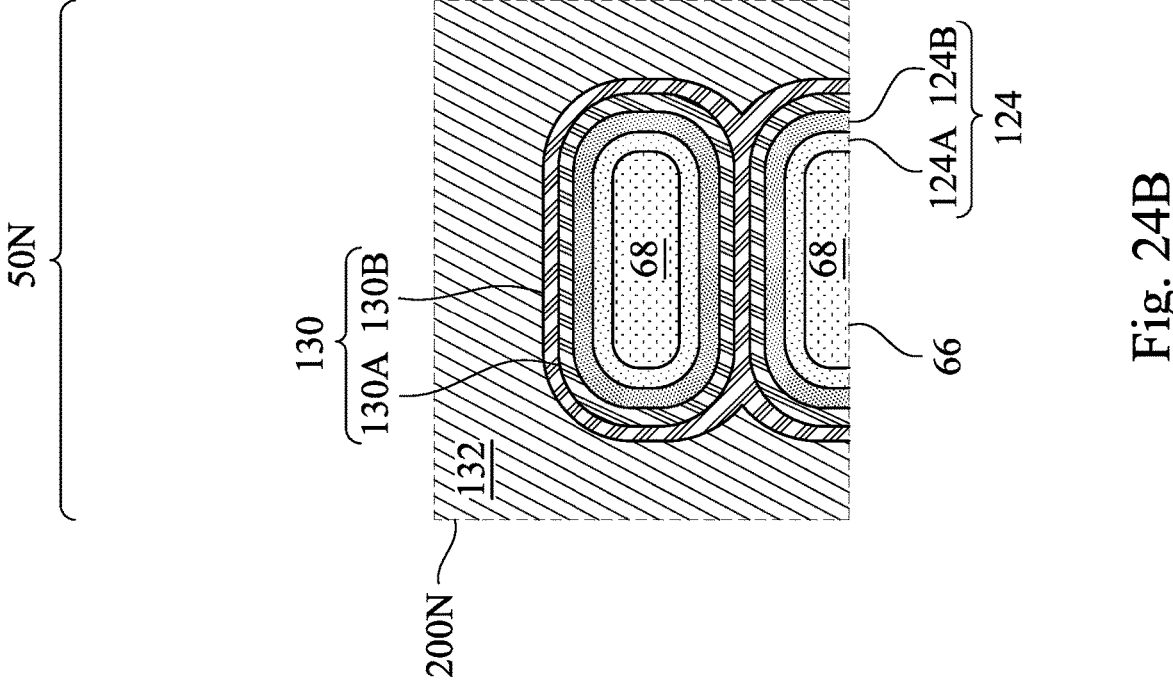

In FIGS. 24A-C, a second mask layer 132 is formed in the second recesses 116 over the glue layer 130B in the first and second regions 50N and 50P. The second mask layer 132 may be similar to the first mask layer 128 described above and the description is not repeated herein. As illustrated in FIGS. 24A-C, the second mask layer 132 is patterned to remove the second mask layer 132 from the recesses 116 in the second region (e.g., the p-type region 50P). The second mask layer 132 may be removed by lithography, an etching process such as an isotropic or an anisotropic etching process, or the like.

Figure 25A:
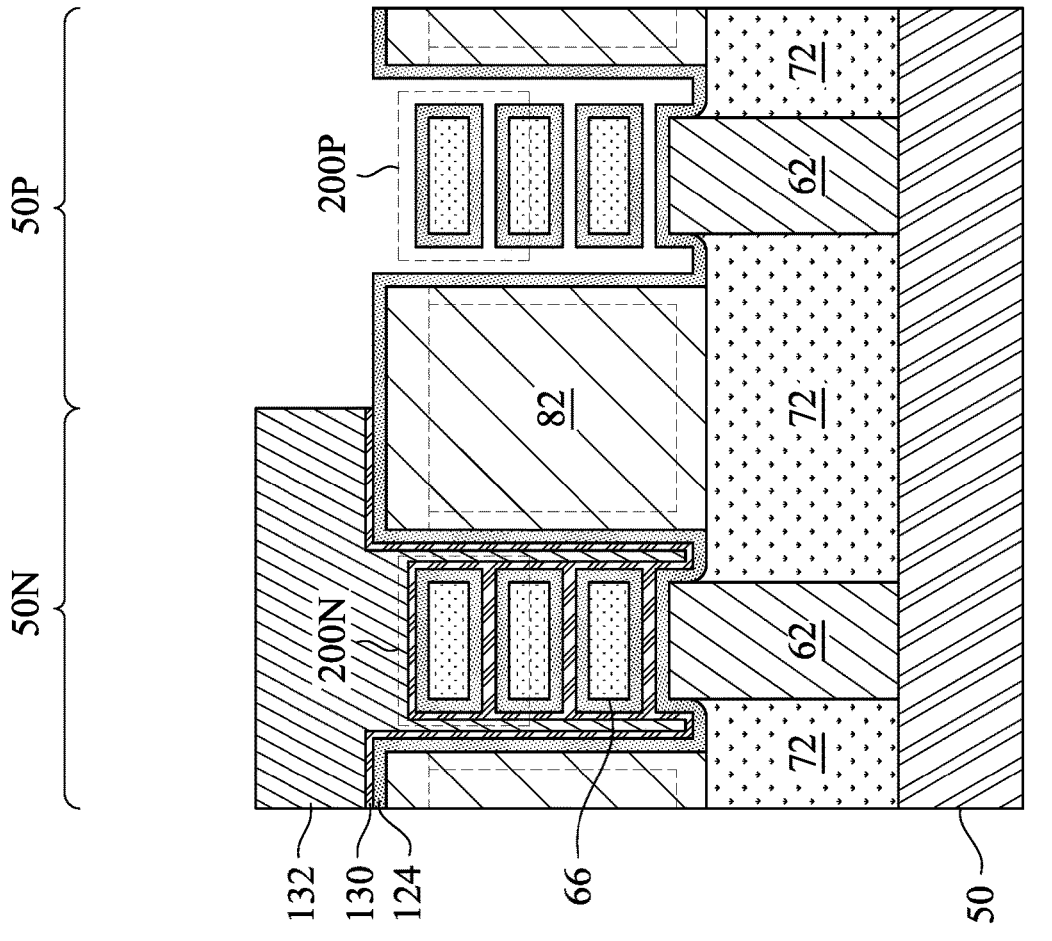
Figure 25C:
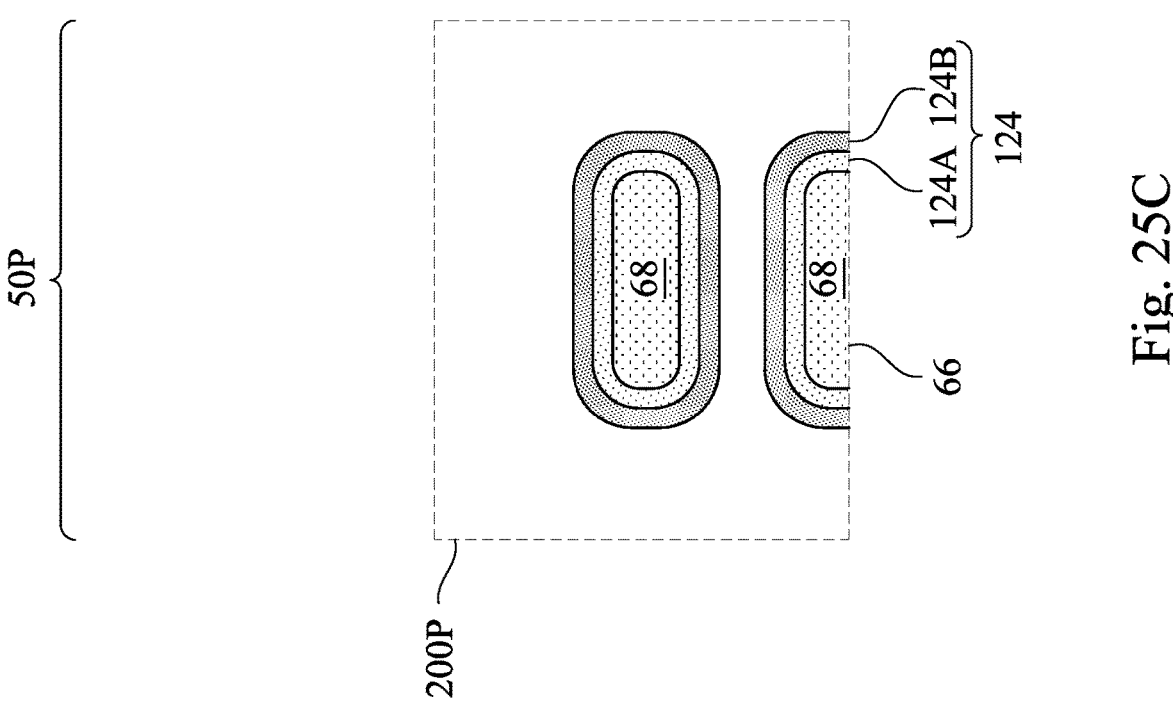
Figure 25B:
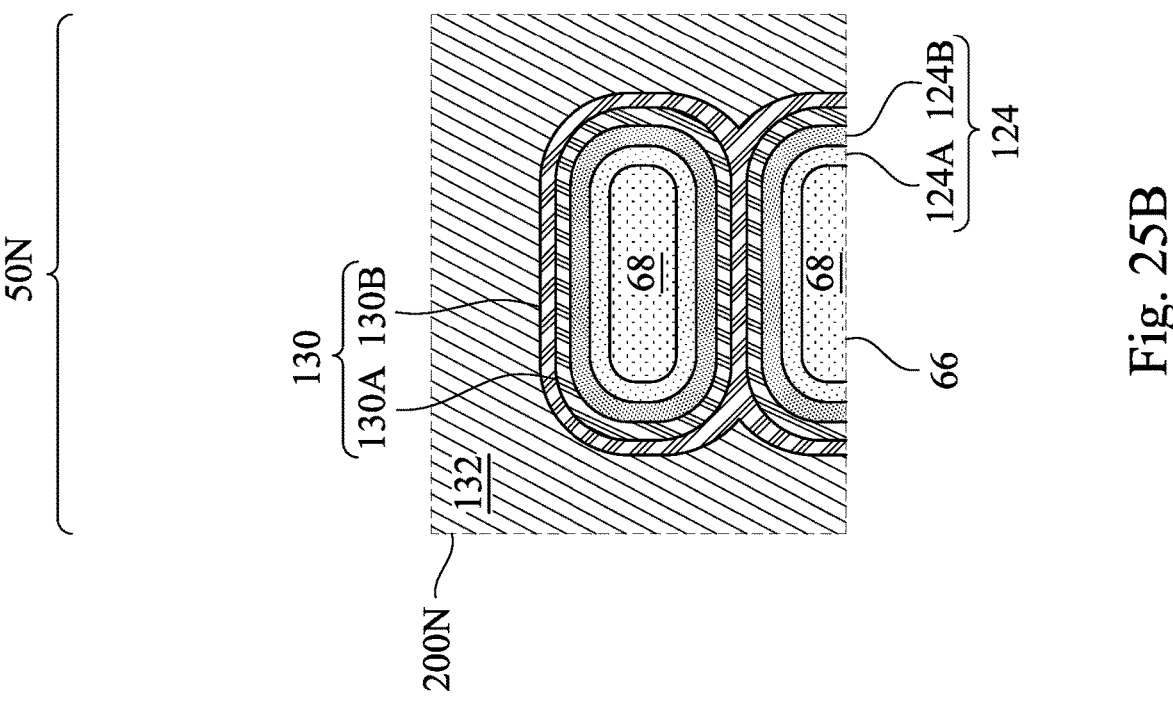

After patterning the second mask layer 132, in FIGS. 25A-C, the work function tuning layer 130A, the glue layer 130B, and remaining portions of the sacrificial layer 126 are removed from the second region (e.g., the p-type region 50P) using the second mask layer 132 as a mask. Removing the work function tuning layer 130A, the glue layer 130B, and remaining portions of the sacrificial layer 126 from the second region (e.g., the p-type region 50P) expands the recesses 116 in the second region to re-expose the gate dielectric layer 124 in the second region (e.g., the p-type region 50P). The removal may be by acceptable photolithography and etching techniques. The etching may include any acceptable etch process, such as a RIE, NBE, the like, a wet etch using for example, ammonium hydroxide (NH4OH), dilute hydrofluoric (dHF) acid, the like, or a combination thereof. The etching may be isotropic.

In some embodiments, a single etch is performed to remove the work function tuning layer 130A, the glue layer 130B, and remaining portions of the sacrificial layer 126. The single etch may be selective to the materials of the work function tuning layer 130A, the glue layer 130B, and remaining portions of the sacrificial layer 126 (e.g., selectively etches the materials of the work function tuning layer 130A, the glue layer 130B, and remaining portions of the sacrificial layer 126 at a faster rate than the material(s) of the gate dielectric layer 124). In some embodiments, multiple etch steps/processes are performed to remove the work function tuning layer 130A, the glue layer 130B, and remaining portions of the sacrificial layer 126. In various embodiments, the remaining portions of the sacrificial layer 126 are easier to remove from between the second nanostructures 66 than the work function tuning layers/glue layer, and thus, the disclosed method provides better control for tuning the threshold voltage of the devices.

Figure 26A:
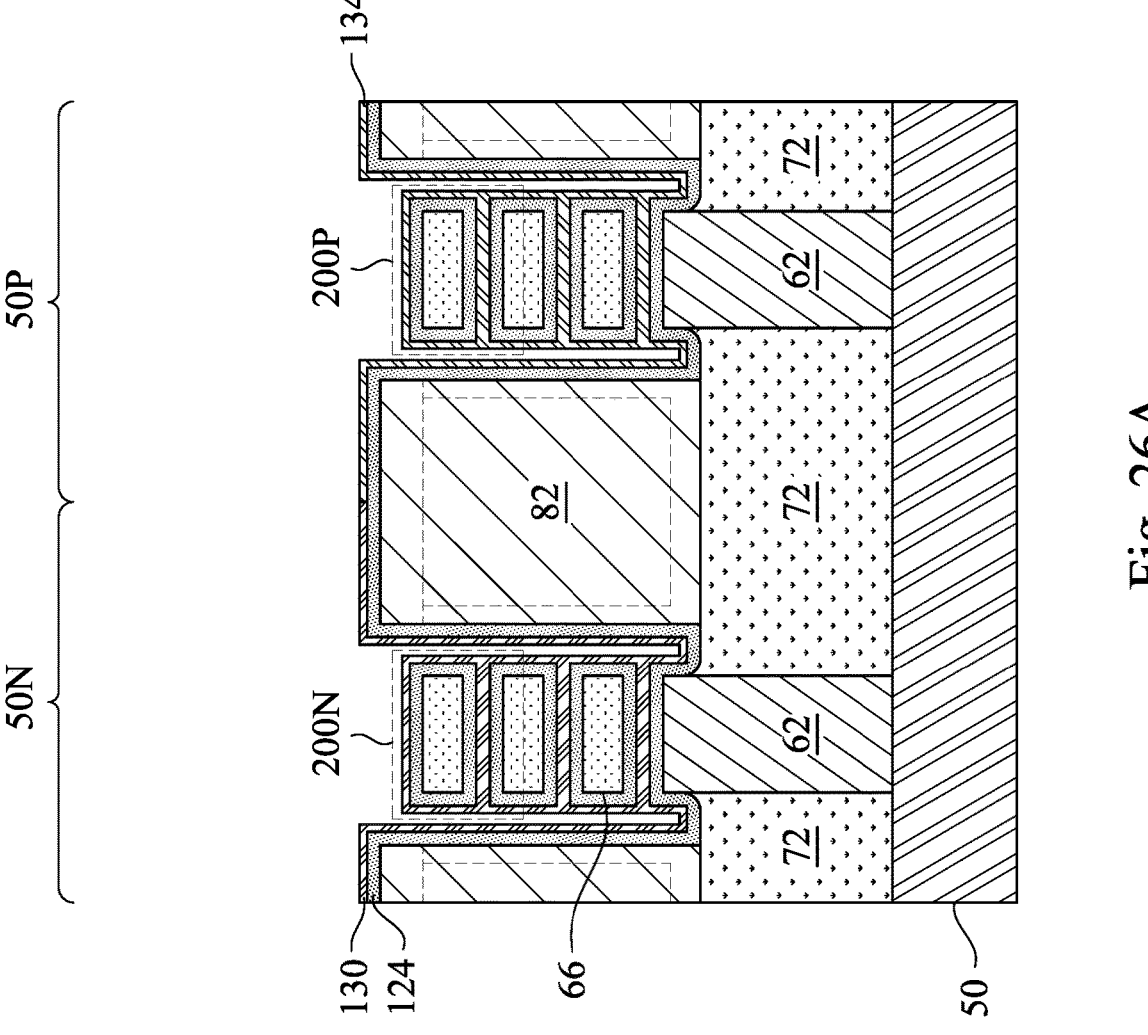
Figure 26C:
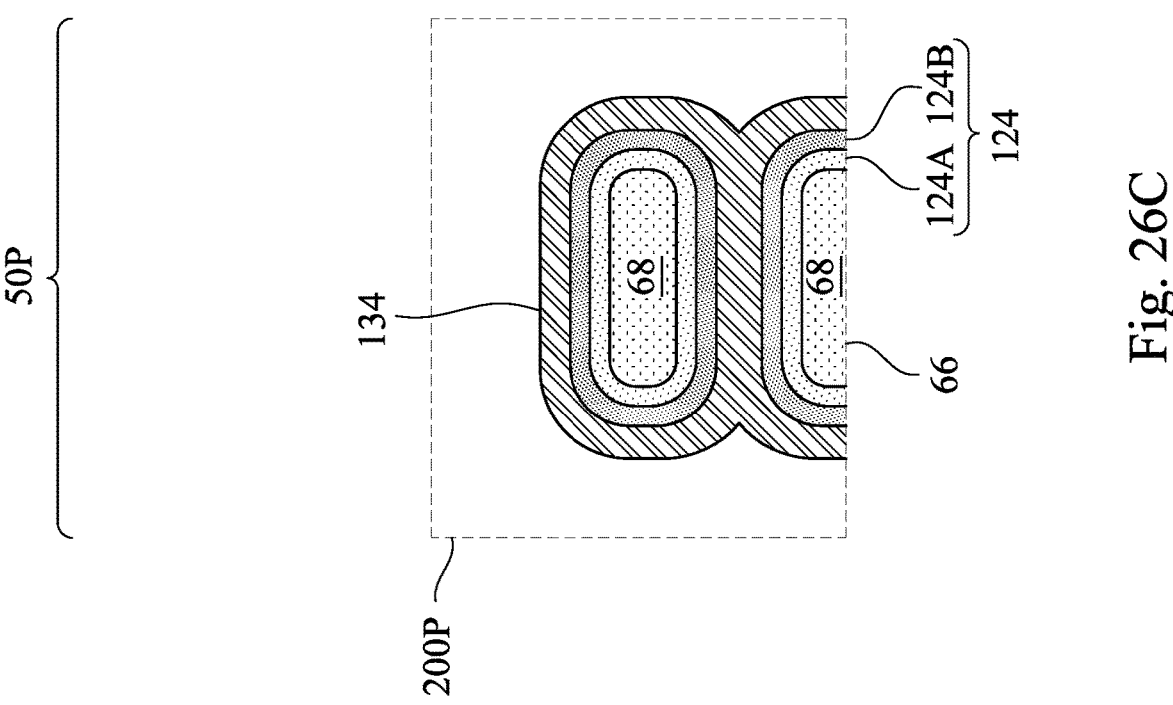
Figure 26B:
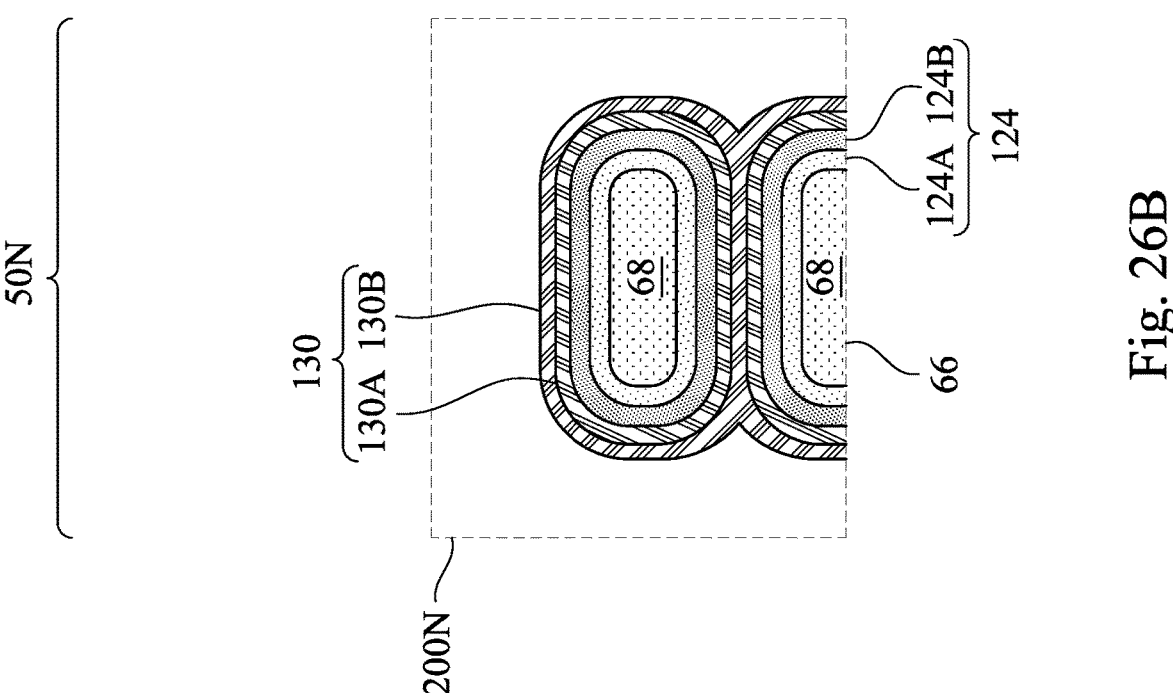

In FIGS. 26A-C, the second mask layer 132 is patterned to remove the second mask layer 132 from the recesses 116 in the first region (e.g., the n-type region 50N). The second mask layer 132 may be removed by plasma ashing, an etching process such as an isotropic or an anisotropic etching process, or the like.

After removing the second mask layer 132 from the recesses 116 in the first region (e.g., the n-type region 50N), a work function tuning layer 134 is deposited on the glue layer 130B in the first region (e.g., the n-type region 50N) and on the gate dielectric layer 124 in the second region (e.g., the p-type region 50P). The work function tuning layer 134 may be referred to as a "p-type work function tuning layer" when it is the only work function tuning layer in the second region (e.g., the p-type region 50P). The work function tuning layer 134 includes any acceptable material to tune a work function of a device to a desired amount given the application of the device to be formed, and may be deposited using any acceptable deposition process. For example, when the work function tuning layer 134 is a p-type work function tuning layer, it may be formed of a p-type work function metals (PWFM) such as titanium nitride (TiN), tantalum nitride (TaN), combinations thereof, or the like, which may be deposited by ALD, CVD, PVD, or the like. Although the work function tuning layer 134 is illustrated as being a single layer, the work function tuning layer 134 may have a multilayered structure in other embodiments. For example, in other embodiments, the second work function tuning layer 134 include a layer of titanium nitride (TiN) and a layer of tantalum nitride (TaN). The work function tuning layers 134 is formed to a thickness that is sufficient to cause merging of the portions of the work function tuning layer 134 between the second nanostructures 66 in the second region (e.g., the p-type region 50P). The material of the work function tuning layer 130A is different from the material of the work function tuning layer 134. For example, the material of the work function tuning layer 130A is of an opposite conductivity type than the material of the work function tuning layer 134. As noted above, the work function tuning layer 130A can be formed of an n-type work function metal (NWFM) and the work function tuning layers 134 can be formed of p-type work function metal (PWFM). The NWFM is different from the PWFM. In some embodiments, after the work function tuning layer 134 is deposited, it may be patterned and removed from the first region (e.g., the n-type region 50N) using a combination of photolithography and etching using similar processes as described above to remove the gate electrode layers 130 from the second region (e.g., the p-type region 50P).

Figure 27A:
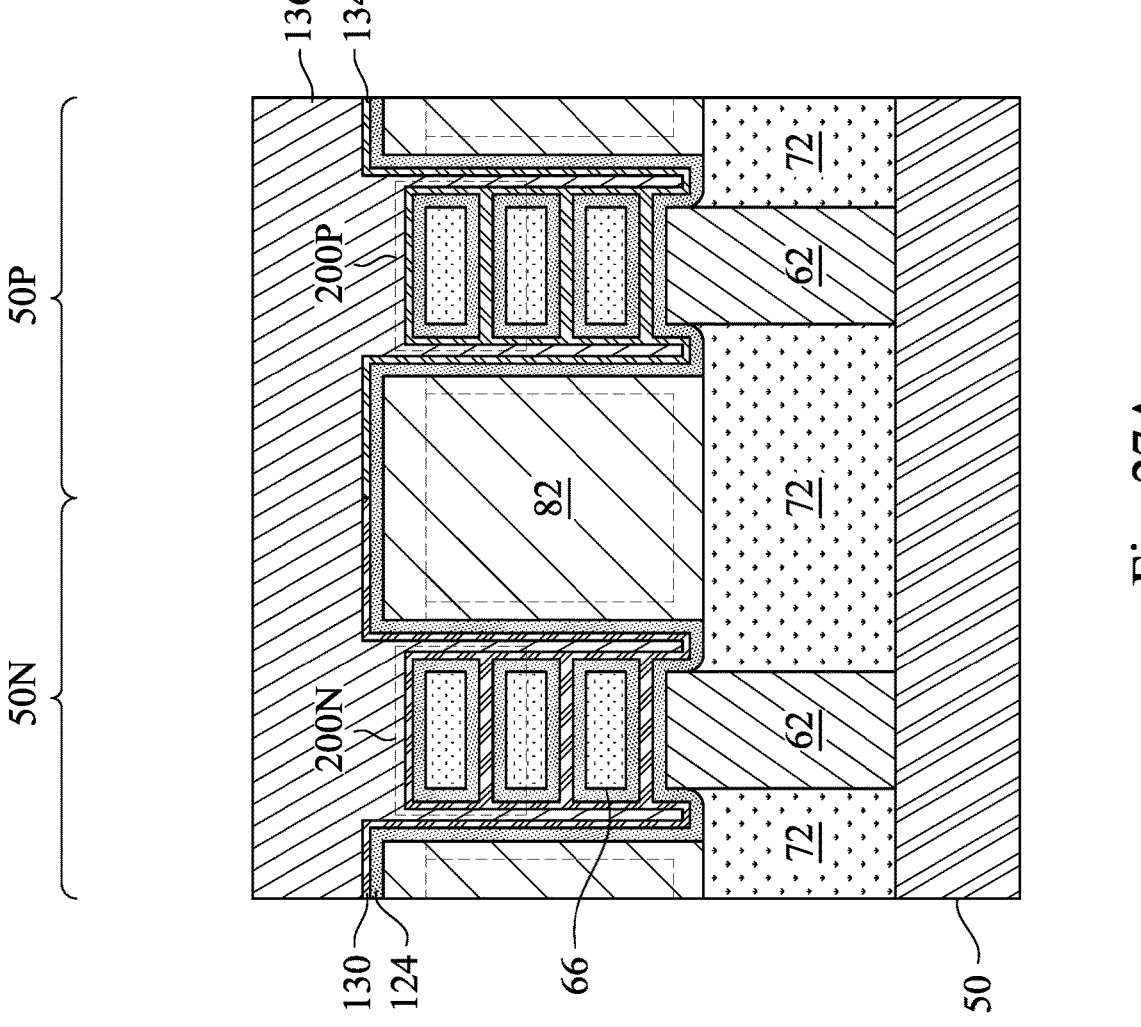
Figure 27C:
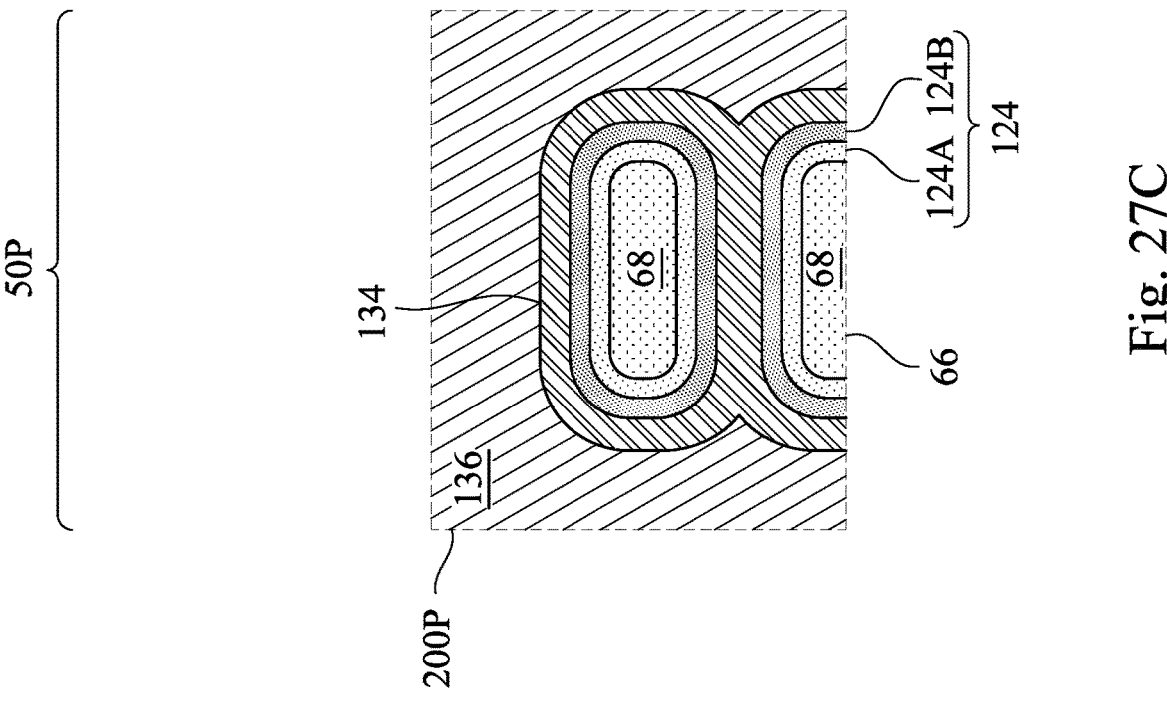
Figure 27B:
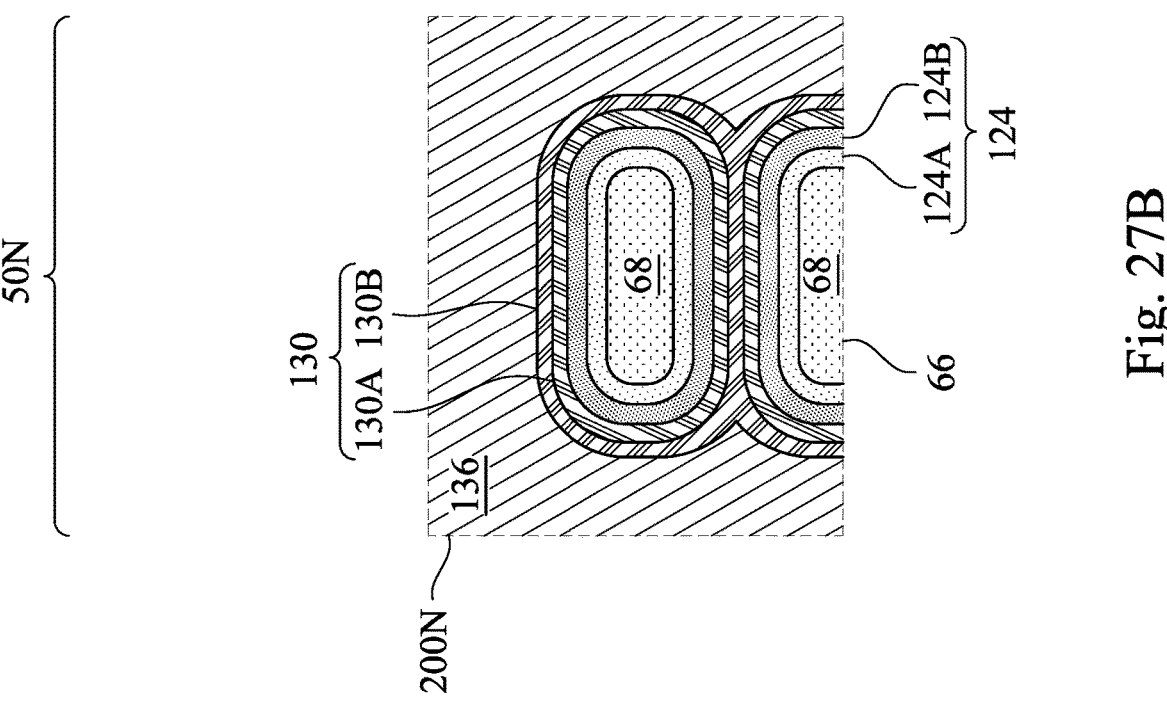

In FIGS. 27A-C, a gate fill material 136 is deposited on the work function tuning layer 134 and the glue layer 130B. The gate fill material may be deposited in the recesses 116 (e.g., over the nanostructures 136) and over and along sidewalls of the insulating fin 82. The gate fill material 136 includes any acceptable material of a low resistance. For example, the gate fill material 136 may be formed of a metal such as tungsten, aluminum, cobalt, ruthenium, combinations thereof or the like, which may be deposited by ALD, CVD, PVD, or the like. The gate fill material 136 fills the remaining portions of the recesses 116. As illustrated in the cross-sections in FIGS. 27A-C, the gate fill material 136 does not extend between adjacent second nanostructures 66 in either the first region 50N or the second region 50P as the area between adjacent second nanostructures 66 in both regions has already been filled by other layers.

Figure 28C:
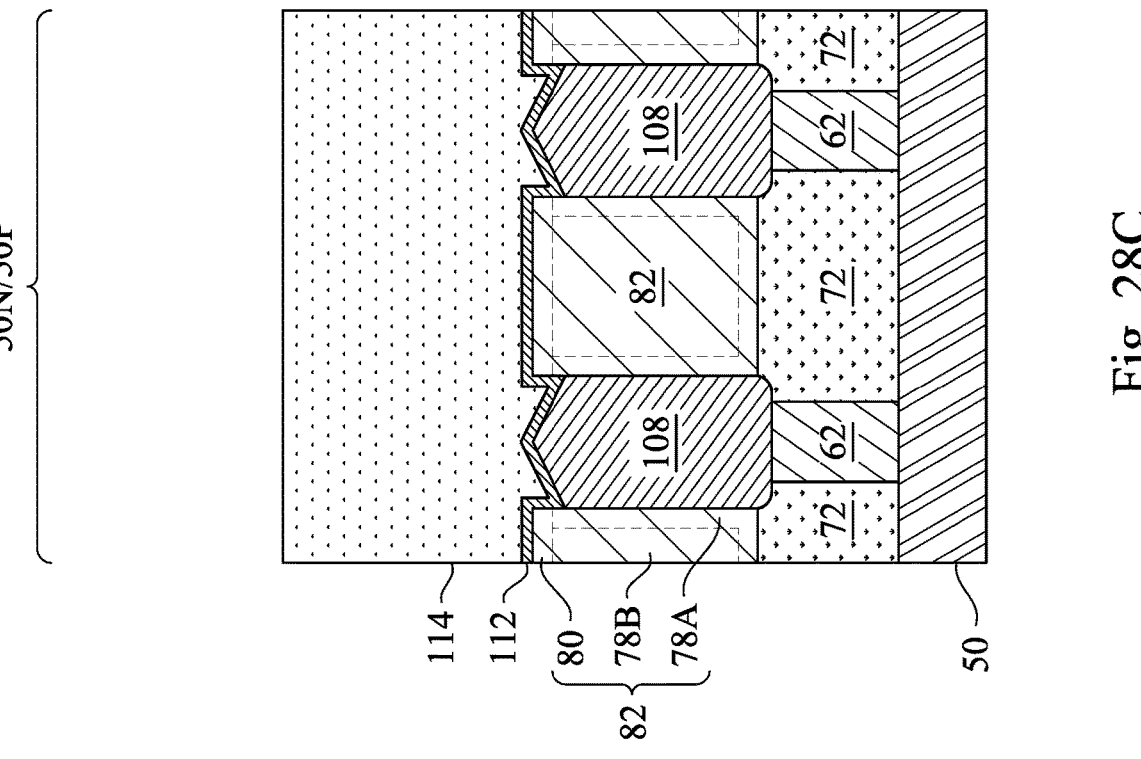
Figure 28A:
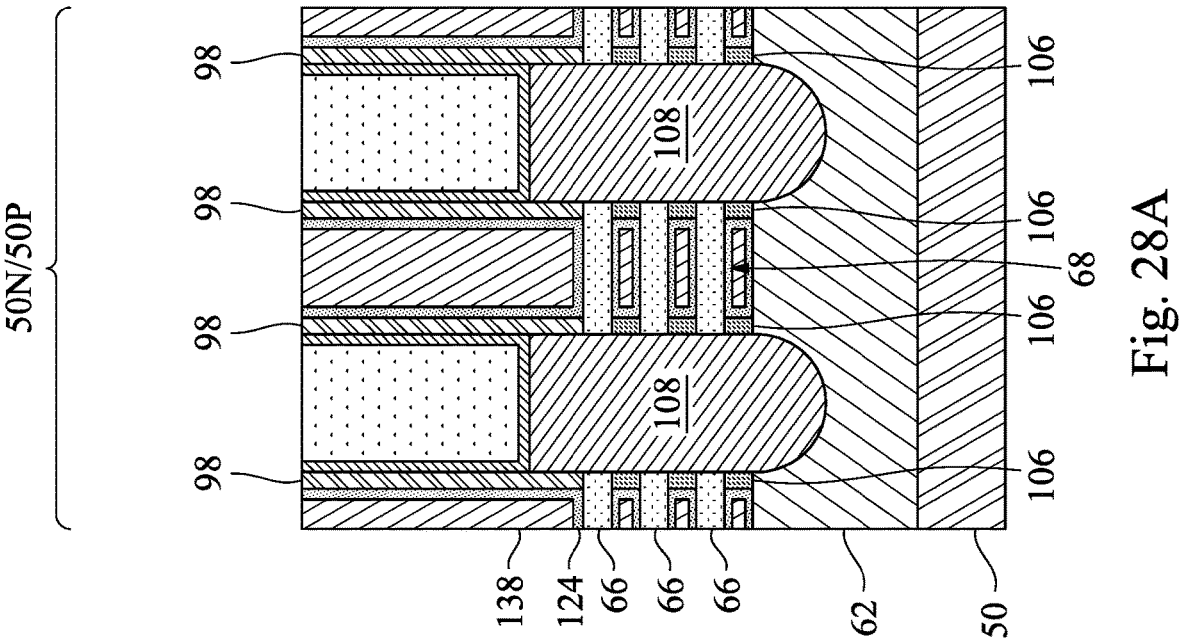
Figure 28B:
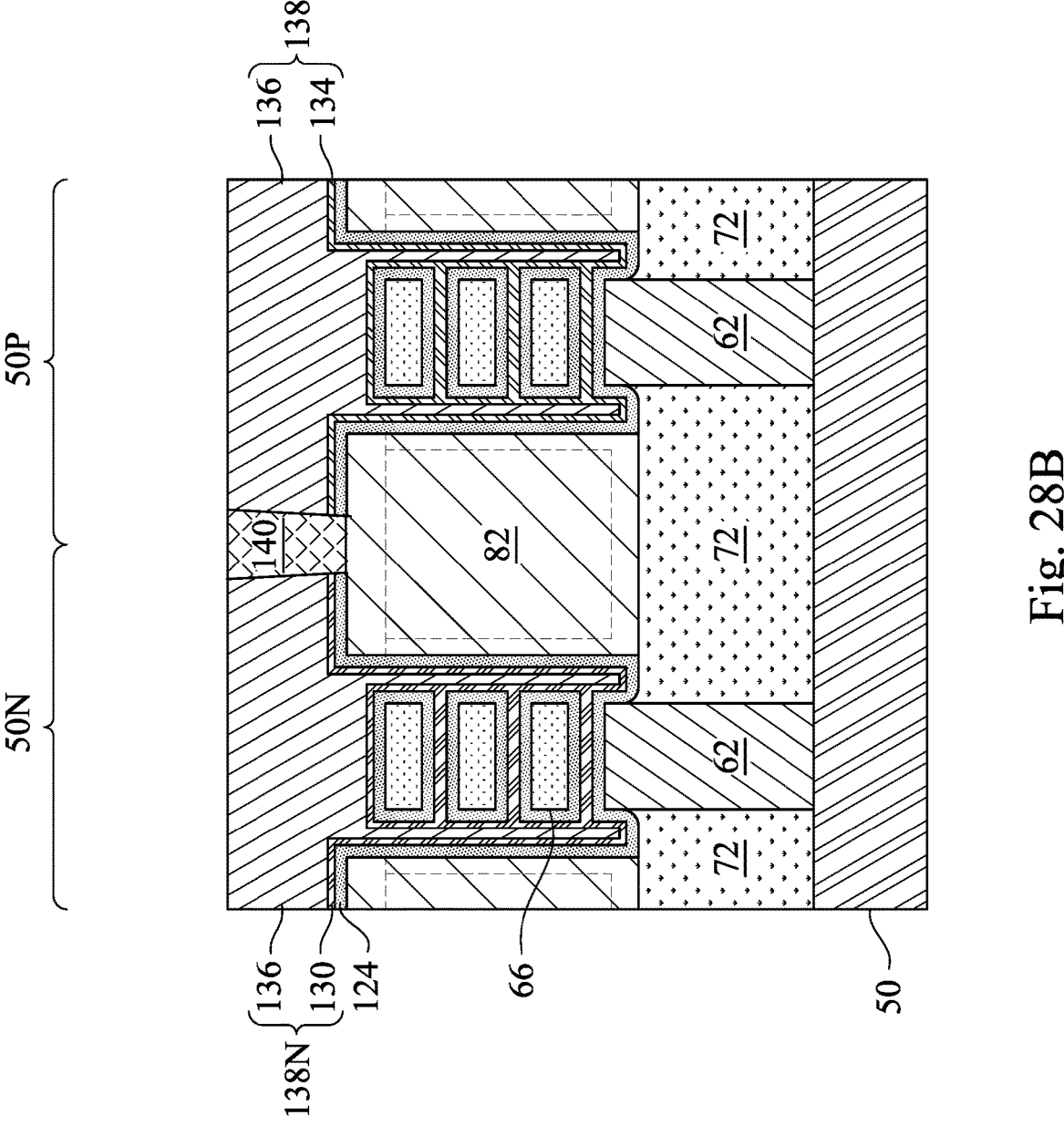

The gate fill material 136 may be initially deposited to overflow the recesses 116. Subsequently, a removal process is performed to remove the excess portions of the materials of the gate dielectric layer 124, the work function tuning layer surfaces 130A, the glue layer 130B, the work function tuning layer 134, and the filling layer 136, which excess portions are over the top surfaces of the first ILD 114 and the gate spacers 98, thereby forming gate structures as illustrated by FIGS. 28A-C. In some embodiments, a planarization process such as a chemical mechanical polish (CMP), an etch-back process, combinations thereof, or the like may be utilized. The gate dielectric layer 124, when planarized, has portions left in the recesses 116 (thus forming gate dielectrics for the gate structures). The top surfaces of the gate spacers 98; the CESL 112; the first ILD 114; and the gate structures are coplanar (within process variations). The gate structures are replacement gates of the resulting nano-FETs, and may be referred to as "metal gates." The gate structures each extend along top surfaces, sidewalls, and bottom surfaces of a channel region 68 of the nanostructures 66. The gate structures fill the area previously occupied by the nanostructures 64, the sacrificial spacers 76, and the dummy gates 94.

In some embodiments, isolation regions 140 are formed extending through some of the gate structures. An isolation region 140 is formed to divide (or "cut") a gate structure into multiple gate structure each comprising a gate electrode 138 (labeled 138N and 138P) and a gate dielectric layer 124. For example, the gate structures in the first region (e.g., the n-type region 50N) may include a gate electrode 138N (e.g., comprising the work function tuning layer 130A, the glue layer 130B, and the gate fill material 136) and a gate dielectric layer 124, and the gate structures in the second region (e.g., the p-type region 50P) may include a gate electrode 138P (e.g., comprising the work function tuning layer 134 and the gate fill material 136) and a gate dielectric layer 124. Gate structures in different ones of the regions 50N and 50P may be separated from each other by the isolation region 140 and the insulating fin 82. The isolation region 140 may be formed of a dielectric material, such as silicon nitride, silicon oxide, silicon oxynitride, or the like, which may be formed by a deposition process such as CVD, ALD, or the like. As an example to form the isolation regions 140, openings can be patterned in the desired gate structures 130. Any acceptable etch process, such as a dry etch, a wet etch, the like, or a combination thereof, may be performed to pattern the openings. The etching may be anisotropic. One or more layers of dielectric material may be deposited in the openings. A removal process may be performed to remove the excess portions of the dielectric material, which excess portions are over the top surfaces of the gate structures, thereby forming the isolation regions 140.

Figure 29C:
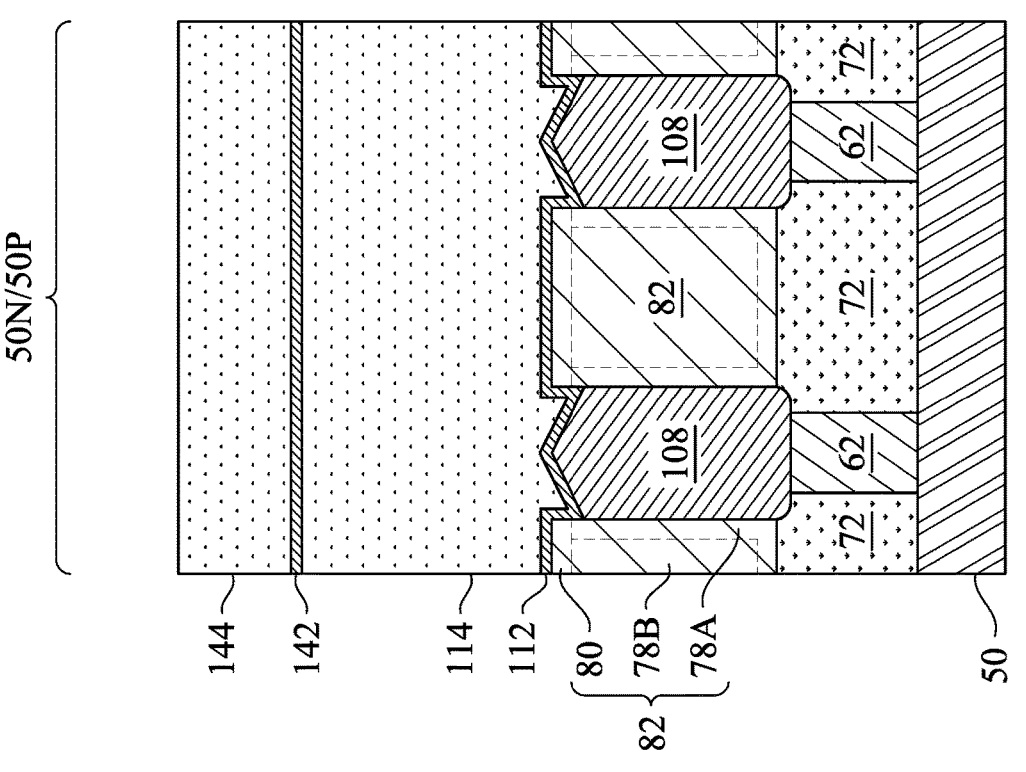
Figure 29A:
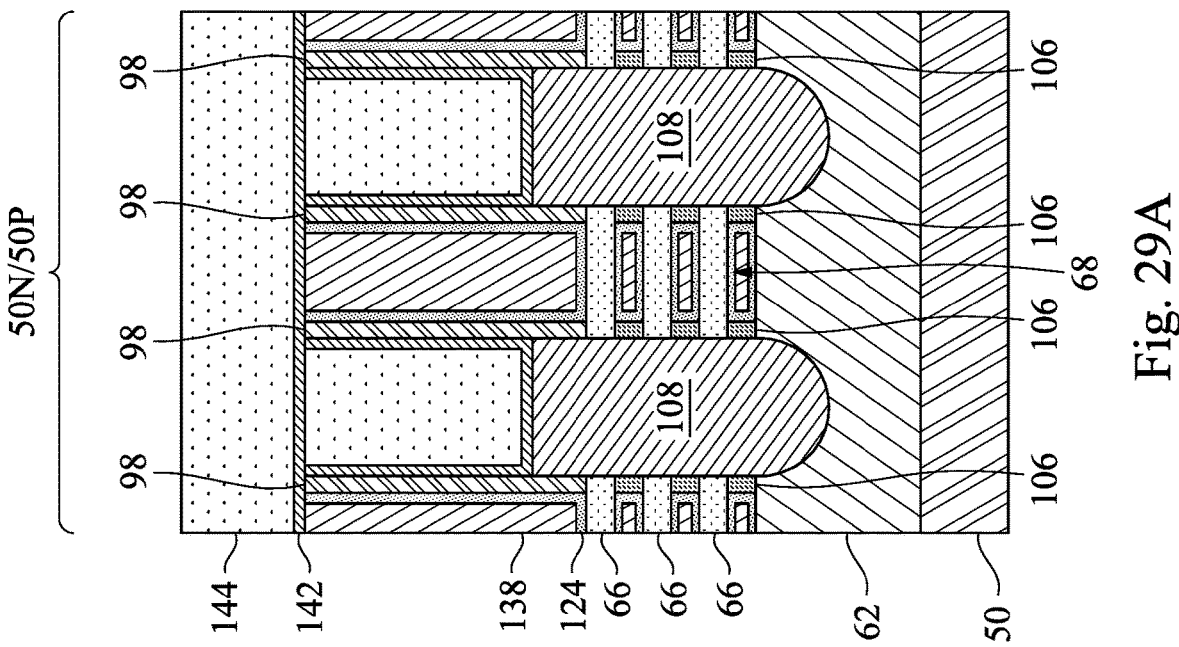
Figure 29B:
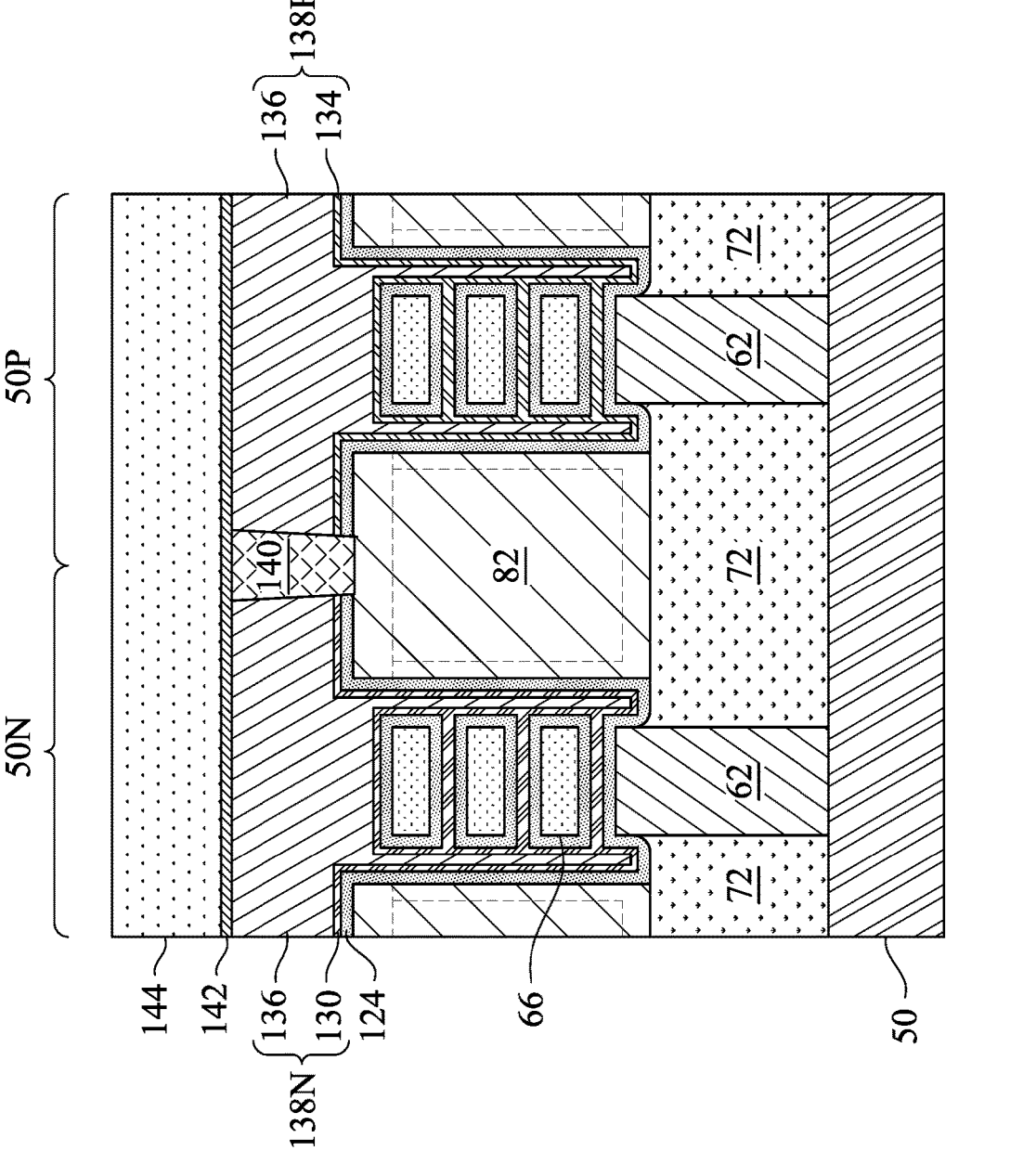

FIGS. 29A through 30C illustrate further processing steps to form gate and source/drain contacts in either of the regions 50N or 50P. In FIGS. 29A-C, a second ILD 144 is deposited over the gate spacers 98, the CESL 112, the first ILD 114, and the gate electrodes 138. In some embodiments, the second ILD 144 is a flowable film formed by a flowable CVD method. In some embodiments, the second ILD 144 is formed of a dielectric material such as PSG, BSG, BPSG, USG, or the like, which may be deposited by any suitable method, such as CVD, PECVD, or the like.

In some embodiments, an etch stop layer (ESL) 142 is formed between the second ILD 144 and the gate spacers 98, the CESL 112, the first ILD 114, and the gate structures 130. The ESL 142 may include a dielectric material, such as silicon nitride, silicon oxide, silicon oxynitride, or the like, having a high etching selectivity from the etching of the second ILD 144.

Figure 30C:
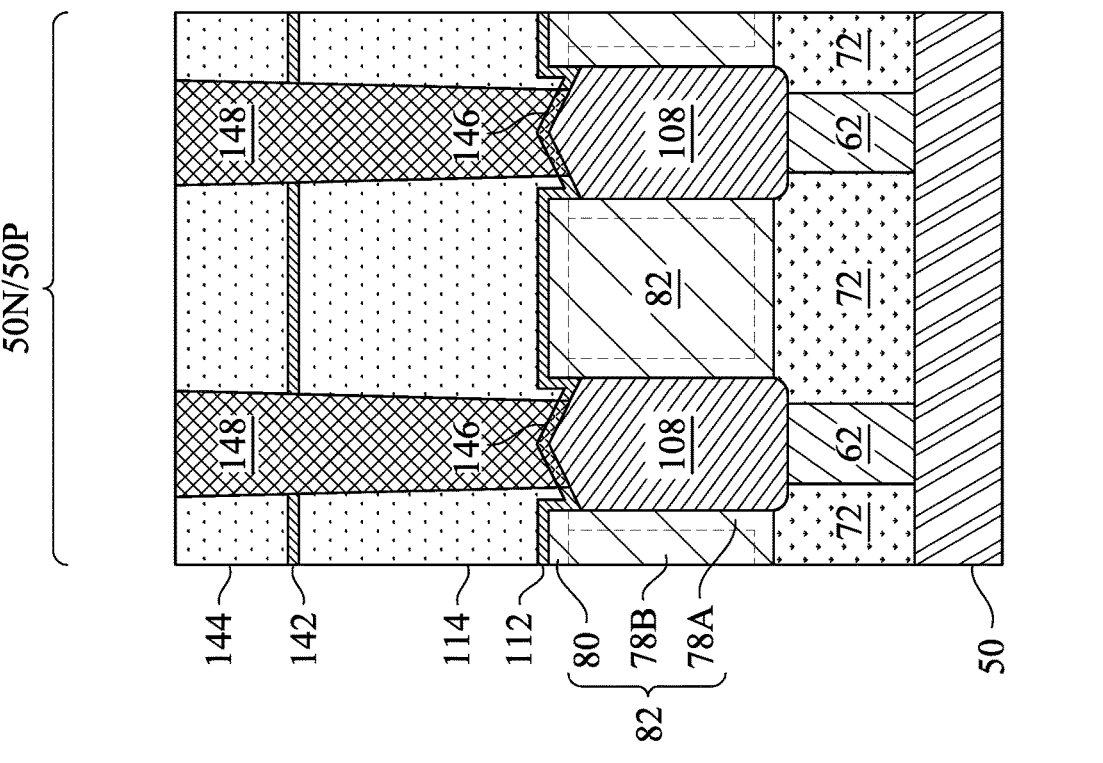
Figure 30A:
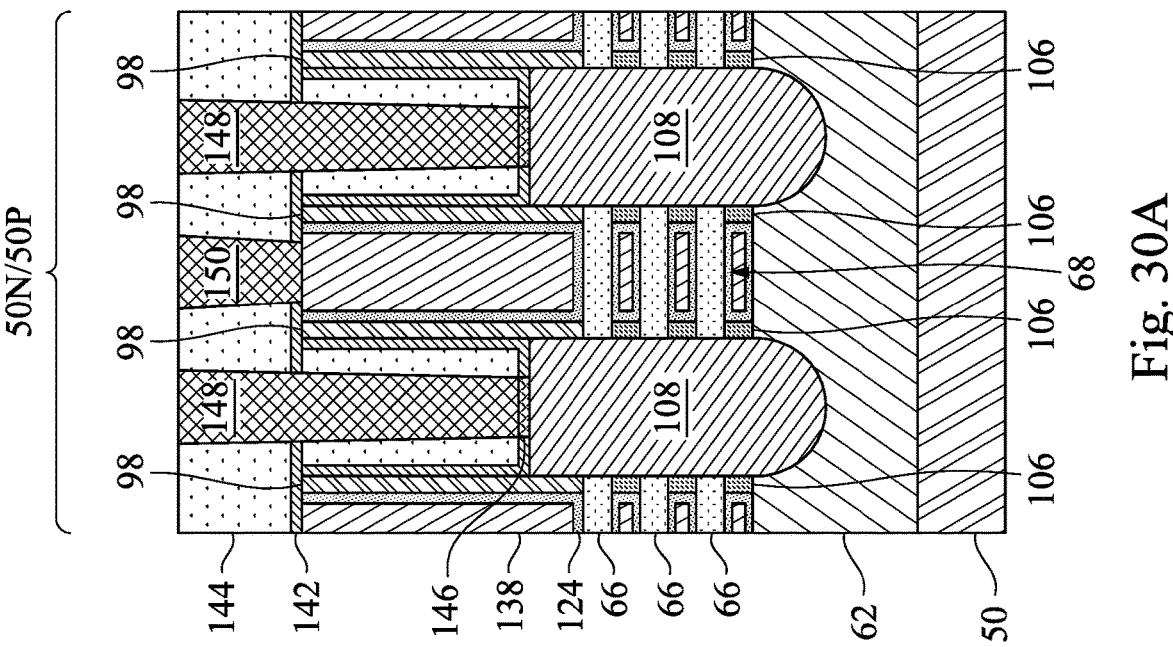
Figure 30B:
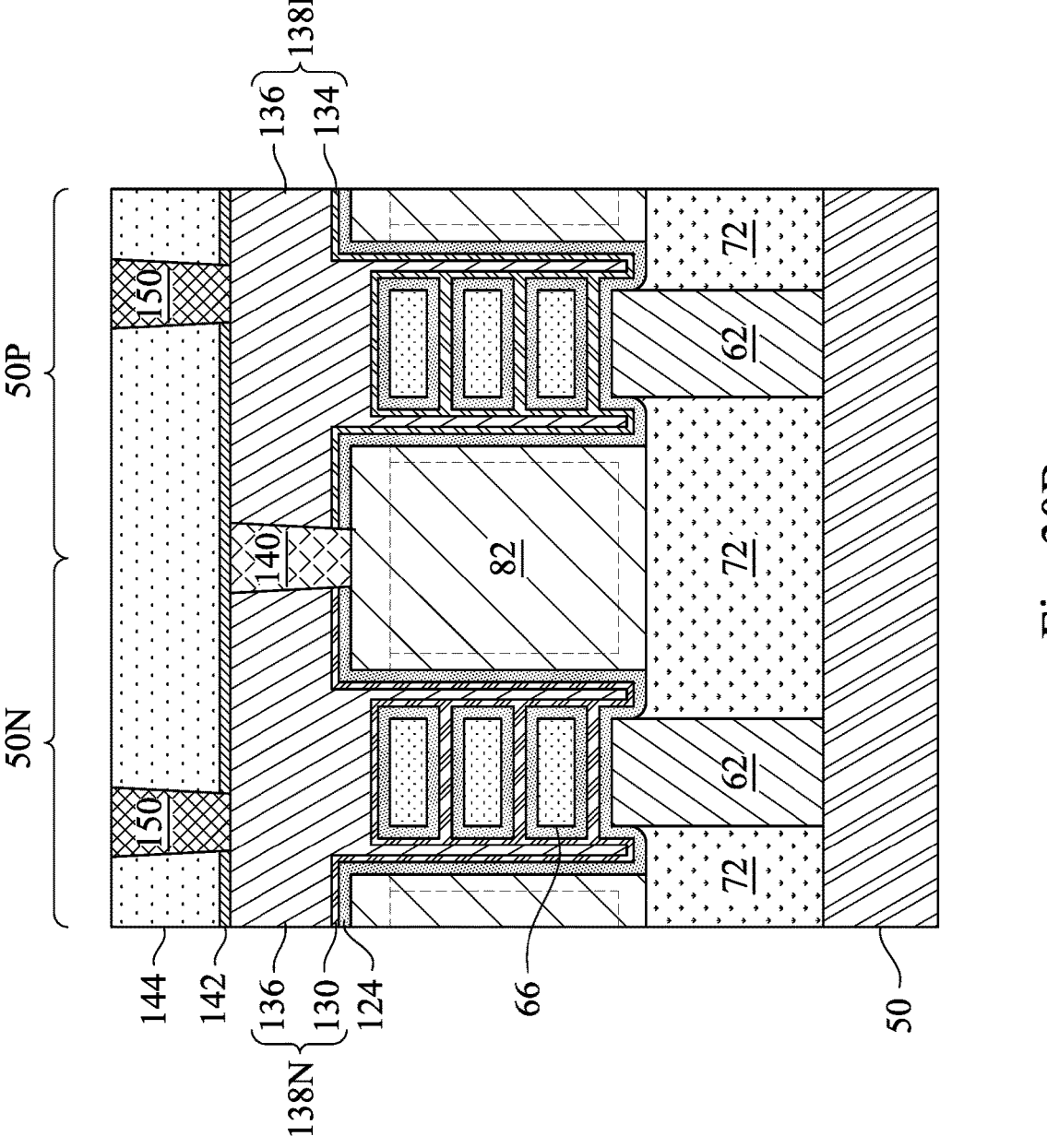

In FIGS. 30A-C, gate contacts 150 and source/drain contacts 148 are formed to contact, respectively, the gate electrodes 138 and the epitaxial source/drain regions 108. The gate contacts 150 are physically and electrically coupled to the gate electrodes 138. The source/drain contacts 148 are physically and electrically coupled to the epitaxial source/drain regions 108.

As an example to form the gate contacts 150 and the source/drain contacts 148, openings for the gate contacts 150 are formed through the second ILD 144 and the ESL 142, and openings for the source/drain contacts 148 are formed through the second ILD 144, the ESL 142, the first ILD 114, and the CESL 112. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 144. The remaining liner and conductive material form the gate contacts 150 and the source/drain contacts 148 in the openings. The gate contacts 150 and the source/drain contacts 148 may be formed in distinct processes, or may be formed in the same process. Although shown as being formed in the same cross-sections, it should be appreciated that each of the gate contacts 150 and the source/drain contacts 148 may be formed in different cross-sections, which may avoid shorting of the contacts.

Optionally, metal-semiconductor alloy regions 146 are formed at the interfaces between the epitaxial source/drain regions 108 and the source/drain contacts 148. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 148 by depositing a metal in the openings for the source/drain contacts 148 and then performing a thermal anneal process. The metal can be any metal capable of reacting with the semiconductor materials (e.g., silicon, silicon-germanium, germanium, etc.) of the epitaxial source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 148, such as from surfaces of the metal-semiconductor alloy regions 146. The material(s) of the source/drain contacts 148 can then be formed on the metal-semiconductor alloy regions 146.

In various embodiments, replacement gate electrodes for p-type devices and n-type devices are formed. In some embodiments, the work function tuning layers for the n-type devices are formed before the work function tuning layers for the p-type devices to allow more control of the threshold voltages of the resulting devices. The method of forming the work function tuning layers for the n-type devices before the work function tuning layers for the p-type devices includes forming and patterning a sacrificial layer to prevent the work function tuning layers for the n-type devices from being formed between the nanostructures of the p-type devices. This helps to prevent the work function tuning layers from remaining on the p-type devices which could degrade the performance of the p-type devices. The sacrificial layer may be deposited using a flowable chemical vapor deposition (CVD) method, which provides improved deposition profile in terms of bottom-up growth. Further, the flowable CVD method may also provide improved gap fill between the nanostructures without seams or gaps.

In some embodiments, a method includes depositing a sacrificial layer around a first nanostructure and a second nanostructure using a non-conformal deposition process, wherein the first nanostructure is disposed over and separated from the second nanostructure by a first recess, and wherein the first nanostructure and the second nanostructure are disposed over a semiconductor substrate in a first device region; patterning the sacrificial layer, wherein after patterning the sacrificial layer, a remaining portion of the sacrificial layer is disposed in the first recess between the first nanostructure and the second nanostructure; depositing a first work function tuning layer over the first nanostructure and the second nanostructure; patterning the first work function tuning layer to remove portions of the first work function tuning layer in the first device region; removing the remaining portions of the sacrificial layer; after removing the remaining portions of the sacrificial layer, depositing a second work function tuning layer around the first nanostructure and the second nanostructure; and depositing a gate fill material over the second work function tuning layer. Optionally, in some embodiments, the non-conformal deposition process is a flowable chemical vapor deposition process. Optionally, in some embodiments, depositing the first work function tuning layer comprises using the sacrificial layer to block depositing the first work function tuning layer in a region between the first nanostructure and the second nanostructure. Optionally, in some embodiments, the method further includes depositing the sacrificial layer around a third nanostructure and a fourth nanostructure using the non-conformal deposition process, wherein the third nanostructure is disposed over and separated from the fourth nanostructure by a second recess in a second device region, wherein patterning the sacrificial layer comprises removing the sacrificial layer from the second device region; and depositing the first work function tuning layer around the third nanostructure and the fourth nanostructure, wherein after patterning the first work function tuning layer, remaining portions of the first work function tuning layer are disposed around the third nanostructure and the fourth nanostructure. Optionally, in some embodiments, the first device region is a p-type device region, and wherein the second device region is an n-type device region. Optionally, in some embodiments, the method further includes depositing the second work function tuning layer in the second device region over the first work function tuning layer; and patterning the second work function tuning layer to remove the second work function tuning layer from the second device region, wherein depositing the gate fill material comprises depositing the gate fill material over the second work function tuning layer. Optionally, in some embodiments, depositing the sacrificial layer using the non-conformal deposition process comprises depositing the sacrificial layer without seams or voids. Optionally, in some embodiments, the method further includes depositing a gate dielectric layer around the first nanostructure, and the second nanostructure, wherein the gate dielectric layer separates the sacrificial layer from the first nanostructure and separates the sacrificial layer from the second nanostructure.

In some embodiments, a method includes removing a first dummy gate structure to form a recess around a first nanostructure and a second nanostructure; depositing a sacrificial layer in the recess with a flowable chemical vapor deposition (CVD); patterning the sacrificial layer to leave a portion of the sacrificial layer between the first nanostructure and the second nanostructure; depositing a first work function metal in first recess; removing the first work function metal and the portion of the sacrificial layer from the recess; depositing a second work function metal in the recess, wherein the second work function metal is of an opposite type than the first work function metal; and depositing a fill metal over the second work function metal in the recess. Optionally, in some embodiments, the flowable CVD process comprises: flowing one or more precursors in the recess to deposit an insulating material in a flowable state in the recess; performing an oxidizing treatment to harden the insulating material; and curing the insulating material with ultraviolet light. Optionally, in some embodiments, the sacrificial layer comprises SiONx, and wherein the flowable CVD process comprises flowing a silane-based precursor, a nitrogen-based precursor, and an oxidant into the first recess. Optionally, in some embodiments, the flowable CVD process comprises: flowing the silane-based precursor at a rate in a range of 500 sccm to 750 sccm; flowing the nitrogen-based precursor at a rate in a range of 300 sccm to 600 sccm; and flowing the oxidant at a rate in a range of 50 sccm to 400 sccm. Optionally, in some embodiments, performing the oxidizing treatment comprises exposing the insulating material to a mixture of ozone and oxygen. Optionally, in some embodiments, a ratio of ozone to oxygen of the mixture of ozone and oxygen is in a range of 1:10 to 10:1. Optionally, in some embodiments, curing the insulating material with ultraviolet light comprises curing the insulating material with ultraviolet light at a wavelength in a range of 100 nm to 400 nm. Optionally, in some embodiments, the first work function metal is n-type, and wherein the second work function metal is p-type.

In some embodiments, a method includes removing a first dummy gate structure to form a first recess and removing a second dummy gate structure to form a second recess; depositing a sacrificial layer in the first recess and the second recess with a flowable chemical vapor deposition (CVD); patterning the sacrificial layer to remove the sacrificial layer from the first recess while leaving a remaining portion of the sacrificial layer in the second recess, the remaining portion of the sacrificial layer being disposed between a first nanostructure and a second nanostructure; depositing a first work function metal in first recess and the second recess, wherein the sacrificial layer blocks the deposition of the first work function metal between the first nanostructure and the second nanostructure; patterning the first work function metal to remove the first work function metal from the second recess while leaving the first work function metal in the first recess; removing the remaining portion of the sacrificial layer; depositing a second work function metal in the second recess; and depositing a fill metal over the first work function metal in the first recess and over the second work function metal in second the recess. Optionally, in some embodiments, the second work function metal is of an opposite conductivity type than the first work function metal. Optionally, in some embodiments, an insulating fin is disposed between the first recess and the second recess. Optionally, in some embodiments, the flowable CVD process comprises: flowing one or more precursors in the first recess and the second recess to deposit an insulating material in a flowable state in the first recess and the second recess; performing an oxidizing treatment to harden the insulating material; and curing the insulating material with ultraviolet light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a sacrificial layer around a first nanostructure and a second nanostructure, wherein the first nanostructure and the second nanostructure are disposed over a semiconductor substrate in a first device region;
    patterning the sacrificial layer to selectively remove a first portion of the sacrificial layer while leaving a second portion of the sacrificial layer between the first nanostructure and the second nanostructure;
    depositing a first work function tuning layer over the first nanostructure and the second nanostructure;
    patterning the first work function tuning layer to remove the first work function tuning layer in the first device region;
    removing the second portion of the sacrificial layer;
    after removing the second portion of the sacrificial layer, depositing a second work function tuning layer around the first nanostructure and the second nanostructure; and
    depositing a gate fill material over the second work function tuning layer in the first device region.

2. The method of claim 1, wherein depositing the sacrificial layer around the first nanostructure and the second nanostructure comprises a non-conformal deposition process.

3. The method of claim 2, wherein the non-conformal deposition process is a flowable chemical vapor deposition process.

4. The method of claim 1, wherein depositing the first work function tuning layer comprises using the sacrificial layer to block depositing the first work function tuning layer in a region between the first nanostructure and the second nanostructure.

5. The method of claim 1, further comprising:
    depositing the sacrificial layer around a third nanostructure and a fourth nanostructure, wherein the third nanostructure is disposed over and separated from the fourth nanostructure by a second recess in a second device region, wherein patterning the sacrificial layer comprises removing the sacrificial layer from the second device region; and depositing the first work function tuning layer around the third nanostructure and the fourth nanostructure, wherein after patterning the first work function tuning layer, remaining portions of the first work function tuning layer are disposed around the third nanostructure and the fourth nanostructure in the second device region.

6. The method of claim 5 further comprising:
    depositing the second work function tuning layer in the second device region over the first work function tuning layer;
    patterning the second work function tuning layer to remove the second work function tuning layer from the second device region; and
    depositing the gate fill material over the first work function tuning layer in the second device region.

7. The method of claim 1 further comprising:
    depositing a glue layer over the first work function tuning layer; and
    patterning the glue layer to remove the glue layer in the first device region, wherein the second portion of the sacrificial layer is removed after the glue layer is removed from the first device region.

8. The method of claim 7, wherein after patterning the glue layer, remaining portions of the glue layer are disposed around a third nanostructure and a fourth nanostructure in a second device region, and wherein the method further comprises:
    depositing the gate fill material over the glue layer in the second device region.

9. The method of claim 1, wherein the first work function tuning layer has an opposite conductivity type from the second work function tuning layer.

10. A method comprising:
    removing a first dummy gate structure to form a recess around a first nanostructure and a second nanostructure;
    depositing a sacrificial material in the recess with a non-conformal deposition process;
    depositing a first work function metal in the recess, the first work function metal extending along sidewalls of the first nanostructure, sidewalls of the second nanostructure, and sidewalls of the sacrificial material;
    removing the first work function metal and the sacrificial material from the recess; and
    after removing the first work function metal, depositing a second work function metal in the recess around the first nanostructure and the second nanostructure.

11. The method of claim 10, wherein the non-conformal deposition process is a flowable chemical vapor deposition (CVD) process.

12. The method of claim 11, wherein the flowable CVD process comprises:
    flowing one or more precursors in the recess to deposit an insulating material in a flowable state in the recess;
    performing an oxidizing treatment to harden the insulating material; and
    curing the insulating material with ultraviolet light.

13. The method of claim 11, wherein the sacrificial material comprises SiONx, and wherein the flowable CVD process comprises flowing a silane-based precursor, a nitrogen-based precursor, and an oxidant into the recess.

14. The method of claim 13, wherein the flowable CVD process comprises:
    flowing the silane-based precursor at a rate in a range of 500 sccm to 750 sccm;
    flowing the nitrogen-based precursor at a rate in a range of 300 sccm to 600 sccm; and flowing the oxidant at a rate in a range of 50 sccm to 400 sccm.

15. The method of claim 10, wherein the first work function metal has a different conductivity type than the second work function metal.

16. The method of claim 10 further comprising patterning the sacrificial material to remove a first portion of the sacrificial material from the sidewalls of the first nanostructure and the sidewalls of the second nanostructure while leaving a second portion of the sacrificial material between the first nanostructure and the second nanostructure.

17. A method comprising:

removing a first dummy gate structure to form a first recess;

forming a sacrificial material in the first recess between a first nanostructure and a second nanostructure, wherein forming the sacrificial material comprises a flowable chemical vapor deposition (CVD) process;

depositing a first work function metal in the first recess, wherein the sacrificial material blocks the deposition of the first work function metal between the first nanostructure and the second nanostructure;

patterning the first work function metal to remove the first work function metal from the first recess;

removing the sacrificial material from between the first nanostructure and the second nanostructure; and depositing a second work function metal in the first recess between the first nanostructure and the second nanostructure.

18. The method of claim 17, wherein the second work function metal is p-type, and wherein the first work function metal is n-type.

19. The method of claim 17, further comprising:

depositing a glue layer over the first work function metal, wherein the sacrificial material blocks the deposition of the glue layer between the first nanostructure and the second nanostructure; and patterning the glue layer to remove the glue layer from the first recess.

20. The method of claim 17, wherein the flowable CVD process comprises:

flowing one or more precursors in the first recess to deposit an insulating material in a flowable state in the first recess;

performing an oxidizing treatment to harden the insulating material; and curing the insulating material with ultraviolet light.

\* \* \* \* \*